(12) United States Patent
Price et al.

(10) Patent No.: US 10,914,863 B2
(45) Date of Patent: Feb. 9, 2021

(54) REAL-TIME MONITORING OF FABRICATION OF INTEGRATED COMPUTATIONAL ELEMENTS

(71) Applicant: Halliburton Energy Services, Inc., Houston, TX (US)

(72) Inventors: James M. Price, The Woodlands, TX (US); Aditya B. Nayak, Humble, TX (US); David L. Perkins, The Woodlands, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 240 days.

(21) Appl. No.: 14/397,719

(22) PCT Filed: Dec. 24, 2013

(86) PCT No.: PCT/US2013/077687
§ 371 (c)(1),
(2) Date: Oct. 29, 2014

(87) PCT Pub. No.: WO2015/099709
PCT Pub. Date: Jul. 2, 2015

(65) Prior Publication Data
US 2016/0223712 A1    Aug. 4, 2016

(51) Int. Cl.
*G01V 13/00*   (2006.01)
*C23C 14/54*   (2006.01)
(Continued)

(52) U.S. Cl.
CPC ............ *G01V 13/00* (2013.01); *C23C 14/505* (2013.01); *C23C 14/52* (2013.01); *C23C 14/547* (2013.01);
(Continued)

(58) Field of Classification Search
CPC ... C23C 14/547; C23C 14/541; C23C 14/545; C23C 14/50; G01N 21/31;
(Continued)

(56) References Cited

U.S. PATENT DOCUMENTS 4,582,431 A * 4/1986 Cole .................... G01B 11/02
356/382
5,075,550 A  12/1991 Miller et al.
(Continued)

FOREIGN PATENT DOCUMENTS

EP         2901135 B1    8/2016
WO     2004/015364       2/2004
(Continued)

OTHER PUBLICATIONS

Authorized Officer Lee, Hun Gil in International Search Report and Written Opinion in International Application No. PCT/US2014/016603, dated Nov. 13, 2014, 9 pages.
(Continued)

*Primary Examiner* — Michael P Wieczorek
*Assistant Examiner* — Michael G Miller
(74) *Attorney, Agent, or Firm* — John W. Wustenberg; Parker Justiss, P.C.

(57) ABSTRACT

Techniques include receiving a design of an integrated computational element (ICE) including specification of a substrate and a plurality of layers, their respective target thicknesses and complex refractive indices, complex refractive indices of adjacent layers being different from each other, and a notional ICE fabricated in accordance with the ICE design being related to a characteristic of a sample; forming at least some of the layers of a plurality of ICEs in accordance with the ICE design using a deposition source, where the layers of the ICEs being formed are supported on a support that is periodically moved relative to the deposi-
(Continued)

tion source during the forming; monitoring characteristics of the layers of the ICEs during the forming, the monitoring of the characteristics being performed using a timing of the periodic motion of the support relative to the deposition source; and adjusting the forming based on results of the monitoring.

20 Claims, 34 Drawing Sheets

(51) Int. Cl.
| | |
|---|---|
| G01N 21/84 | (2006.01) |
| C23C 14/50 | (2006.01) |
| C23C 14/52 | (2006.01) |
| G01B 11/06 | (2006.01) |
| G01N 21/21 | (2006.01) |
| G01N 21/27 | (2006.01) |
| G01N 21/59 | (2006.01) |
| G01V 8/12 | (2006.01) |
| G02B 5/28 | (2006.01) |

(52) U.S. Cl.
CPC ........ C23C 14/548 (2013.01); G01B 11/0625 (2013.01); G01B 11/0683 (2013.01); G01N 21/211 (2013.01); G01N 21/27 (2013.01); G01N 21/59 (2013.01); G01N 21/8422 (2013.01); G01V 8/12 (2013.01); G01N 2201/0683 (2013.01); G01N 2201/12 (2013.01); G02B 5/285 (2013.01)

(58) Field of Classification Search
CPC ............... G01N 33/2823; G01N 21/33; G01N 21/8422; G01N 21/84; G01N 2021/8411; G01N 2021/8438; E21B 49/08
USPC .................................................. 427/160–169
See application file for complete search history.

(56) References Cited

U.S. PATENT DOCUMENTS

| | | | |
|---|---|---|---|
| 5,313,044 A * | 5/1994 | Massoud ............ | G01B 11/0683 438/16 |
| 5,399,229 A | 3/1995 | Stefani et al. | |
| 5,453,716 A | 9/1995 | Person et al. | |
| 5,537,479 A | 7/1996 | Kreisel et al. | |
| 5,619,366 A | 4/1997 | Rhoads et al. | |
| 6,078,389 A | 6/2000 | Zetter | |
| 6,154,550 A | 11/2000 | Beyer | |
| 6,163,259 A | 12/2000 | Barsumian et al. | |
| 6,198,531 B1 | 3/2001 | Myrick et al. | |
| 6,213,250 B1 | 4/2001 | Wisniewski et al. | |
| 6,217,720 B1 | 4/2001 | Sullivan et al. | |
| 6,529,276 B1 | 3/2003 | Myrick | |
| 6,646,753 B2 | 11/2003 | Zhang et al. | |
| 6,777,684 B1 | 8/2004 | Volkov et al. | |
| 6,804,060 B1 | 10/2004 | Tsai et al. | |
| 6,905,578 B1 | 6/2005 | Moslehi et al. | |
| 6,965,431 B2 | 11/2005 | Vo-Dinh et al. | |
| 7,138,156 B1 * | 11/2006 | Myrick ................... | G02B 5/285 359/359 |
| 7,153,399 B2 * | 12/2006 | Smith ................... | C23C 14/352 204/192.1 |
| 7,163,901 B2 | 1/2007 | Downey | |
| 7,332,044 B2 | 2/2008 | Sidorin et al. | |
| 7,679,563 B2 | 3/2010 | Werner et al. | |
| 7,697,141 B2 | 4/2010 | Jones et al. | |
| 7,753,847 B2 | 7/2010 | Greenleaf et al. | |
| 7,777,870 B2 | 8/2010 | Hayes et al. | |
| 7,792,644 B2 | 9/2010 | Kotter et al. | |
| 7,828,929 B2 | 11/2010 | Lee et al. | |
| 7,911,605 B2 | 3/2011 | Myrick et al. | |
| 7,920,258 B2 | 4/2011 | Myrick et al. | |
| 8,054,212 B1 | 11/2011 | Holly et al. | |
| 8,106,850 B1 | 1/2012 | Gregoire et al. | |
| 8,164,061 B2 | 4/2012 | Pawlak et al. | |
| 8,216,161 B2 | 7/2012 | Darlington et al. | |
| 8,252,112 B2 | 8/2012 | Ovshinsky | |
| 2002/0090650 A1 | 7/2002 | Empedocles et al. | |
| 2005/0054928 A1 | 3/2005 | Cerofolini | |
| 2005/0095730 A1 * | 5/2005 | Mikami ............. | G01B 11/0683 438/16 |
| 2005/0151969 A1 * | 7/2005 | Ke ........................ | G01N 21/211 356/369 |
| 2006/0144335 A1 * | 7/2006 | Lee ........................ | C23C 14/505 118/719 |
| 2008/0212168 A1 | 9/2008 | Olmstead et al. | |
| 2009/0182693 A1 | 7/2009 | Fulton et al. | |
| 2009/0213381 A1 | 8/2009 | Appel et al. | |
| 2010/0004773 A1 | 1/2010 | Kochergin | |
| 2010/0089906 A1 | 4/2010 | Plantamura | |
| 2010/0153048 A1 | 6/2010 | Myrick et al. | |
| 2010/0245096 A1 | 9/2010 | Jones et al. | |
| 2010/0245819 A1 | 9/2010 | Li | |
| 2012/0150451 A1 | 6/2012 | Skinner et al. | |
| 2012/0268744 A1 | 10/2012 | Wolf et al. | |
| 2013/0032338 A1 | 2/2013 | Kalia et al. | |
| 2013/0035262 A1 | 2/2013 | Freese et al. | |
| 2013/0083320 A1 | 4/2013 | Gao | |
| 2013/0284894 A1 | 10/2013 | Freese et al. | |
| 2013/0284895 A1 | 10/2013 | Freese et al. | |
| 2013/0284896 A1 | 10/2013 | Freese et al. | |
| 2013/0284897 A1 | 10/2013 | Freese et al. | |
| 2013/0284898 A1 | 10/2013 | Freese et al. | |
| 2013/0284899 A1 | 10/2013 | Freese et al. | |
| 2013/0284900 A1 | 10/2013 | Freese et al. | |
| 2013/0284901 A1 | 10/2013 | Freese et al. | |
| 2013/0284904 A1 | 10/2013 | Freese et al. | |
| 2013/0286398 A1 | 10/2013 | Freese et al. | |
| 2013/0286399 A1 | 10/2013 | Freese et al. | |
| 2013/0287061 A1 | 10/2013 | Freese et al. | |
| 2013/0323484 A1 | 12/2013 | Pelletier et al. | |

FOREIGN PATENT DOCUMENTS

| | | | | |
|---|---|---|---|---|
| WO | WO 2005045891 A2 * | 5/2005 | ........... | C23C 14/546 |
| WO | 2006/031733 | 3/2006 | | |
| WO | 2007/015115 | 2/2007 | | |
| WO | 2011/103066 | 8/2011 | | |
| WO | 2013/022556 | 2/2013 | | |

OTHER PUBLICATIONS

Extended European Search Report, European Application No. EP13884957.5, dated Jun. 17, 2015, 7 pages.
Soyemi et al. "Design and Testing of a Multivariate Optical Element: The First Demonstration of Multivariate Optical Computing for Predictive Spectroscopy", Analytical Chemistry, American Chemical Society, XP001063566, Mar. 15, 2001, pp. 1069-1079.
International Search Report and Written Opinion of the International Searching Authority issued in International Application No. PCT/US2013/077687 dated Sep. 23, 2014; 11 pages.
International Search Report and Written Opinion of the International Searching Authority issued in International Application No. PCT/US2013/077686 dated Sep. 24, 2014; 14 pages.
International Search Report and Written Opinion of the International Searching Authority issued in International Application No. PCT/US2013/077688 dated Sep. 25, 2014; 11 pages.
International Search Report and Written Opinion of the International Searching Authority issued in International Application No. PCT/US2013/077690 dated Sep. 22, 2014; 10 pages.
Frey et al., "Temperature-dependent refractive index of silicon and germanium," NASA Goodard Space Flight Center, Greenbelt, MD, 2006, 10 pages.
Morton et al., "Optical Monitoring of Thin-films Using Spectroscopic Ellipsometry," Society of Vacuum Coaters, 45th Annual Technical Conference Proceedings, 2002, 7 pages.

(56) References Cited

OTHER PUBLICATIONS

Eastwood et al., "Field applications of stand-off sensing using visible/NIR multivariate optical computing," Department of Chemistry and Biochemistry, University of South Carolina, SPE vol. 4199, 2001, 10 pages.
Paul et al., "Fabrication of mid-infrared frequency-selective surfaces by soft lithography", Applied Optics, v. 40, No. 25, Sep. 2001, 5 pages.
Haibach et al., "Precision in multivariate optical computing," Applied Optics, vol. 43, No. 10, Apr. 1, 2004, 11 pages.
J.A. Woollam Co., Inc., Characterizing Processes with EASE® In Situ Applications, Application Note, 2009, 3 pages.
Li, "Refractive Index of Silicon and Germanium and Its Wavelength and Temperature Derivatives," Center for Information and Numerical Data Analysis and Synthesis, Purdue University, J. Phys. Chem. Ref. Data, vol. 9, No. 3, 1980, 98 pages.
Myrick, "Multivariate optical elements simplify spectroscopy," Laser Focus World, Mar. 1, 2002, access date Feb. 28, 2013, 3 pages http://www.laserfocusworld.com/articles/print/volume-38/issue-3/features/spectroscopy/multivariate-optical-elements-simplify-spectroscopy.html.
Myrick et al., "A single-element all-optical approach to chemometric prediction," Vibrational Spectroscopy 28, 2002, 9 pages.
Myrick et al., "Spectral tolerance determination for multivariate optical element design," Fresenius J Anal Chem, 369, 2001, 5 pages.
Myrick et al., "Application of multivariate optical computing to simple near-infrared point measurements," SPIE vol. 4574, Department of Chemistry and biochemistry, University of South Carolina, 2002, 8 pages.
Rabady et al., "High-resolution photometric optical monitoring for thin-film deposition," Applied Optics, Optical Society of America, vol. 43, No. 1, Jan. 1, 2004, 6 pages.
Priore et al., "Novel Imaging Systems: Multivariate Optical Computing in the UV-VIS," Department of Chemistry and Biochemistry, University of South Carolina, 2003, 5 pages.
Grader et al., "Fourier transform infrared spectroscopy of a single aerosol particle," J. Chem. Phys. 86 (11), Jun. 1, 1987, 7 pages.
Soyemi et al., "Novel Filter Design Algorithm for Multivariate Optical Computing," Advanced Environmental and Chemical Sensing Technology, SPIE vol. 4205, 2001, 12 pages.
Telemark, "Model 820 In-Situ Spectroscopic Optical Monitor," Dec. 2010, 4 pages.
Bossard et al., "The Design and fabrication of planar multiband metallodielectric frequency selective surfaces for infrared applications", IEEE Trans. On Antennas and Propagation, v. 50, No. 4, Apr. 2006, 12 pages.
Woollam et al., "Overview of Variable Angle Spectroscopic Ellipsometer (VASE), Part 1: Basic Theory and Typical Applications," Society of Photo-Optical Instrumentation Engineers, Critical Reviews of Optical Science Technology CR72, 1999, 28 pages.
Zoeller et al., "Substantial progress in optical monitoring by intermittent measurement technique," SPIE, Published in the processing of the OSD, Jena 2005, vol. 5963-13, 9 pages.
Sullivan et al., "Manufacture of Complex Optical Multilayer Filters using an Automated Deposition System", XP002951089, vol. 51, No. 4, Published in 1998, pp. 647-654.
Haibach et al., "On-Line Reoptimization of Filter Designs for Multivariate Optical Elements", Applied Optics, Optical Society of America, XP001152469, vol. 42, No. 10, Apr. 1, 2003, pp. 1833-1838.

* cited by examiner

REAL-TIME MONITORING OF FABRICATION OF INTEGRATED COMPUTATIONAL ELEMENTS

CLAIM OF PRIORITY

This application is a U.S. National Stage of International Application No. PCT/US2013/077687, filed Dec. 24, 2013.

BACKGROUND

The subject matter of this disclosure is generally related to fabrication of an integrated computational element (ICE) used in optical analysis tools for analyzing a substance of interest, for example, crude petroleum, gas, water, or other wellbore fluids. For instance, the disclosed ICE fabrication uniformly forms layers of an ICE by periodically moving the ICE relative to a deposition source and uses timing of the periodic motion to monitor the ICE fabrication.

Information about a substance can be derived through the interaction of light with that substance. The interaction changes characteristics of the light, for instance the frequency (and corresponding wavelength), intensity, polarization, and/or direction (e.g., through scattering, absorption, reflection or refraction). Chemical, thermal, physical, mechanical, optical or various other characteristics of the substance can be determined based on the changes in the characteristics of the light interacting with the substance. As such, in certain applications, one or more characteristics of crude petroleum, gas, water, or other wellbore fluids can be derived in-situ, e.g., downhole at well sites, as a result of the interaction between these substances and light.

Integrated computational elements (ICEs) enable the measurement of various chemical or physical characteristics through the use of regression techniques. An ICE selectively weights, when operated as part of optical analysis tools, light modified by a sample in at least a portion of a wavelength range such that the weightings are related to one or more characteristics of the sample. An ICE can be an optical substrate with multiple stacked dielectric layers (e.g., from about 2 to about 50 layers), each having a different complex refractive index from its adjacent layers. The specific number of layers, N, the optical properties (e.g., real and imaginary components of complex indices of refraction) of the layers, the optical properties of the substrate, and the physical thickness of each of the layers that compose the ICE are selected so that the light processed by the ICE is related to one or more characteristics of the sample. Because ICEs extract information from the light modified by a sample passively, they can be incorporated in low cost and rugged optical analysis tools. Hence, ICE-based downhole optical analysis tools can provide a relatively low cost, rugged and accurate system for monitoring quality of wellbore fluids, for instance.

Errors in fabrication of some constituent layers of an ICE design can degrade the ICE's target performance. In most cases, deviations of <0.1%, and even 0.01% or 0.0001%, from point by point design values of the optical characteristics (e.g., complex refractive indices), and/or physical characteristics (e.g., thicknesses) of the formed layers of the ICE can reduce the ICE's performance, in some cases to such an extent, that the ICE becomes operationally useless. Non-uniformities in the spatial-profile of a deposition plume provided by a deposition source can be mitigated by periodically moving the ICEs being fabricated relative to the deposition source. Often, the ICEs being fabricated are rotated relative to the deposition source to provide reproducibly uniform layer deposition for the ICEs within a batch. Complex refractive indices and thicknesses of layers of the ICEs being fabricated are determined by performing in-situ measurements during the ICE fabrication. The determined complex refractive indices and layer thicknesses of the formed layers of the ICEs within the fabrication batch are used to adjust forming of remaining layers of the ICEs based on comparisons between determined values of complex refractive indices and layer thicknesses of the fabricated ICEs' layers and their respective target values. Those familiar or currently practicing in the art will readily appreciate that the ultra-high accuracies required by ICE designs challenge the state of the art in thin film measurement techniques. Conventionally, the periodic motion of ICEs being fabricated is temporarily interrupted while near real-time analyses based on results of the in-situ measurements are performed.

DESCRIPTION OF DRAWINGS

Like reference symbols in the various drawings indicate like elements.

DETAILED DESCRIPTION

Technologies are described for uniformly forming layers of ICEs by periodically moving the ICEs relative to a deposition source and using timing of the periodic motion to monitor in real-time the forming of the ICE layers. In some implementations, in-situ measurement techniques used to perform the real-time monitoring—such as ellipsometry, optical monitoring or spectrometry—are time-gated based on the periodic motion of ICEs being fabricated. In other implementations, the foregoing in-situ measurement techniques are performed synchronously with the periodic motion of the ICEs being fabricated. Previously formed layers and the layer currently being formed are characterized based on results of such real-time measurements.

In this manner, when necessary, the forming of a current layer and of subsequent layers can be adjusted in real-time, without having to interrupt the forming of the current layer. In addition, the disclosed technologies allow for reductions in fabrication time relative to conventional ICE fabrication where the forming of a layer is temporarily interrupted to perform in-situ measurements and adjustments. Moreover, knowledge of characteristics of the layer being formed (e.g., its current thickness, stoichiometry, etc.) obtained in real-time based on the disclosed measurements can be used to stop the forming of the current layer when its measured thickness exactly matches its target thickness. In this manner, subsequent optimization for correcting differences between a target ICE design and the ICE currently being fabricated can be reduced or eliminated.

Prior to describing example implementations of the disclosed technologies for ICE fabrication, the following technologies are described below: in Section (1)—optical analysis tools based on ICE along with examples of their use in oil/gas exploration, and in Section (2)—techniques for designing an ICE.

(1) ICE-Based Analysis of Wellbore Fluids

Figure 1A:
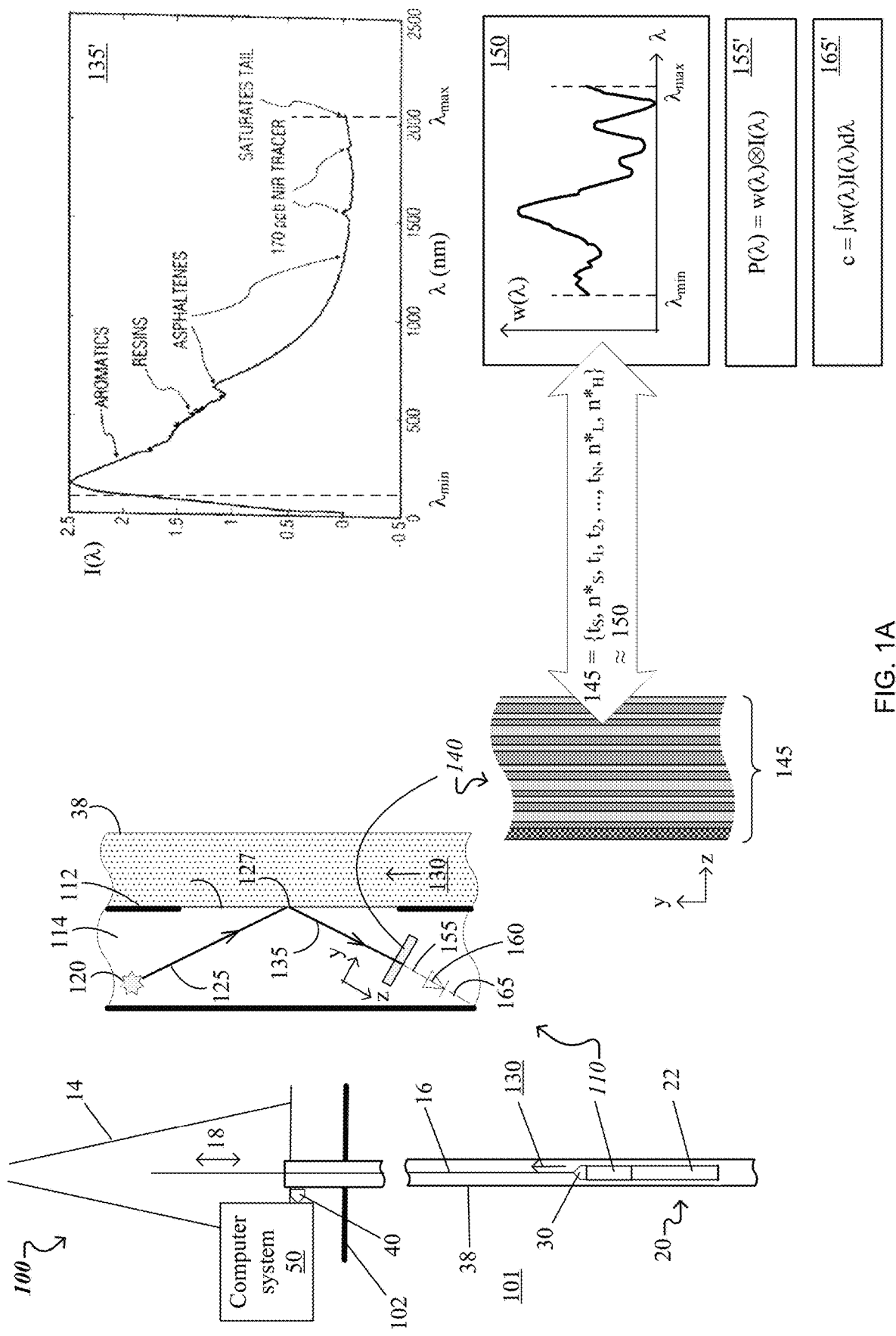
FIGS. 1A-1C show multiple configurations of an example of a system for analyzing wellbore fluids that uses a well logging tool including an ICE.
Figure 1C:
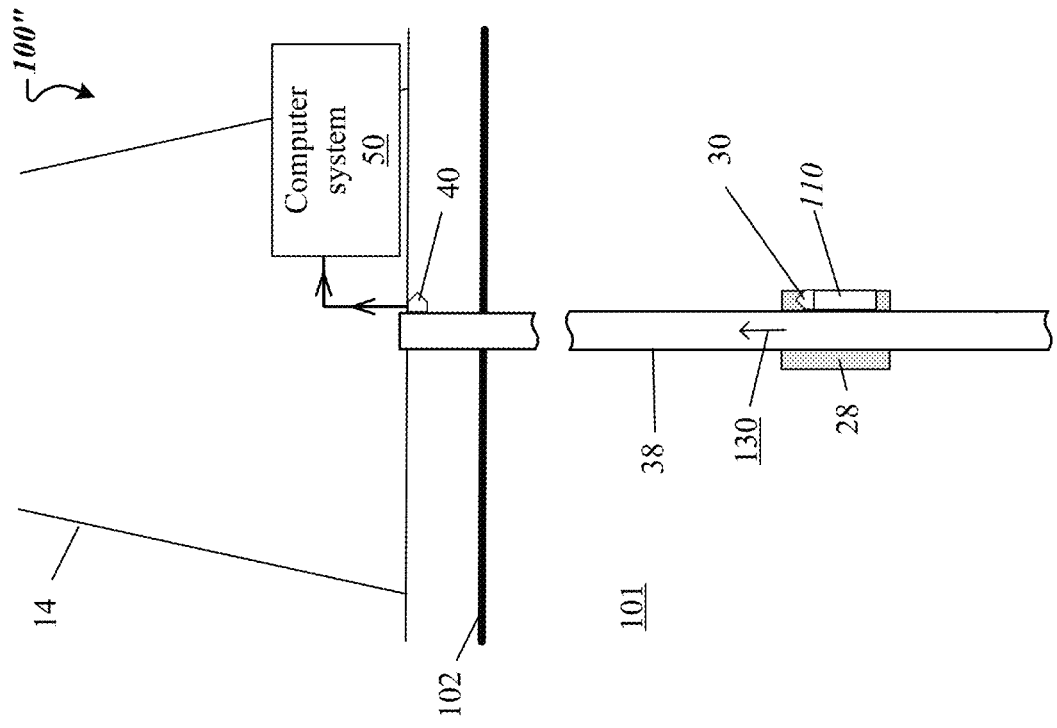
Figure 1B:
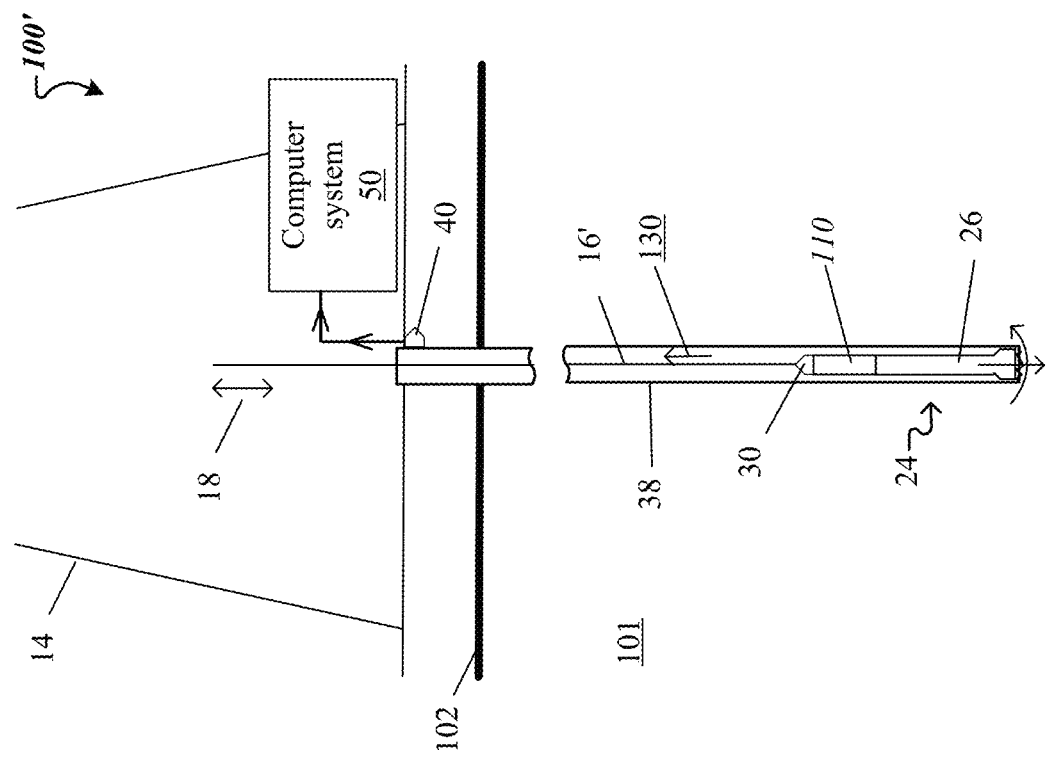

FIGS. 1A-1C show multiple configurations 100, 100', 100" of an example of a system for analyzing wellbore fluids 130, such that analyses are generated from measurements taken with a well logging tool 110 configured as an ICE-based optical analysis tool. The disclosed system also is referred to as a well logging system.

Each of the configurations 100, 100', 100" of the well logging system illustrated in FIGS. 1A-1C includes a rig 14 above the ground surface 102 and a wellbore 38 below the ground surface. The wellbore 38 extends from the ground surface into the earth 101 and generally passes through multiple geologic formations. In general, the wellbore 38 can contain wellbore fluids 130. The wellbore fluids 130 can be crude petroleum, mud, water or other substances and combinations thereof. Moreover, the wellbore fluids 130 may be at rest, or may flow toward the ground surface 102, for instance. Additionally, surface applications of the well logging tool 110 may include water monitoring and gas and crude transportation and processing.

FIG. 1A shows a configuration 100 of the well logging system which includes a tool string 20 attached to a cable 16 that can be lowered or raised in the wellbore 38 by draw works 18. The tool string 20 includes measurement and/or logging tools to generate and log information about the wellbore fluids 130 in the wellbore 38. In the configuration 100 of the well logging system, this information can be generated as a function of a distance (e.g., a depth) with respect to the ground surface 102. In the example illustrated in FIG. 1A, the tool string 20 includes the well logging tool 110, one or more additional well logging tool(s) 22, and a telemetry transmitter 30. Each of the well logging tools 110 and 22 measures one or more characteristics of the wellbore fluids 130. In some implementations, the well logging tool 110 determines values of the one or more characteristics in real time and reports those values instantaneously as they occur in the flowing stream of wellbore fluids 130, sequentially to or simultaneously with other measurement/logging tools 22 of the tool string 20.

FIG. 1B shows another configuration 100' of the well logging system which includes a drilling tool 24 attached to a drill string 16'. The drilling tool 24 includes a drill bit 26, the ICE-based well logging tool 110 configured as a measurement while drilling (MWD) and/or logging while drilling (LWD) tool, and the telemetry transmitter 30. Drilling mud is provided through the drill string 16' to be injected into the borehole 38 through ports of the drill bit 26. The injected drilling mud flows up the borehole 38 to be returned above the ground level 102, where the returned drilling mud can be resupplied to the drill string 16' (not shown in FIG. 1B). In this case, the MWD/LWD-configured well logging tool 110 generates and logs information about the wellbore fluids 130 (e.g., drilling mud in this case) adjacent the working drill bit 26.

FIG. 1C shows yet another configuration 100" of the well logging system which includes a permanent installation adjacent to the borehole 38. In some implementations, the permanent installation is a set of casing collars that reinforce the borehole 38. In this case, a casing collar 28 from among the set of casing collars supports the well logging tool 110 and the telemetry transmitter 30. In this manner, the well logging tool 110 determines and logs characteristics of the wellbore fluids 130 adjacent the underground location of the casing collar 28.

In each of the above configurations 100, 100' and 100" of the well logging system, the values of the one or more characteristics measured by the well logging tool 110 are provided (e.g., as a detector signal 165) to the telemetry transmitter 30. The latter communicates the measured values to a telemetry receiver 40 located above the ground surface 102. The telemetry transmitter 30 and the telemetry receiver 40 can communicate through a wired or wireless telemetry channel. In some implementations of the system configurations 100, 100' illustrated in FIGS. 1A and 1B, e.g., in slickline or coiled tubing applications, measurement data generated by the well logging tool 110 can be written locally to memory of the well logging tool 110.

The measured values of the one or more characteristics of the wellbore fluids 130 received by the telemetry receiver 40 can be logged and analyzed by a computer system 50 associated with the rig 14. In this manner, the measurement values provided by the well logging tool 110 can be used to generate physical and chemical information about the wellbore fluids 130 in the wellbore 38.

Referring again to FIG. 1A, the well logging tool 110 includes a light source 120, an ICE 140 and an optical transducer 160. The well logging tool 110 has a frame 112 such that these components are arranged in an enclosure 114 thereof. A cross-section of the well logging tool 110 in a plane perpendicular to the page can vary, depending on the space available. For example, the well logging tool's cross-section can be circular or rectangular, for instance. The well logging tool 110 directs light to the sample 130 through an optical interface 116, e.g., a window in the frame 112. The well logging tool 110 is configured to probe the sample 130 (e.g., the wellbore fluids stationary or flowing) in the wellbore 38 through the optical interface 116 and to determine an amount (e.g., a value) of a given characteristic (also referred to as a characteristic to be measured) of the probed sample 130. The characteristic to be measured can be any one of multiple characteristics of the sample 130 including concentration of a given substance in the sample, a gas-oil-ratio (GOR), pH value, density, viscosity, etc.

The light source 120 outputs light with a source spectrum over a particular wavelength range, from a minimum wavelength $\lambda_{min}$ to a maximum wavelength $\lambda_{max}$. In some implementations, the source spectrum can have non-zero intensity over the entire or most of the wavelength range $\lambda_{max}-\lambda_{min}$. In some implementations, the source spectrum extends through UV-vis (0.2-0.8 μm) and near-IR (0.8-2.5 μm) spectral ranges. Alternatively, or additionally, the source spectrum extends through near-IR and mid-IR (2.5-25 μm) spectral ranges. In some implementations, the source spectrum extends through near-IR, mid-IR and far-IR (25-100 μm) spectral ranges. In some implementations, the light source 120 is tunable and is configured in combination with time resolved signal detection and processing.

The light source 120 is arranged to direct a probe beam 125 of the source light towards the optical interface 116 where it illuminates the sample 130 at a location 127. The source light in the probe beam 125 interacts with the sample 130 and reflects off it as light modified by the sample 130. The light modified by the sample has a modified spectrum I(λ) 135' over the particular wavelength range. In the reflective configuration of the well logging tool 110 illustrated in FIG. 1A (i.e., where the light to be analyzed reflects at the sample/window interface), the modified spectrum I(λ) 135' is a reflection spectrum associated with the sample 130. In a transmission configuration of the well logging tool 110 (not shown in FIG. 1A), the probe beam is transmitted through the sample as modified light, such that the modified spectrum I(λ) 135' is a transmission spectrum associated with the sample.

In general, the modified spectrum I(λ) 135' encodes information about multiple characteristics associated with the sample 130, and more specifically the encoded information relates to current values of the multiple characteristics. In the example illustrated in FIG. 1A, the modified spectrum 135' contains information about one or more characteristics of the wellbore fluids 130.

With continued reference to FIG. 1A, and the Cartesian coordinate system provided therein for reference, the ICE 140 is arranged to receive a beam 135 of the sample modified light, and is configured to process it and to output a beam 155 of processed light. The beam 135 of sample modified light is incident on a first surface of the ICE 140 along the z-axis, and the beam 155 of processed light is output along the z-axis after transmission through the ICE 140. Alternatively or additionally, the beam 155 (or an additional reflected beam) of processed light can be output after reflection off the first surface of the ICE 140. The ICE 140 is configured to process the sample modified light by weighting it in accordance with an optical spectrum w(λ) 150 associated with a characteristic to be measured.

The optical spectrum w(λ) 150 is determined offline by applying conventional processes to a set of calibration spectra I(λ) of the sample which correspond to respective known values of the characteristic to be measured. As illustrated by optical spectrum w(λ) 150, optical spectrums generally may include multiple local maxima (peaks) and minima (valleys) between $\lambda_{min}$ and $\lambda_{max}$. The peaks and valleys may have the same or different amplitudes. For instance, an optical spectrum w(λ) can be determined through regression analysis of $N_c$ calibration spectra $I_j(\lambda)$ of a sample, where j=1, . . . ,$N_c$, such that each of the calibration spectra $I_j(\lambda)$ corresponds to an associated known value of a given characteristic for the sample. A typical number $N_c$ of calibration spectra $I_j(\lambda)$ used to determine the optical spectrum w(λ) 150 through such regression analysis can be $N_c$=10, 40 or 100, for instance. The regression analysis outputs, within the $N_c$ calibration spectra $I_j(k)$, a spectral pattern that is unique to the given characteristic. The spectral pattern output by the regression analysis corresponds to the optical spectrum w(λ) 150. In this manner, when a value of the given characteristic for the sample is unknown, a modified spectrum $I_u(\lambda)$ of the sample is acquired by interacting the probe beam 125 with the sample 130, then the modified spectrum $I_u(L)$ is weighted with the ICE 140 to determine a magnitude of the spectral pattern corresponding to the optical spectrum w(λ) 150 within the modified spectrum $I_u(\lambda)$. The determined magnitude is proportional to the unknown value of the given characteristic for the sample.

For example, the sample can be a mixture (e.g., the wellbore fluid 130) containing substances X, Y and Z, and the characteristic to be measured for the mixture is concentration $c_X$ of substance X in the mixture. In this case, $N_c$ calibration spectra $I_j(\lambda)$ were acquired for $N_c$ samples of the mixture having respectively known concentration values for each of the substances contained in the $N_c$ samples. By applying regression analysis to the $N_c$ calibration spectra $I_j(\lambda)$, a first spectral pattern that is unique to the concentration $c_X$ of the X substance can be detected (recognized), such that the first spectral pattern corresponds to a first optical spectrum $w_{cX}(\lambda)$ associated with a first ICE, for example. Similarly, second and third spectral patterns that are respectively unique to concentrations $c_Y$ and $c_Z$ of the Y and Z substances can also be detected, such that the second and third spectral patterns respectively correspond to second and third optical spectra $w_{cY}(\lambda)$ and $w_{cZ}(\lambda)$ respectively associated with second and third ICEs. In this manner, when a new sample of the mixture (e.g., the wellbore fluid 130) has an unknown concentration $c_X$ of the X substance, for instance, a modified spectrum $I_u(\lambda)$ of the new sample can be acquired by interacting the probe beam with the mixture, then the modified spectrum Iu(λ) is weighted with the first ICE to determine a magnitude of the first spectral pattern within the modified spectrum $I_u(\lambda)$. The determined magnitude is proportional to the unknown value of the concentration $c_X$ of the X substance for the new sample.

Referring again to FIG. 1A, the ICE 140 includes N layers of materials stacked on a substrate, such that complex refractive indices of adjacent layers are different from each other. The total number of stacked layers can be between 6 and 50, for instance. The substrate material can be BK7, diamond, Ge, ZnSe (or other transparent dielectric material), and can have a thickness in the range of 0.02-2 mm, for instance, to insure structural integrity of the ICE 140.

Throughout this specification, a complex index of refraction (or complex refractive index) n* of a material has a complex value, $Re(n^*)+iIm(n^*)$. $Re(n^*)$ represents a real component of the complex index of refraction responsible for refractive properties of the material, and $Im(n^*)$ represents an imaginary component of the complex index of refraction (also known as extinction coefficient K) responsible for absorptive properties of the material. In this specification, when it is said that a material has a high complex index of refraction $n^*_H$ and another material has a low complex index of refraction $n^*_L$, the real component $Re(n^*_H)$ of the high complex index of refraction $n^*_H$ is larger than the real component $Re(n^*_L)$ of the low complex index of refraction $n^*_L$, $Re(n^*_H) > Re(n^*_L)$. Materials of adjacent layers of the ICE are selected to have a high complex index of refraction $n^*_H$ (e.g., Si), and a low complex index of refraction $n^*_L$ (e.g., $SiO_2$). Here, $Re(n^*_{Si}) \approx 2.4 > Re(n^*_{SiO2}) \approx 1.5$. For other material pairings, however, the difference between the high complex refractive index $n^*_H$ and low complex refractive index $n^*_L$ may be much smaller, e.g., $Re(n^*_H) \approx 1.6 > Re(n^*_L) \approx 1.5$. The use of two materials for fabricating the N layers is chosen for illustrative purposes only. For example, a plurality of materials having different complex indices of refraction, respectively, can be used. Here, the materials used to construct the ICE are chosen to achieve a desired optical spectrum $w(\lambda)$ 150.

A set of design parameters 145—which includes the total number of stacked layers N, the complex refractive indices $n^*_H$, $n^*_L$ of adjacent stacked layers, and the thicknesses of the N stacked layers t(1), t(2), t(N−1), ... t(N)—of the ICE 140 can be chosen (as described below in connection with FIG. 2) to be spectrally equivalent to the optical spectrum $w(\lambda)$ 150 associated with the characteristic to be measured. As such, an ICE design includes a set 145 of thicknesses {t(i), i=1, ... ,N} of the N layers stacked on the substrate that correspond to the optical spectrum $w(\lambda)$ 150.

In view of the above, the beam 155 of processed light output by the ICE 140 has a processed spectrum $P(\lambda) = w(\lambda) \otimes I(\lambda)$ 155' over the wavelength range $\lambda_{max} - \lambda_{min}$, such that the processed spectrum 155' represents the modified spectrum $I(\lambda)$ 135' weighted by the optical spectrum $w(\lambda)$ 150 associated with the characteristic to be measured.

The beam 155 of processed light is directed from the ICE 140 to the optical transducer 160, which detects the processed light and outputs an optical transducer signal 165. A value (e.g., a voltage) of the optical transducer signal 165 is a result of an integration of the processed spectrum 155' over the particular wavelength range and is proportional to the unknown value "c" 165' of the characteristic to be measured for the sample 130.

In some implementations, the well logging tool 110 can include a second ICE (not shown in FIG. 1A) associated with a second ICE design that includes a second set of thicknesses {t'(i), i=1, ... ,N'} of a second total number N' of layers, each having a different complex refractive index from its adjacent layers, the complex refractive indices and the thicknesses of the N' layers corresponding to a second optical spectrum $w'(\lambda)$. Here, the second optical spectrum $w'(\lambda)$ is associated with a second characteristic of the sample 130, and a second processed spectrum represents the modified spectrum $I(\lambda)$ 135' weighted by the second optical spectrum $w'(\lambda)$, such that a second value of a second detector signal is proportional to a value of the second characteristic for the sample 130.

In some implementations, the determined value 165' of the characteristic to be measured can be logged along with a measurement time, geo-location, and other metadata, for instance. In some implementations, the detector signal 165, which is proportional to a characteristic to be measured by the well logging tool 110, can be used as a feedback signal to adjust the characteristic of the sample, to modify the sample or environmental conditions associated with the sample, as desired.

Characteristics of the wellbore fluids 130 that can be related to the modified spectrum 135' through the optical spectra associated with the ICE 140 and other ICEs (not shown in FIG. 1A) are concentrations of one of asphaltene, saturates, resins, aromatics; solid particulate content; hydrocarbon composition and content; gas composition C1-C6 and content: $CO_2$, $H_2S$ and correlated PVT properties including GOR, bubble point, density; a petroleum formation factor; viscosity; a gas component of a gas phase of the petroleum; total stream percentage of water, gas, oil, solid articles, solid types; oil finger printing; reservoir continuity; oil type; and water elements including ion composition and content, anions, cations, salinity, organics, pH, mixing ratios, tracer components, contamination, or other hydrocarbon, gas, solids or water property.

(2) Aspects of ICE Design

Aspects of a process for designing an ICE associated with a characteristic to be measured (e.g., one of the characteristics enumerated above) are described below. Here, an input of the ICE design process is a theoretical optical spectrum $w_{th}(\lambda)$ associated with the characteristic. An output of the ICE design process is an ICE design that includes specification of (1) a substrate and a number N of layers to be formed on the substrate, each layer having a different complex refractive index from its adjacent layers; and (2) complex refractive indices and thicknesses of the substrate and layers that correspond to a target optical spectrum $w_t(\lambda)$. The target optical spectrum $w_t(\lambda)$ is different from the theoretical optical spectrum $w_{th}(\lambda)$ associated with the characteristic, such that the difference between the target and theoretical optical spectra cause degradation of a target performance relative to a theoretical performance of the ICE within a target error tolerance. The target performance represents a finite accuracy with which an ICE having the target optical spectrum $w_t(\lambda)$ is expected to predict known values of the characteristic corresponding to a set of validation spectra of a sample with a finite (non-zero) error. Here, the predicted values of the characteristic are obtained through integration of the validation spectra of the sample respectively weighted by the ICE with the target optical spectrum $w_t(\lambda)$. The theoretical performance represents the maximum accuracy with which the ICE—if it had the theoretical optical spectrum $w_{th}(\lambda)$—would predict the known values of the characteristic corresponding to the set of validation spectra of the sample. Here, the theoretically predicted values of the characteristic would be obtained through integration of the validation spectra of the sample respectively weighted by the ICE, should the ICE have the theoretical optical spectrum $w_{th}(\lambda)$.

Figure 2:
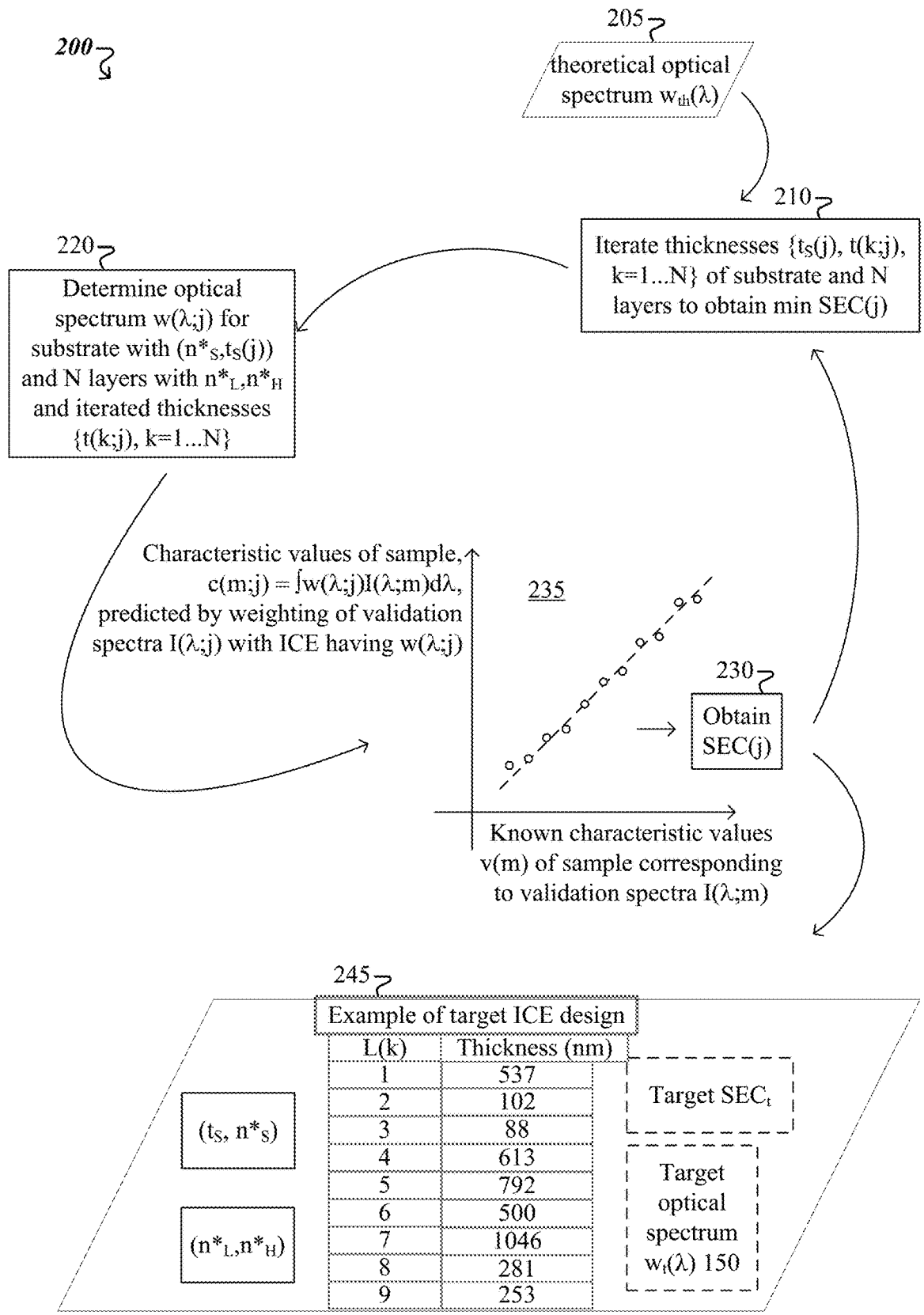
FIG. 2 is a flowchart showing an example of a process for designing an ICE.

FIG. 2 is a flow chart of an example of a process 200 for generating an ICE design. One of the inputs to the process 200 is a theoretical optical spectrum $w_{th}(\lambda)$ 205. For instance, to design an ICE for measuring concentration of a substance X in a mixture, a theoretical optical spectrum $w_{th}(\lambda)$, associated with the concentration of the substance X in the mixture, is accessed, e.g., in a data repository. As described above in this specification, the accessed theoretical optical spectrum $w_t(\lambda)$ corresponds to a spectral pattern detected offline, using a number $N_c$ of calibration spectra of the mixture, each of the $N_c$ calibration spectra corresponding to a known concentration of the substance X in the mixture. An additional input to the process 200 is a specification of materials for a substrate and ICE layers. Materials having different complex refractive indices, respectively, are specified such that adjacent ICE layers are formed from materials with different complex refractive indices. For example, a first material (e.g., Si) having a high complex refractive index $n^*_H$ and a second material (e.g., $SiO_x$) having a low complex refractive index $n^*_L$ are specified to alternately form the ICE layers. As another example, a layer can be made from high index material (e.g., Si), followed by a layer made from low index material (e.g., $SiO_x$), followed by a layer made from a different high index material (e.g., Ge), followed by a layer made from a different low index material ($MgF_2$), etc. The iterative design process 200 is performed in the following manner.

At 210 during the $j^{th}$ iteration of the design process 200, thicknesses $\{t_S(j), t(1;j), t(2;j), \ldots, t(N-1;j), t(N;j)\}$ of the substrate and a number N of layers of the ICE are iterated.

At 220, a $j^{th}$ optical spectrum $w(\lambda;j)$ of the ICE is determined corresponding to complex refractive indices and previously iterated thicknesses $\{t_S(j), t(1;j), t(2;j), \ldots, t(N-1;j), t(N;j)\}$ of the substrate and the N layers, each having a different complex refractive index from its adjacent layers. The iterated thicknesses of the substrate and the N layers are used to determine the corresponding $j^{th}$ optical spectrum $w(\lambda;j)$ of the ICE in accordance with conventional techniques for determining spectra of thin film interference filters.

At 230, performance of the ICE, which has the $j^{th}$ optical spectrum $w(\lambda;j)$ determined at 220, is obtained. To do so, a set of validation spectra of a sample is accessed, e.g., in a data repository. Respective values of a characteristic of the sample are known for the validation spectra. For instance, each of $N_v$ validation spectra $I(\lambda;m)$ corresponds to a value $v(m)$ of the characteristic of the sample, where $m=1, \ldots, N_v$. In the example illustrated in FIG. 2, $N_v=11$ validation spectra, respectively corresponding to 11 known values of the characteristic to be measured for the sample, are being used.

Graph 235 shows (in open circles) values $c(m;j)$ of the characteristic of the sample predicted by integration of the validation spectra $I(\lambda;m)$ weighted with the ICE, which has the $j^{th}$ optical spectrum $w(\lambda;j)$, plotted against the known values $v(m)$ of the characteristic of the sample corresponding to the validation spectra $I(\lambda;m)$. The predicted values $c(m;1)$ of the characteristic are found by substituting, in formula 165' of FIG. 1A, (1) the spectrum $I(\lambda)$ 135' of sample modified light with the respective validation spectra $I(\lambda;m)$ and (2) the target spectrum $w_t(\lambda)$ 150 with the $j^{th}$ optical spectrum $w(\lambda;j)$. In this example, performance of the ICE, which has the $j^{th}$ optical spectrum $w(\lambda;j)$, is quantified in terms of a weighted measure of distances from each of the open circles in graph 235 to the dashed-line bisector between the x and y axes. This weighted measure is referred to as the standard calibration error (SEC) of the ICE. For instance, an ICE having the theoretical spectrum $w_{th}(\lambda)$ has a theoretical $SEC_{th}$ that represents a lower bound for the SEC(j) of the ICE having the $j^{th}$ spectrum $w(\lambda;j)$ determined at 220 during the $j^{th}$ iteration of the design process 200: $SEC(j) > SEC_{th}$.

In this specification, the SEC is chosen as a metric for evaluating ICE performance for the sake of simplicity. Note that there are other figures of merit that may be used to evaluate performance of ICE, as is known in the art. For example, sensitivity—which is defined as the slope of characteristic change as a function of signal strength—can also be used to evaluate ICE performance. As another example, standard error of prediction (SEP)—which is defined in a similar manner to the SEC except it uses a different set of validation spectra—can be used to evaluate ICE performance. Any of the figure(s) of merit known in the art is/are evaluated in the same general way by comparing theoretical performance with that actually achieved. Which figure(s) of merit or combinations are used to evaluate ICE performance is determined by the specific ICE design.

The iterative design process 200 continues by iterating, at 210, the thicknesses of the substrate and the N layers. The iterating is performed such that a $(j+1)^{th}$ optical spectrum $w(\lambda;j+1)$—determined at 220 from the newly iterated thicknesses—causes, at 230, improvement in performance of the ICE, to obtain $SEC(j+1) < SEC(j)$. In some implementations, the iterative design process 200 is stopped when the ICE's performance reaches a local maximum, or equivalently, the SEC of the ICE reaches a local minimum. For example, the iterative process 200 can be stopped at the $(j+1)^{th}$ iteration when the current $SEC(j+1)$ is larger than the last $SEC(j)$, $SEC(j+1) > SEC(j)$. In some implementations, the iterative design process 200 is stopped when, for a given number of iterations, the ICE's performance exceeds a specified threshold performance for a given number of iterations. For example, the iterative design process 200 can be stopped at the $j^{th}$ iteration when three consecutive SEC values decrease monotonously and are less than a specified threshold value: $SEC_0 > SEC(j-2) > SEC(j-1) > SEC(j)$.

In either of these cases, an output of the iterative process 200 represents a target ICE design 245 to be used for fabricating an ICE 140, like the one described in FIG. 1A, for instance. The ICE design 245 includes specification of (1) a substrate and N layers, each having a different complex refractive index from its adjacent layers, and (2) complex refractive indices $n^*_S, n^*_H, n^*_L$ and thicknesses $\{t_S(j), t(1;j), t(2;j), \ldots, t(N-1;j), t(N;j)\}$ of the substrate and N layers corresponding to the $j^{th}$ iteration of the process 200. Additional components of the ICE design are the optical spectrum $w(\lambda;j)$ and the $SEC(j)$—both determined during the $j^{th}$ iteration based on the thicknesses $\{t_S(j), t(1;j), t(2;j), \ldots, t(N-1;j), t(N;j)\}$. As the ICE design 245 is used as input for fabrication processes described herein, the iteration index j—at which the iterative process 200 terminates—is dropped from the notations used for the components of the ICE design.

In this manner, the thicknesses of the substrate and the N layers associated with the ICE design 245 are denoted $\{t_S, t(1), t(2), \ldots, t(N-1), t(N)\}$ and are referred to as the target thicknesses. The optical spectrum associated with the ICE design 245 and corresponding to the target thicknesses is referred to as the target optical spectrum $w_t(\lambda)$ 150. The SEC associated with the ICE design 245—obtained in accordance with the target optical spectrum $w_t(\lambda)$ 150 corresponding to the target thicknesses—is referred to as the target $SEC_t$. In the example illustrated in FIG. 2, the ICE design 245 has a total of N=9 alternating Si and $SiO_2$ layers, with complex refractive indices $n_{Si}, n_{SiO2}$, respectively. The layers' thicknesses (in nm) are shown in the table. An ICE fabricated based on the example of ICE design 245 illustrated in FIG. 2 is used to predict value(s) of concentration of substance X in wellbore fluids 130.

(3) Technologies for Adjusting ICE Fabrication in Real-Time

As described above in connection with FIG. 2, an ICE design specifies a number of material layers), each having a different complex refractive index from its adjacent layers. An ICE fabricated in accordance with the ICE design has (i) a target optical spectrum $w_t(\lambda)$ and (ii) a target performance $SEC_t$, both of which corresponding to the complex refractive indices and target thicknesses of a substrate and a total number of layers specified by the ICE design. Performance of the ICE fabricated in accordance with the ICE design can be very sensitive to actual values of the complex refractive indices and thicknesses obtained during deposition. For a wide variety of reasons, the actual values of the complex refractive indices of materials to be deposited and/or the rate(s) of the deposition may drift within a fabrication batch or batch-to-batch, or may be affected indirectly by errors caused by measurement systems used to control the foregoing fabrication parameters. For example, materials used for deposition (Si, $SiO_2$) may be differently contaminated, or react differently due to different chamber conditions (e.g., pressure or temperature). For some layers of the ICE design 245, a small error, e.g., 0.1% or 0.001%, in the thickness of a deposited layer can result in a reduction in the performance of an ICE associated with the ICE design 245 below an acceptable threshold.

Thickness and complex refractive index uniformity of deposited layers can be controlled across a batch of ICEs being fabricated by periodically moving a support—that supports the ICEs during fabrication—with respect to a deposition source. However, actual values of complex refractive indices or thicknesses of deposited layers can be different from their target values due to deposition rate drifts (i) during fabrication of one or more layers of the ICEs fabricated within a batch, or (ii) from batch-to-batch. For example, deposition rate changes may be caused by contamination of materials used for deposition (Si, $SiO_2$), or by modifications of deposition chamber conditions (e.g., pressure or temperature). The deposition rate changes can lead to changes in thicknesses and/or complex refractive indices of the deposited layers compared to their respective targets, which in turn result in degradation of the fabricated ICEs' performance with respect to a target performance. The foregoing process changes can be corrected or prevented altogether by in-situ monitoring the ICE fabrication.

Effects of fabrication errors on the performance of fabricated ICEs are minimized by monitoring the ICE fabrication. For instance, in-situ ellipsometry, optical monitoring or spectroscopy for monitoring the ICE fabrication can be performed individually or in combination with one another. Conventionally, either one of these in-situ optical measurements is performed in the following manner. First, the periodic motion relative to the deposition source of the ICEs being fabricated is stopped after completing deposition of each layer of the ICEs. As such, the in-situ optical measurement is performed on a witness sample that is at rest relative to the deposition source to measure characteristics of probe-light that interacted with the witness sample. The witness sample can be one or more of the ICEs being fabricated. The measured characteristics are used next to determine optical characteristics (e.g., complex refractive indices) or physical characteristics (e.g., thicknesses) of deposited layers of the ICEs. Differences between the determined and target complex refractive indices and thicknesses of the formed layers are used to obtain new target thicknesses for the layers that remain to be deposited. The foregoing steps of these static, in-situ measurements and optimizations are repeated after deposition of each of the layers of the ICEs being fabricated.

In accordance with the disclosed technologies, one or more of in-situ ellipsometry, optical monitoring or spectroscopy is performed on a witness sample while it is undergoing the same periodic motion as the ICEs being fabricated. In some implementations, the foregoing in-situ measurement techniques are time-gated based on the periodic motion of the witness sample and the ICEs being fabricated. In other implementations, the foregoing in-situ measurement techniques are performed synchronously with the periodic motion of the witness sample and the ICEs being fabricated. As such, characteristics of probe-light that interacted with the witness sample are measured without stopping the periodic motion of the witness sample and of the ICEs being fabricated. Note that probe-light represents any type of electromagnetic radiation having one or more probe wavelengths from an appropriate region of the electromagnetic spectrum. Moreover, the measured characteristics are used to determine in real-time complex refractive indices and thicknesses (and/or other characteristics) of layers of the current instance of the ICEs while the current layer is being deposited. Throughout this specification, determining a complex refractive index n* of a layer means that both the real component Re(n*) and the imaginary component Im(n*) of the complex refractive index are being determined. The determined complex refractive indices and thicknesses of the layers of the current instance of the ICEs are used to control and stop deposition of the current layer precisely when its determined thickness reaches its target thickness. By doing so, the need for subsequent ICE design re-optimization is reduced or eliminated.

Details of one or more of the foregoing embodiments are described below.

(3.1) In-Situ Measurement Techniques that are Time-Gated Based on Periodic Motion of Ices being Fabricated and Implemented in Measurement System that is Static Relative to Deposition Source A target ICE design can be provided to an ICE fabrication system in which multiple ICEs are fabricated based on the target ICE design. Technologies for in-situ monitoring of ICE fabrication using real-time measurements of characteristics of current instances of ICEs being fabricated are described below, such that the measurements are time-gated based on periodic motion of the ICEs being fabricated.

Figure 3A:
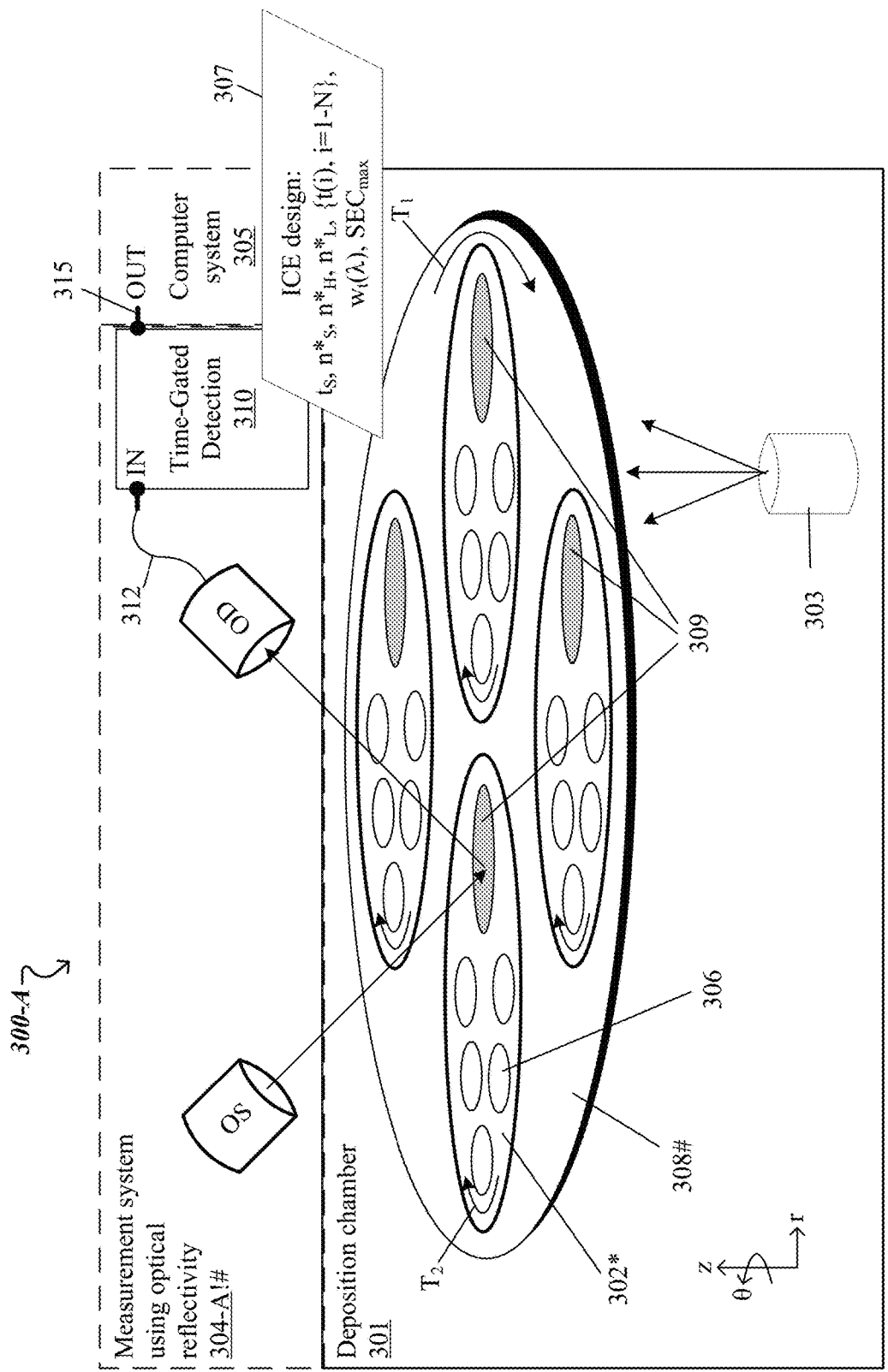
FIGS. 3A-3D show aspects of an example of a system for fabricating ICEs using a measurement system that is at rest relative to a deposition source to measure characteristics of the ICEs being fabricated without interrupting their periodic motion relative to the deposition source.
Figure 3B:
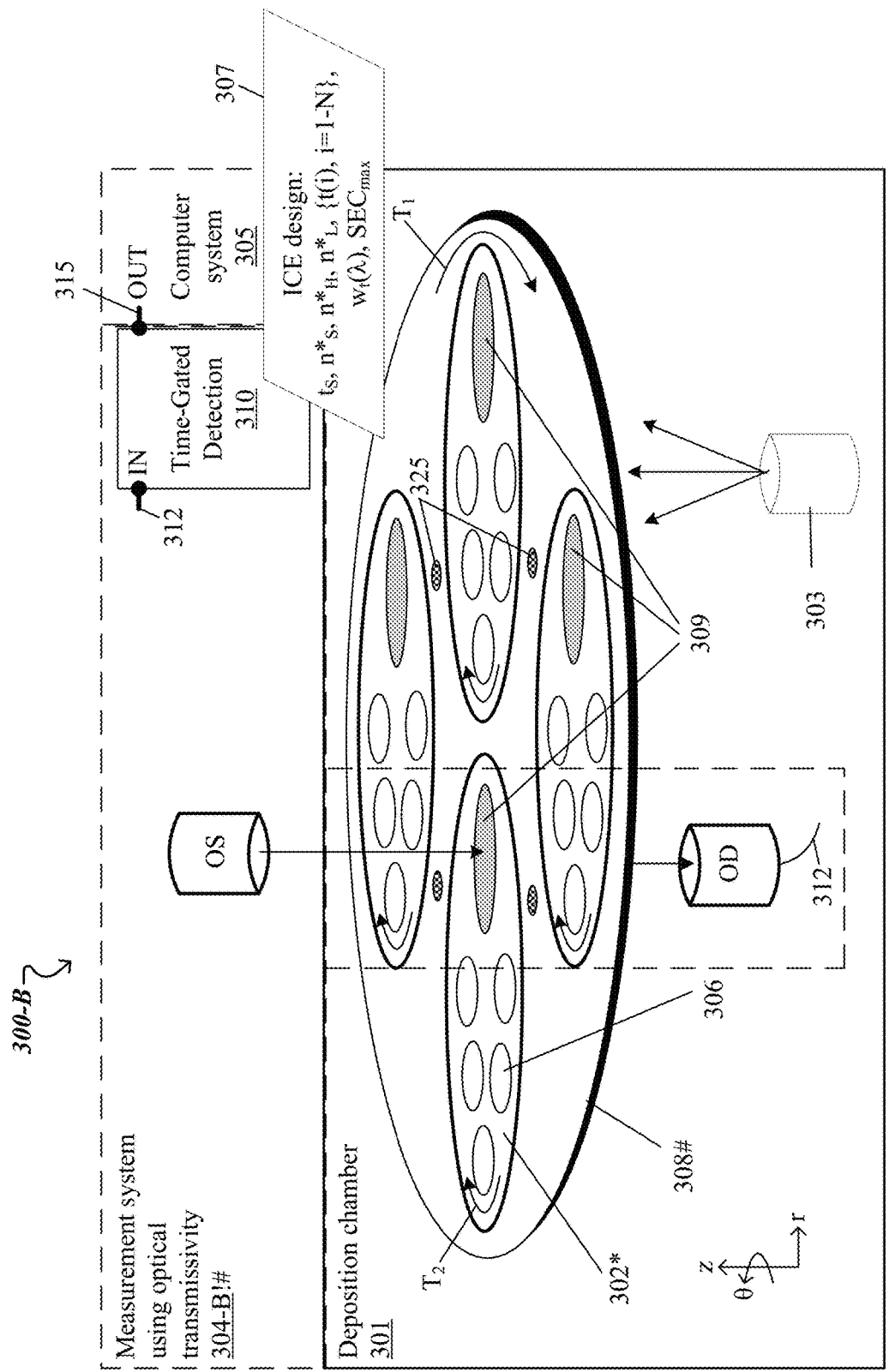

FIGS. 3A-3B show different configurations of an example of an ICE fabrication system 300. The ICE fabrication system 300 includes a deposition chamber 301 to fabricate one or more ICEs 306, a measurement system 304 to measure characteristics of probe-light that interacted with formed layers of the ICEs while the ICEs are being fabricated, and a computer system 305 to control the fabrication of the one or more ICEs based at least in part on results of the measurements. A configuration 300-A of the ICE fabrication system includes a configuration 304-A of the measurement system for taking optical reflection measurements, while another configuration 300-B of the ICE fabrication system includes another configuration 304-B of the measurement system for taking optical transmission measurements, as described in detail below.

The deposition chamber 301 includes one or more deposition sources 303 to provide materials with a low complex index of refraction $n^*_L$ and a high complex index of refraction $n^*_H$ used to form layers of the ICEs 306. Here the deposition sources(s) 303 is(are) at rest relative to the deposition chamber 301. Substrates on which layers of the ICEs 306 will be deposited are placed on M substrate supports 302, where M≥1, within the field of view of the deposition source(s) 303. The substrates have a thickness $t_S$ and a complex refraction index $n^*_S$ specified by the ICE design 307. Various physical vapor deposition (PVD) techniques can be used to form a stack of layers of each of the ICEs 306 in accordance with a target ICE design 145 or 245, for instance. In accordance with PVD techniques, the layers of the ICEs are formed by condensation of a vaporized form of material(s) of the source(s) 305, while maintaining vacuum in the deposition chamber 301. One such example of PVD technique is electron beam (E-beam) deposition, in which a beam of high energy electrons is electromagnetically focused onto material(s) of the deposition source(s) 303, e.g., either Si, or $SiO_2$, to evaporate atomic species. In some cases, E-beam deposition is assisted by ions, provided by ion-sources (not shown in FIGS. 3A-3B), to clean or etch the ICE substrate(s); and/or to increase the energies of the evaporated material(s), such that they are deposited onto the substrates more densely, for instance. Other examples of PVD techniques that can be used to form the stack of layers of each of the ICEs 306 are: cathodic arc deposition, in which an electric arc discharged at the material(s) of the deposition source(s) 303 blasts away some into ionized vapor to be deposited onto the ICEs 306 being formed; evaporative deposition, in which material(s) included in the deposition source(s) 303 is(are) heated to a high vapor pressure by electrically resistive heating; pulsed laser deposition, in which a laser ablates material(s) from the deposition source(s) 303 into a vapor; or sputter deposition, in which a glow plasma discharge (usually localized around the deposition source(s) 303 by a magnet—not shown in FIGS. 3A-3B) bombards the material(s) of the source(s) 303 sputtering some away as a vapor for subsequent deposition.

A relative orientation, separation and motion between the deposition source(s) 303 and each of the M substrate supports 302 are configured to provide spatially uniform deposition rate(s) across the ICEs 306 disposed on the M substrate supports 302. As a spatial distribution of a deposition plume provided by the deposition source(s) 303 is non-uniform across a plane that contains the M substrate supports, each of the M substrate supports 302 is periodically moved (i) relative to the deposition source(s) 303 along a first direction of motion—in the plane that contains the M substrate supports—with a first period $T_1$, and (ii) relative to the first direction of motion along a second direction of motion—in the plane that contains the M substrate supports and orthogonal to the first direction of motion—with a second period $T_2$ to obtain reproducibly uniform layer deposition of the ICEs 306 within a batch.

In the examples shown in FIGS. 3A-3B, there are M=4 substrate supports 302, each of which is shaped like a disk. For instance, a substrate support 302 (also referred to as a platen) that has a diameter of 13" (or about 330 mm) can support 66 ICEs 306, each of which has a diameter of 1" (or about 25 mm) Here, the 4 substrate supports 302 are mounted on a mount 308 that is shaped like a disk, such that the centers of the 4 substrate supports 302 are respectively placed on the "12-o'clock radius", "3-o'clock radius", "6-o'clock radius", and "9-o'clock radius" of the mount 308. In this example, the mount 308 rotates relative to the deposition source(s) 303 with a first period $T_1$ around an azimuthal axis of the deposition chamber 301, and each substrate support 302 rotates relative to the mount 308 with a second period $T_2$ around the center of the substrate support 302.

Power provided to the source(s) 303, its(their) arrangement relative to each of the M substrate supports 302, etc., are used to control deposition rate(s) R of the source(s) 303. For instance, if an ICE design specifies that a $j^{th}$ layer L(j) of the N layers of an ICE is a Si layer with a target thickness t(j), a stack including the previously formed ICE layers L(1), ..., L(j−1) is exposed to a Si source—from among the deposition sources 303—for a duration $\Delta T(j)=t(j)/R_{Si}$, where the $R_{Si}$ is a deposition rate of the Si source. In accordance with the disclosed technologies, the actual complex refractive indices and thicknesses of the previously deposited layers and real-time complex refractive index and thickness of the layer being currently deposited can be determined during the entire duration T(j) or during an end portion of the duration T(j), e.g., during the second half or last 10% of the duration T(j). In this manner, deposition of the $j^{th}$ layer L(j) is stopped precisely when its deposited thickness matches its target thickness, regardless of whether the deposition rate $R_{Si}$ remains under control or drifts uncontrollably during the duration T(j). The complex refractive indices and thicknesses of the formed layers are determined in real-time from measurements of characteristics of probe-light that interacted with the formed layers taken by the measurement system 304.

The measurement system 304 includes an optical source (OS) to illuminate a witness sample 309 with probe-light, an optical detector (OD) to detect probe-light that interacted with the witness sample 309 that is periodically moved relative to the deposition source(s) 303 along with the ICEs 306 being formed in the deposition chamber 301, and a time-gated detection module 310 to process the detected light based on timing of the periodic motion of the witness sample 309. Here, the measurement system 304 is at rest relative to the deposition source(s) 303.

The formed layers of any one or more of the current instances of the ICEs 306 can be used as a witness sample by the measurement system 304 to monitor ICE layer deposition in the deposition chamber 301. Here, one or more witness samples 309 are placed at predetermined locations on at least one of the substrate supports 302 among the ICEs 306 being fabricated in the deposition chamber 301, so the witness samples 309 move with respect to the deposition source(s) 303 along a path similar to the paths of the ICEs 306. In this manner, the witness samples 309 experience similar deposition conditions in the deposition chamber 301 as the ICEs 306, so properties of the witness samples 309 (e.g., complex refractive indices and thicknesses of layers of the witness samples) are similar to the corresponding properties of the fabricated ICEs 306.

Note that for in-situ reflection measurements configured in accordance with FIG. 3A, substrates of the witness samples 309 may be treated (e.g., the substrates' back surface can be roughened or coated) to provide improved reflection with respect to untreated substrates of the other ICEs 306. In some implementations, an area of the witness samples 309 may be larger than the area of the other ICEs 306, e.g., "P" times larger. In such cases, at the end of the ICE fabrication, the witness sample 309 may be cut into (up to) P pieces to use the resulting P ICEs—along with the other ICEs 306 from the same fabrication batch—in logging tools. For example, the ICEs 306 have a diameter of 1" (about 25 mm) while each witness sample 309 placed on a substrate support 302 has a diameter of 3" (about 76 mm) Here P=9. When deposition of the N layers of the ICE design is completed, the 3"-witness sample can be cut into 9 ICEs that have a size similar to the size of the fabricated ICEs 306.

Moreover, for in-situ transmission measurements configured in accordance with FIG. 3B, any one or more of the ICEs 306 (without having differently treated substrates or different sizes) can be used as the one or more witness samples 309.

Figure 3C:
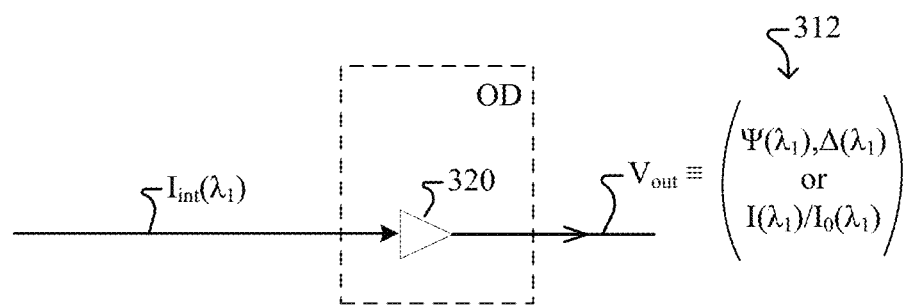
Figure 3D:
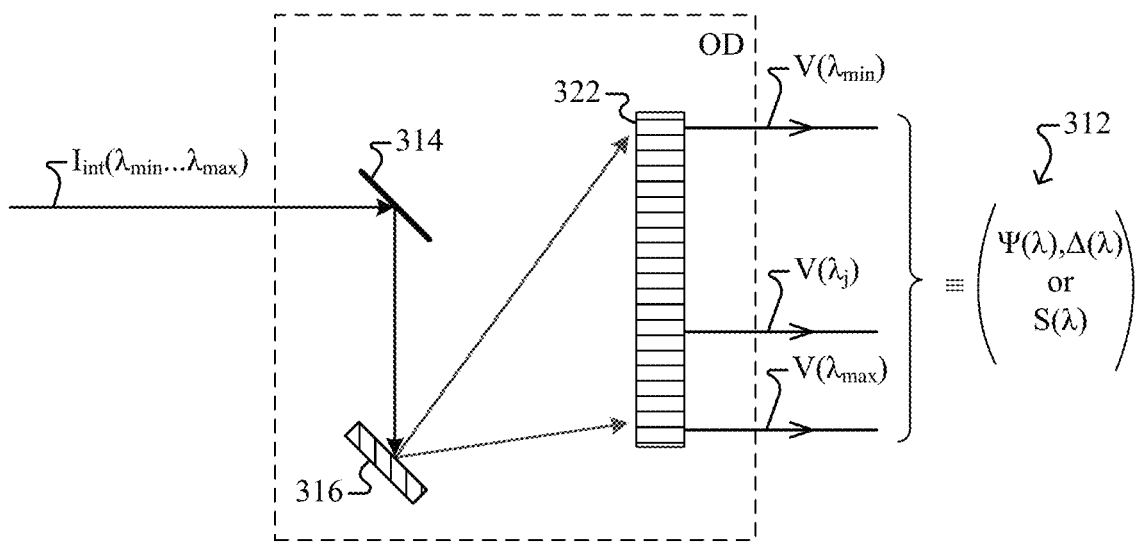

In some implementations, the measurement system 304 is an ellipsometer implemented based on configuration 304-A illustrated in FIG. 3A. In some cases, the source OS provides quasi-monochromatic polarized probe-light—with a single wavelength $\lambda_1$ or a center wavelength $\lambda_1$ within a narrow bandwidth $\Delta\lambda$, e.g., ±5 nm or less—to perform monochromatic ellipsometry. The source OS that provides polarized probe-light with the single wavelength $\lambda_1$ can be a continuous wave (CW) laser, for instance. In other cases, the source OS provides polarized probe-light over a spectral range—that can be narrower, equal to or broader than the spectral range $[\lambda_{min}, \lambda_{max}]$ of the target optical spectrum $w_t(\lambda)$—to perform spectral (or multi-wavelength) ellipsometry. The polarized probe-light is provided by the source OS through a probe port of the deposition chamber 301 associated with the ellipsometer, and elliptically-polarized light reflected from the formed layers of the witness sample 309 is collected by a detector OD through a detector port of the deposition chamber 301 associated with the ellipsometer. In the case of quasi-monochromatic ellipsometry, the detector OD of the ellipsometer includes a photodetector 320, as shown in FIG. 3C, to detect the quasi-monochromatic probe-light that reflected from the formed layers of the witness sample 309 and is now elliptically-polarized. As a compensator of the ellipsometer (not shown in FIGS. 3A, 3C) rotates the polarization of the quasi-monochromatic probe-light, a detector signal 312 output by the photodetector 320 corresponds to values of parameters $(\Psi(j;\lambda_1), \Delta(j;\lambda_1))$ of elliptically polarized light reflected from the formed layers $L(1), \ldots, L(j-1), L(j)$ of the witness sample 309. In the case of spectral ellipsometry, the detector OD of the ellipsometer includes a reflector 314, a grating 316 and a photo-sensitive array 322, as shown in FIG. 3D, to detect the multi-wavelength probe-light that reflected from the formed layers of the witness sample 309 and is now elliptically-polarized. The multi-wavelength reflected light is spread by the grating 316, such that elements ("pixels") of the photo-sensitive array 322 respectively collect contributions from wavelengths across a wavelength range, e.g. $[\lambda_{min}, \lambda_{max}]$, of the multi-wavelength probe-light. For a photo-sensitive array 322 with $N_p$ pixels, the $1^{st}$ pixel collects contributions from wavelengths of the reflected light around $\lambda_{min}, \ldots$, the $j^{th}$ pixel collects contributions from wavelengths of the reflected light around $\lambda_j, \ldots$, and the $N_p^{th}$ pixel collects contributions from wavelengths of the reflected light around $\lambda_{max}$. As a compensator of the ellipsometer (not shown in FIGS. 3A, 3C) rotates the polarization of the multi-wavelength probe-light, a detector signal 312 output by the photo-sensitive array 322 corresponds to $N_p$ values of wavelength-dependent parameters $(\Psi(j;\lambda), \Delta(j;\lambda))$ of the elliptically polarized light reflected from the formed layers $L(1), \ldots, L(j-1), L(j)$ of the witness sample 309. Note that although both detector configurations shown in FIGS. 3C-3D are capable of performing "single-shot detection" from a wavelength stand point, an acquisition time of the ellipsometry measurement is limited by the rotating compensator frequency. For example, if the latter is 20 Hz, the acquisition time is of order 1 s.

The measured quasi-monochromatic parameters $(\Psi(j;\lambda_1), \Delta(j;\lambda_1))$ or wavelength-dependent parameters $(\Psi(j;\lambda), \Delta(j;\lambda))$ of the elliptically polarized light reflected from the formed layers $L(1), \ldots, L(j-1), L(j)$ of the witness sample 309 are used by the computer system 305 to determine the (real and imaginary components of) complex refractive indices and thicknesses of each of the formed layers in the stack: $n^{*}{}_{Si}, n^{*}{}_{SiO2}, t'(1), t'(2), \ldots, t'(j-1), t'(j)$. The computer system 305 makes this determination by solving Maxwell's equations for propagating the interacted probe-light through the formed layers in the stack.

In other implementations, the measurement system 304 is an optical monitor that can be implemented in a reflectance configuration 304-A illustrated in FIG. 3A or in a transmittance configuration 304-B illustrated in FIG. 3B. The optical monitor is used to measure, e.g., during the forming of the $j^{th}$ layer of the ICEs 306, change of intensity $I(j;\lambda_1)$ of a quasi-monochromatic probe-light—provided by source OS with a single wavelength $\lambda_1$ or a center wavelength $\lambda_1$ within a narrow bandwidth $\Delta\lambda$, e.g., ±5 nm or less—due to interaction with (e.g., reflection from or transmission through) the stack with j layers of a witness sample 309 that is being formed in the deposition chamber 301. In this case, the source OS provides the quasi-monochromatic probe-light through a probe port of the deposition chamber 301 associated with the optical monitor, and a detector OD collects, through a detector port of the deposition chamber 301 associated with the optical monitor, the interacted light with an intensity $I(j;\lambda_1)$. FIG. 3C shows an example of a detector OD—used by the optical monitor—including a photodetector 320. A detector signal 312 output by the photodetector 320 corresponds to a value of the change of intensity $I(j;\lambda_1)$ of the quasi-monochromatic probe-light due to interaction with the witness sample 309. Note that the optical monitor described herein in connection with FIGS. 3A, 3B and 3C is configured to perform "single-shot detection", such that an acquisition time of the optical monitor is bound only by response time of the photodetector 320.

The measured change of intensity $I(j;\lambda_1)$ can be used by the computer system 305 to determine the complex refractive indices and thicknesses of each of the formed layers in the stack: $n^{*}{}_{Si}, n^{*}{}_{SiO2}, t'(1), t'(2), \ldots, t'(j-1), t'(j)$. The computer system 305 makes this determination by solving Maxwell's equations for propagating the interacted probe-light through the formed layers in the stack.

In some other implementations, the measurement system 304 is a spectrometer that can be implemented in a transmittance configuration 304-B illustrated in FIG. 3B. The spectrometer is used to measure, e.g., during the forming of the $j^{th}$ layer of the ICEs 306, a spectrum $S(j;\lambda)$ of probe-light—provided by source OS over a broad wavelength range from, $\lambda_{min}$ to $\lambda_{max}$—after transmission through the stack with j layers of a witness sample 309 that is being formed in the deposition chamber 301. In this case, the broad wavelength range source OS provides probe-light through a probe port of the deposition chamber 301 associated with the spectrometer, and a detector OD collects the transmitted light through a detector port of the deposition chamber 301 associated with the spectrometer. FIG. 3D shows an example of a detector OD—used by the spectrometer—including a reflector 314, a grating 316 and a photo-sensitive array 322. The transmitted light with the wavelength range $[\lambda_{min}, \lambda_{max}]$ is spread by the grating 316, such that elements ("pixels") of the photo-sensitive array 322 respectively collect contributions from wavelengths across a wavelength range $[\lambda_{min}, \lambda_{max}]$ of the probe-light. For a photo-sensitive array 322 with $N_p$ pixels, the $1^{st}$ pixel collects contributions from wavelengths of the reflected light around $\lambda_{min}, \ldots$, the $j^{th}$ pixel collects contributions from wavelengths of the reflected light around $\lambda_j, \ldots$, and the $N_p^{th}$ pixel collects contributions from wavelengths of the reflected light around $\lambda_{max}$. In this manner, a detector signal 312 output by the photo-sensitive array 322 corresponds to the spectrum $S(j;\lambda)$ of the probe-light transmitted through the witness sample 309. Referring again to FIG. 3B, a spectral response of the detector OD over the wavelength range [$\lambda_{min}, \lambda_{max}$] of the probe-light is accounted for by acquiring a reference spectrum S($\lambda$) (also referred to as a baseline spectrum). Here, the detector OD collects the probe-light after it passes through one or more apertures 325 of the substrate support 302 and/or the mount 308 without passing through the stack with j layers of a witness sample 309 and without being blocked by the substrate support 302 and/or the mount 308. A detector signal 312R output by the detector OD corresponds to the reference spectrum S($\lambda$). The reference spectrum S($\lambda$) is subtracted by the computer system 305 from the spectrum of the probe-light transmitted through the witness sample 309 to obtain what is referred to as the measured spectrum S(j;$\lambda$). Note that the spectrometer described herein in connection with FIGS. 3B and 3D is configured to acquire "single-shot spectra", such that an acquisition time of the spectrometer is bound only by response time of the photo-sensitive array 322.

The measured spectrum S(j;$\lambda$), over the wavelength range from $\lambda_{min}$ to $\lambda_{max}$ can be used by the computer system 305 to determine the complex refractive indices and thicknesses of each of the formed layers in the stack: $n^{*'}_{Si}$, $n^{*'}_{SiO2}$, t'(1), t'(2), ..., t'(j−1), t'(j). The computer system 305 makes this determination by solving Maxwell's equations for propagating the interacted probe-light through the formed layers in the stack.

In the examples illustrated in FIGS. 3A and 3B, the measurement system 304 (e.g., the ellipsometer, optical monitor or spectrometer) is at rest relative to the deposition source(s) 303. As the witness samples 309 move periodically with respect to the deposition source(s) 303, e.g., rotate with the substrate supports 302 relative to the mount 308 with the period $T_2$, which in turn rotates relative the deposition source(s) 303 with the period $T_1$, the probe-light provided by the measurement system 304 illuminates the witness samples 309 only during portions of a period of their periodic motion. The time-gated detection module 310 uses the timing of the periodic motion of the witness samples 309 relative to the deposition source(s) 303 to gate (or limit) the detector signal 312 (corresponding to, e.g., probe-light polarization modified by reflection off the witness samples 309 for ellipsometry; change of intensity of probe-light interacted with the witness samples 309 for optical monitoring; or probe-light spectrum modified by transmission through the witness samples 309 for spectroscopy) to the portions of the period of the periodic motion of the witness samples 309 relative to the deposition source(s) 303 when the moving witness samples 309 are illuminated by the probe-light. As described in detail below, the timing of the periodic motion of the witness samples 309 relative to the deposition source(s) 303 used by the time-gated detection module 310 to gate (or limit) the detector signal 312 is a function of at least the following parameters: a number K of witness samples 309 per substrate support 302, a number M of substrate supports 302, a period $T_2$ with which each substrate support 302 moves relative to the mount 308, a period $T_1$ with which the mount 308 moves relative to the deposition source(s) 303, a size of the witness samples, a radius of the substrate supports 302 where the witness sample is supported, and a radius of the mount 308 where the substrate support 302 is mounted. Numerous examples of such timings used by the time-gated detection module 310 are described below.

Once the detector signal 312 is time-gated by the time-gated detection module 310 in accordance with the timing of the periodic motion of the witness samples 309 relative to the deposition source(s) 303, the time-gated detector signal is processed by the time-gated detection module 310 to output a measurement signal 315. The processing of the time-gated detector signal includes one or more of averaging over a predetermined period of time, performing a running average, performing a sample-and-hold, and the like. For example, the detector signal 312 time-gated based on periodic motion of a single witness sample 309 is averaged over a number of periods of the periodic motion, for instance over 5 periods. As another example, the detector signal 312 time-gated based on periodic motion of a number K≥2 of witness samples 309 is averaged over the K witness samples during a single period of the periodic motion.

In some cases, the detector signal 312 collected when the probe-light does not illuminate the witness sample(s) 309 is discarded. In other cases, the detector signal 312 collected when the probe-light does not illuminate the witness sample(s) 309 is isolated and processed by the time-gated detection module 310 as either a reference signal 312R (also referred to as a baseline signal) or a background signal 312B, as described below.

One complication with measurements of near-infrared (NIR) and mid-infrared (MIR) transmission spectra (as shown in the transmittance configuration of the measurement system 304-B in FIG. 3B) is that stray light emanating from any warm (e.g., a blackbody) surface inside the deposition chamber 301 enters the spectrometer's detector OD and interferes with the measurement. To avoid these complications, a transmission spectrum of the formed layers is collected from and averaged over several (or all) of the witness samples 309 that are illuminated by the probe-light during a period of the periodic motion of the witness samples 309. In this manner, as the witness samples 309 move periodically, the probe of the spectrometer alternately interacts with a witness sample 309, and then the probe is blocked by the physical substrate support 302 and/or mount 308 at least for a portion of time before the next witness sample 309 enters the probe. A spectrum 312 corresponding to the formed layers of the witness samples 309 is collected by the detector OD when the probe-light illuminates any of the witness samples 309, and a background spectrum 312B is collected by the detector OD when the probe-light illuminates adjacent to (in between) the substrate supports 302 and it is physically blocked by the mount 308 from reaching the detector OD. In addition, one or more reference spectra 312R (also referred to as a baseline spectra) are collected during the period of the periodic motion of the witness samples 309 when the probe passes through each of the apertures 325 of the substrate support 302 and/or the mount 308 without passing through a witness sample 309 and without being blocked by the substrate support 302 and/or the mount 308. In this manner, the computer system 305 subtracts the reference spectrum 312R from the spectrum 312 associated with the deposited layers to compensate in real time for temporal and/or spectral variations of the probe-light, and subtracts from (or zeros out) the spectrum 312 much of spectral contributions of the stray light. The foregoing allows for real time baseline and background corrections and thus enables recording of an accurate spectrum 312 associated with the deposited layers of the ICEs 306.

The computer system 305 includes one or more hardware processors and memory. The memory encodes instructions that, when executed by the one or more hardware processors, cause the fabrication system 300 to perform processes for fabricating the ICEs 306. Examples of such processes are described below in connection with FIGS. 9A-9B. The computer system 305 also includes or is communicatively coupled with a storage system that stores one or more ICE designs 307, aspects of the deposition capability, and other information. The stored ICE designs can be organized in design libraries by a variety of criteria, such as ICE designs used to fabricate ICEs for determining values of a particular characteristic over many substances (e.g. the GOR ratio in crude oil, refined hydrocarbons, mud, etc.), or ICE designs used to fabricate ICEs for determining values of many properties of a given substance (e.g., viscosity, GOR, density, etc., of crude oil.) In this manner, upon receipt of an instruction to fabricate an ICE for measuring a given characteristic of a substance, the computer system 305 accesses such a design library and retrieves an appropriate ICE design 307 that is associated with the given characteristic of the substance.

The retrieved ICE design 307 includes specification of a substrate and a total number N of layers to be formed in the deposition chamber 301 on the substrate; specification of a complex refractive index $n^*_S$ of a material of the substrate, a high complex refractive index $n^*_H$ and a low complex refractive index $n^*_L$ of materials (e.g., Si and SiO$_2$) to form the N layers with adjacent layers having different complex refractive indices; and specification of target thicknesses $\{t_S, t(k), k=1-N\}$ of the substrate and the N layers Implicitly or explicitly, the ICE design 307 also can include specification of a target optical spectrum $w_t(\lambda)$ associated with the given characteristic; and specification of a target SEC$_t$ representing expected performance of an ICE associated with the retrieved ICE design 307. The foregoing items of the retrieved ICE design 307 were determined, prior to fabricating the ICEs 306, in accordance with the ICE design process 200 described above in connection with FIG. 2. In some implementations, the ICE design 307 can include indication of maximum allowed SEC$_{max}$ caused by fabrication errors. Figures of merit other than the target SEC$_t$ can be included in the retrieved ICE design 307, e.g., SEP, the ICE sensitivity, etc.

The complex refractive indices and target thicknesses $\{t(k), k=1-N\}$ of the N layers, as specified by the retrieved ICE design 307, are used by the computer system 305, in conjunction with aspects of deposition capability of the ICE fab system 300, to control deposition rate(s) of the deposition source(s) 303 and respective deposition times for forming layers of a plurality of ICEs. Here, the layers of the ICEs being formed are supported on M substrate supports 302 each of which is periodically moved relative to a mount 308 with a period T$_2$, the latter being periodically moved relative to the deposition source(s) 303 with a period T$_1$ during the forming of the layers. While forming the ICE layers, the computer system 305 instructs the measurement system 304 associated with the ICE fabrication system 300 to monitor in real-time characteristics of formed layers of the ICEs 306. The characteristics are monitored using a timing of the foregoing periodic motion in the following manner: The computer system 305 instructs the measurement system 304 to illuminate with probe-light at least one witness sample supported on the support(s) 302, and detect light interacted with the witness sample using time-gated detection. The time-gated detection is timed, at least in part, in accordance with the timing of the periodic motion of the witness sample relative to the deposition source(s) 303. If necessary, the computer system 305 then instructs the ICE fabrication system 300 to adjust the forming of a current layer and layers remaining to be formed based on the monitored characteristics of the formed layers of the ICEs 306.

EXAMPLE 1

Figure 4A:
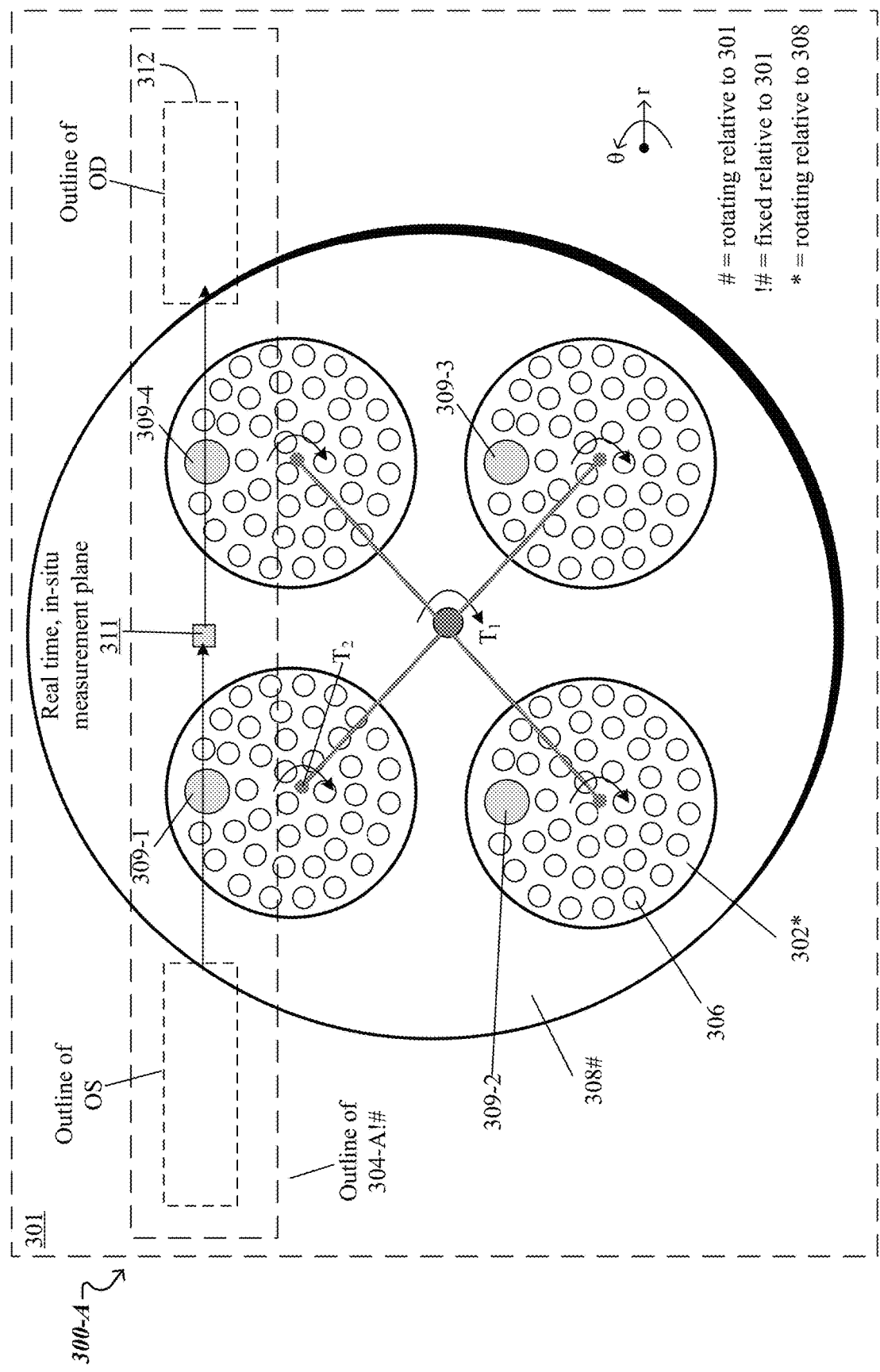
FIGS. 4A-4G show aspects of the system described in FIGS. 3A-3D when measurements are performed using multiple witness samples distributed among the ICEs being fabricated.
Figure 4B:
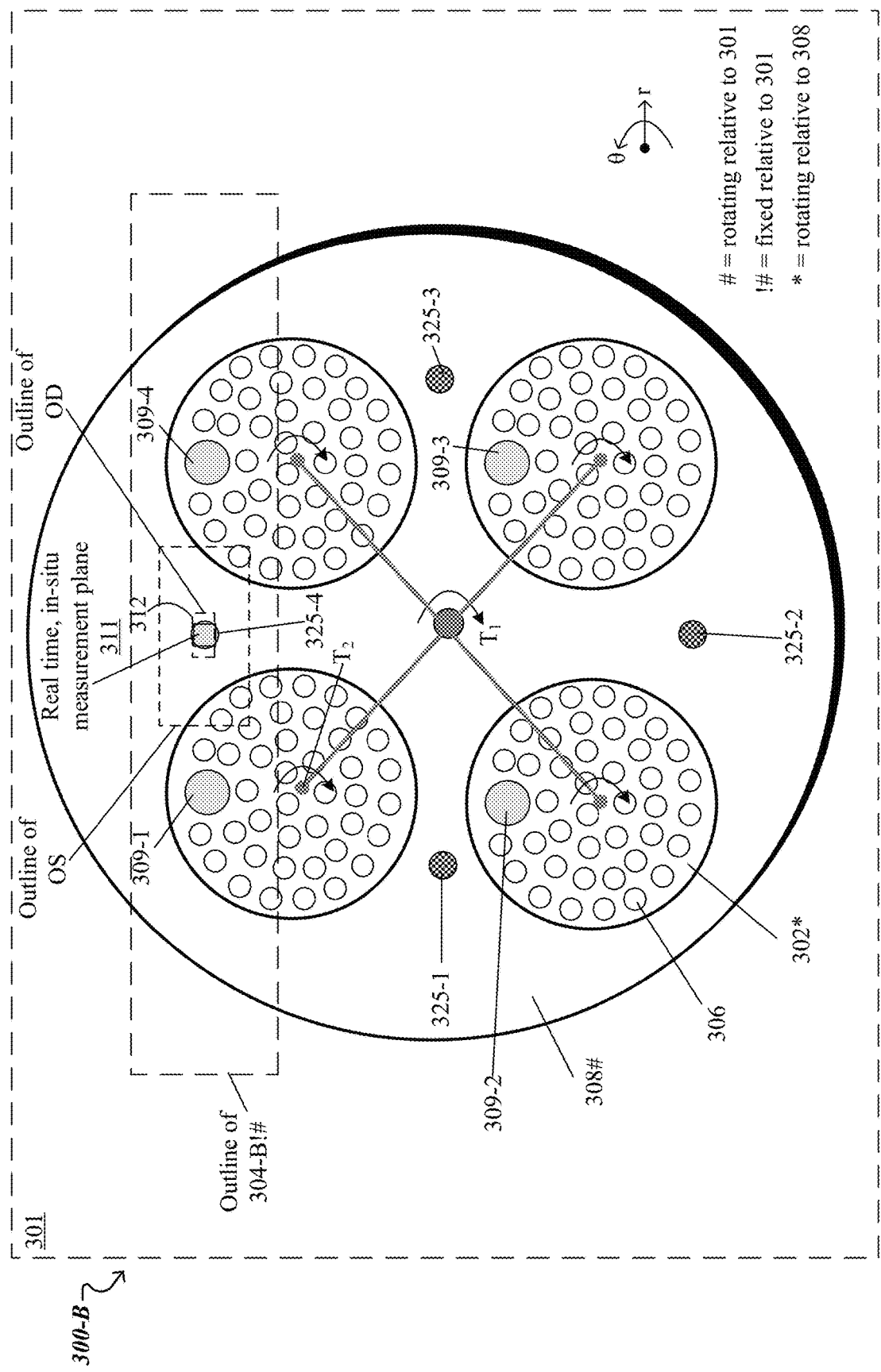

FIGS. 4A and 4B show a top view of the ICE fabrication system 300 described above in connection with FIGS. 3A and 3B. During ICE fabrication, multiple ICEs 306 are supported by four substrate supports 302, which in turn are mounted on a mount 308. The mount 308 rotates relative to the deposition chamber 301 with a period T$_1$ about an azimuthal axis that passes through the center of the mount 308, and the substrate supports 302 rotate relative to the mount 308 with a period T$_2$ about respective axes that pass through each of their centers. Here, witness samples 309 are distributed across the four substrate supports 302, such that a single witness sample 309 is placed off-centered on each substrate support 302. For example, a diameter of each substrate support 302 is 13" (or about 330 mm) and its center is placed a distance of 8" (or about 200 mm) from the center of the mount 308. If an ICE diameter is 1" (or about 25 mm), up to 66 ICEs 306 can be placed on each substrate support 302 in the configurations illustrated in FIG. 4A or 4B. The diameter of each witness sample (e.g., 3" or about 76 mm) can be larger than the ICE diameter, for example when the measurement system 304 is implemented in the reflectance configuration as shown in FIGS. 3A and 4A.

FIGS. 4A and 4B also show an outline of the measurement system 304 encompassing outlines of the source OS and the detector OD. Here the measurement system 304 is at rest relative to the deposition chamber 301. A plane 311 where the real-time, in-situ measurements are taken is coplanar with a plane of the periodic motion of the witness samples 309. An area of the measurement plane 311 corresponds to a cross-section of probe-light beam—provided by the source OS—projected on the plane of the periodic motion of the witness samples 309. In FIG. 4A, showing a reflectance configuration of the measurement system 304, both the source OS and the detector OD are disposed on the same side of the measurement plane 311. In FIG. 4B, showing a transmittance configuration of the measurement system 304, the source OS and the detector OD are disposed on opposing sides of the measurement plane 311. If the measurement system 304 shown in FIG. 4B is a spectrometer, then the mount 308 includes apertures 325-1, 325-2, 325-3 and 325-4 disposed between the substrate supports 302 at the same distance from the center axis of the mount 308 as the measurement plane 311. When each of the apertures traverses the measurement plane 311, the probe-light beam passes through the mount 308 and reaches the detector OD where a reference spectrum 312R is being collected.

The four witness samples 309 are illuminated by the probe-light provided by the source OS during periodic bursts of time corresponding to the periodic motion of the four witness samples 309 relative to the measurement plane 311. These periodic bursts of time are used by the time-gated detection module 310 to generate a time-gate for limiting (gating) the detector signal 312 to contributions of the probe-light that interacted with the witness samples 309. In this manner, unwanted contributions to the detector signal 312 can be excluded.

Figure 4C:
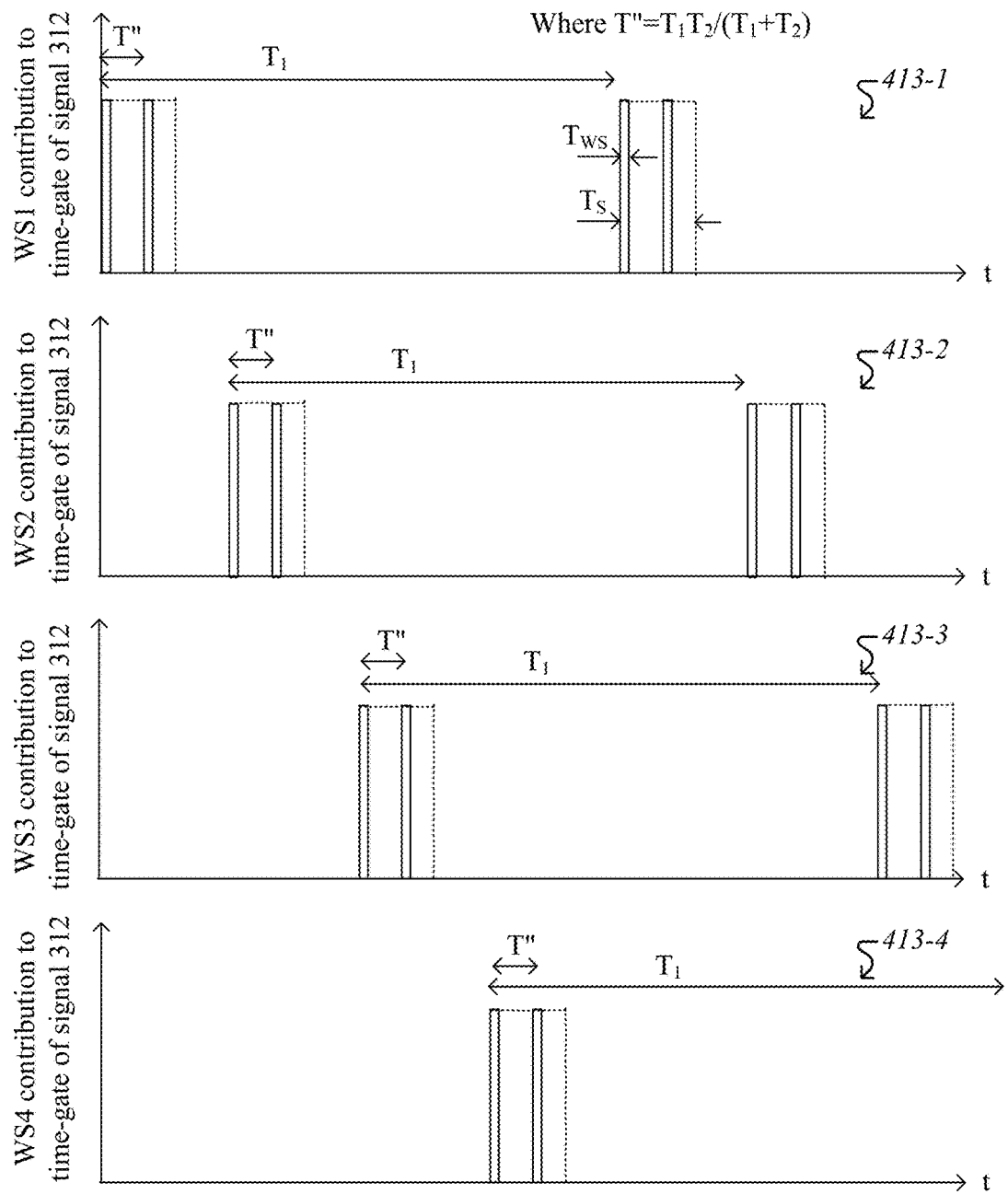

FIG. 4C shows contributions to the time-gate of signal 312 from each of the four witness samples 309. Graph 413-1 illustrates periodic bursts of time when a witness sample 309-1 is illuminated by the probe-light provided by the source OS, or equivalently, the witness sample 309-1 passes through the measurement plane 311. As explained in detail below, a burst-to-burst period is T$_1$ (the period of the mount 308's motion) and a burst width is $T_S$. Each of the bursts includes periodic gates (pulses) with a gate-to-gate period V and a gate width $T_{WS}$.

The substrate support 302 supporting the witness sample 309-1 passes through the measurement plane 311 (or, equivalently, the probe-light illuminates the substrate support 302 supporting the witness sample 309-1) for a duration $T_S$ with a period $T_1$. The duration $T_S$ is directly proportional to the size of the substrate support 302 and during the period $T_1$, and $T_S$ is inversely proportional to a radius of the mount 308 where the center of the substrate support 302 is placed. While the probe-light illuminates the substrate support 302 supporting the witness sample 309-1, the witness sample 309-1 periodically passes through the measurement plane 311 (or, equivalently, the witness sample 309-1 is illuminated by the probe-light) for a duration $T_{WS}$ during the period T". The duration $T_{WS}$ is directly proportional to a size of the witness sample 309-1, the period $T_2$, and the period $T_1$; and is inversely proportional to a radius of the substrate support 302 where the witness sample 309-1 is supported, and the radius of the mount 308 where the center of the substrate support 302 is placed. The period T" (referred to as the illumination period) is related to the periods $T_1$ and $T_2$ in the following manner:

$$T''=T_1T_2/(T_1+T_2) \quad (1)$$

In a limiting case, if the substrate support 302 is not moving with respect to the mount 308, $T_2 \to \infty$, then $T'' \approx T_1$. In another limiting case, if the mount 308 is not moving with respect to the measurement plane 311, $T_1 \infty$, then $T'' \approx T_2$. In general, the period T" is shorter than the shorter of the periods $T_1$ and $T_2$. In this manner, the witness sample 309-1 is illuminated a number of times ($T_S/T''$) by the probe-light during the duration $T_S$ when the probe-light illuminates the substrate support 302 supporting the witness sample 309-1. Once the probe-light falls off the substrate support 302 supporting the witness sample 309-1, it will take a duration $T_1-T_S$ until the light will illuminate this substrate support 302 again.

Graphs 413-2, 413-3 and 413-4 illustrate periodic bursts of time when witness samples 309-2, 309-3 and 309-4, respectively are illuminated by the probe-light provided by the source OS, or equivalently, when these witness samples respectively pass through the measurement plane 311. The periodic bursts corresponding to the witness sample 309-2 are the same as the periodic bursts corresponding to the witness sample 309-1, except the former bursts lag the latter bursts by a quarter of the period $T_1$. The periodic bursts corresponding to the witness sample 309-3 are the same as the periodic bursts corresponding to the witness sample 309-1, except the former bursts lag the latter bursts by a half of the period $T_1$. The periodic bursts corresponding to the witness sample 309-4 are the same as the periodic bursts corresponding to the witness sample 309-1, except the former bursts lag the latter bursts by three quarters of the period $T_1$.

Figure 4D:
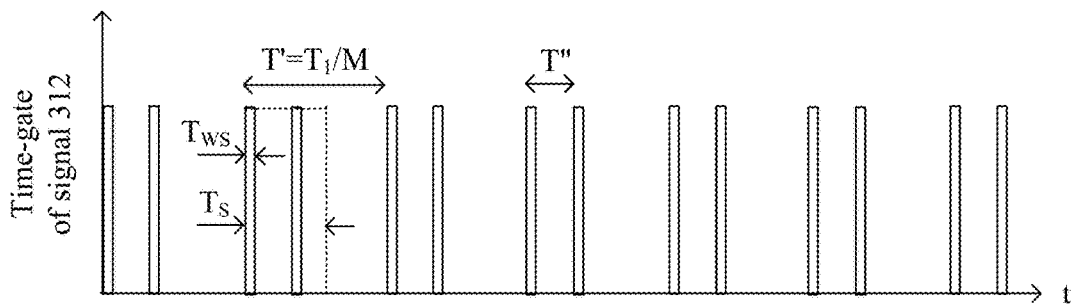

FIG. 4D shows a time-gate generated by the time-gated detection module 310 to limit (or gate) the detector signal 312 to the time when the four witness samples 309 are illuminated by the probe-light provided by the source OS. Time bursts of the time-gate shown in FIG. 4D are an aggregate of the time bursts—illustrated in Graphs 413-1, 413-2, 413-3 and 413-4—during which the witness samples 309-1, 309-2, 309-3 and 309-4 pass through the measurement plane 311. In this manner, the time-gated detection module 310 generates a time-gate that includes periodic bursts with a burst-to-burst period T" equal to the first period $T_1$ divided by M (the number of substrate supports 302, each of which supporting a single witness sample 309), $T'=T_1/M$, and a burst width $T_S$ that is up to (no longer than) a time that the probe-light illuminates each of the substrate supports 302. Moreover, each of the bursts includes periodic gates with a gate-to-gate period equal to an illumination period T" and a gate width $T_{WS}$ that is up to (no longer than) a time that the probe-light illuminates each of the witness samples 309. Here, the illumination period T" is a function of the first and second periods $T_1$ and $T_2$, in accordance with Equation (1), and represents a period with which the witness samples 309 pass through the measurement plane 311 (or, equivalently, the witness samples 309 are illuminated by the probe-light provided by the source OS.)

As discussed above, at least some of the in-situ measurements performed by the measurement system 304, e.g., IR spectroscopy, benefit from correcting the detector signal 312—obtained by collecting the probe-light that interacted with the witness samples 309—for baseline and background contributions.

Figure 4E:
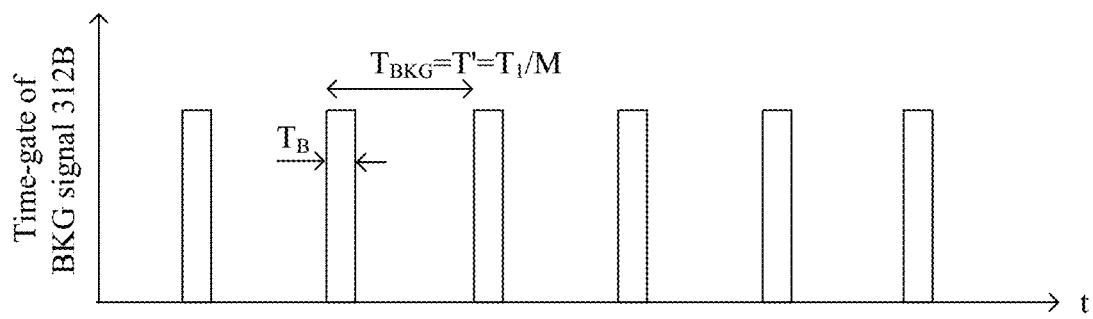

A background signal 312B corresponds to the detector signal 312 obtained during the time when the probe-light interacts with the mount 308 (e.g., it scatters off the mount 308 in the reflectance configurations of the measurement system 304 shown in FIGS. 3A, 4A, or it is blocked by the mount 308 in the transmittance configurations of the measurement system 304 shown in FIGS. 3B, 4B.) As such, the time-gated detection module 310 generates a background time-gate for limiting (gating) the detector signal 312 to contributions of stray light. FIG. 4E shows an example of such a background time-gate generated by the time-gated detection module 310. The time-gate that isolates (gates) the background signal 312B from the detector signal 312 includes periodic gates with a gate-to-gate period $T_{BKG}$ equal to the first period $T_1$ divided by M (the number of substrate supports 302, each of which supporting a single witness sample 309), $T_{BKG}=T'=T_1/M$, and a gate width $T_B$ that is up to (no longer than) a time that the probe-light illuminates the mount 308 between adjacent substrate supports 302.

Figure 4F:
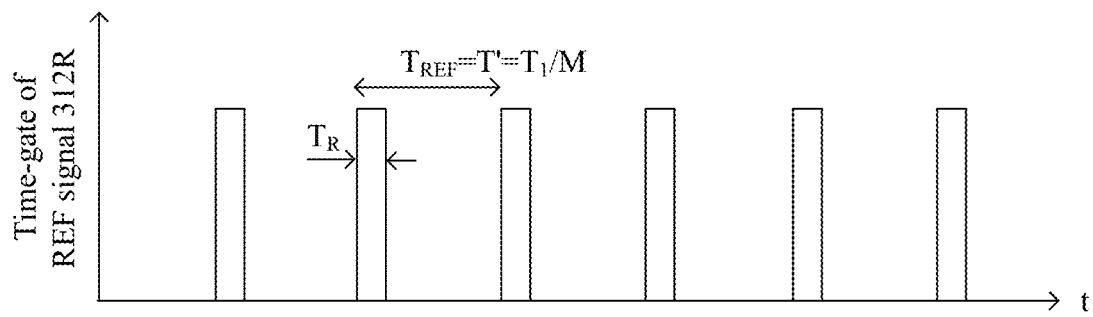

A reference signal 312R corresponds to the detector signal 312 obtained during the time when the probe-light passes through apertures 325-1, 325-2, 325-3 and 325-4 and reaches the detector OD without being transmitted through the witness samples 309. As such, the time-gated detection module 310 generates a reference time-gate for limiting (gating) the detector signal 312 to contributions of non-interacted probe-light. FIG. 4F shows an example of such a reference time-gate generated by the time-gated detection module 310. The time-gate that isolates (gates) the reference signal 312R from the detector signal 312 includes periodic gates with a gate-to-gate period $T_{REF}$ equal to the first period $T_1$ divided by M (the number of substrate supports 302, each of which supporting a single witness sample 309), $T_{REF}=T'=T_1/M$, and a gate width $T_R$ that is up to (no longer than) a time that the probe-light illuminates each of the apertures 325-1, 325-2, 325-3 and 325-4. In the examples illustrated in FIGS. 4E and 4F, the reference time-gate is either delayed or advanced in time relative to the background time-gate.

Figure 4G:
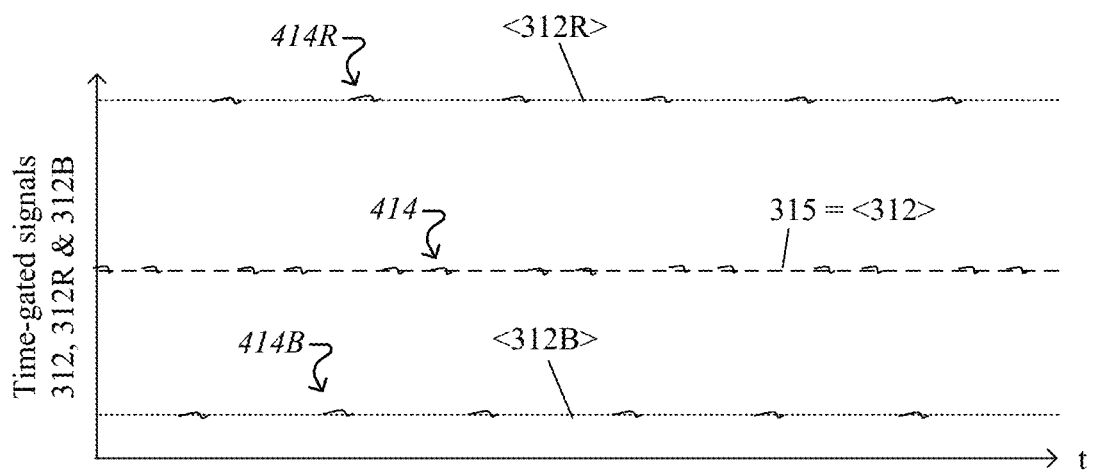

FIG. 4G shows a time-gated detector signal 414. The time-gated detector signal 414 is the detector signal 312 time-gated by the time-gated detection module 310 with the time-gate shown in FIG. 4D and corresponds to contributions of the probe-light that interacted with the witness samples 309. Note that the gate width $T_{WS}$—which is no longer than the time during which the probe-light illuminates each witness sample—is further constrained by a measurement time of the measurement system 304.

In some cases, a measurement of characteristics of the probe-light interacted with the witness samples 309 must be started, performed and completed on each witness sample. Here, the gate width $T_{WS}$ has to be larger than the acquisition time of the measurement system 304. In such cases, to increase the time during which the probe-light illuminates each witness sample, a size of the witness sample and/or a period $T_2$ of its periodic motion relative the mount 308 are increased. Such a case is described in detail below in Example 2. The time during which the probe-light illuminates each witness sample also increases when the radius of the mount 308 where the substrate holders 302 are placed is reduced. In these cases, a measurement signal 315 output by the time-gated detection module 310 can be the time-gated detector signal 414 itself or an average of the time-gated detector signal 414 over multiple of the witness samples 309 (represented in dashed-line.)

In other cases when the acquisition time of the measurement system 304 is longer than the gate width $T_{WS}$, the measurement of characteristics of the probe-light interacted with the witness samples 309 includes contributions from sequential illuminations of a single witness sample (e.g., within one burst of the time-gate shown in FIG. 4D) and/or illuminations of multiple witness samples (e.g., from sequential bursts of the time-gate shown in FIG. 4D). In such cases, the measurement signal 315 output by the time-gated detection module 310 is the average of the time-gated detector signal 414.

If the measurement system 304-B is a spectrometer, the time-gated detection module 310 also time-gates the detector signal 312 with the background time-gate shown in FIG. 4E to obtain a time-gated background detector signal 414B. Further, the time-gated detection module 310 time-gates the detector signal 312 with the reference time-gate shown in FIG. 4F to obtain a time-gated reference detector signal 414R. The time-gated background detector signal 414B and the time-gated reference detector signal 414R also are shown in FIG. 4G. The former corresponds to contributions of stray light detected when the probe-light interacts with the mount 308, and latter corresponds to the probe-light that passes through the apertures 325 without being transmitted through the witness samples 309. The time-gated detection module 310 averages the time-gated background detector signal 414B and uses the background average (represented in dotted-line) to background-correct the time-gated detector signal 414 or its average. In this manner, the time-gated detection module 310 outputs a background-corrected signal 315 as the measurement signal. Additionally, the time-gated detection module 310 averages the time-gated reference detector signal 414R and uses the reference average (represented in dotted-line) to reference the time-gated detector signal 414 or its average. In this manner, the time-gated detection module 310 outputs a referenced signal 315 as the measurement signal.

EXAMPLE 2

Figure 5A:
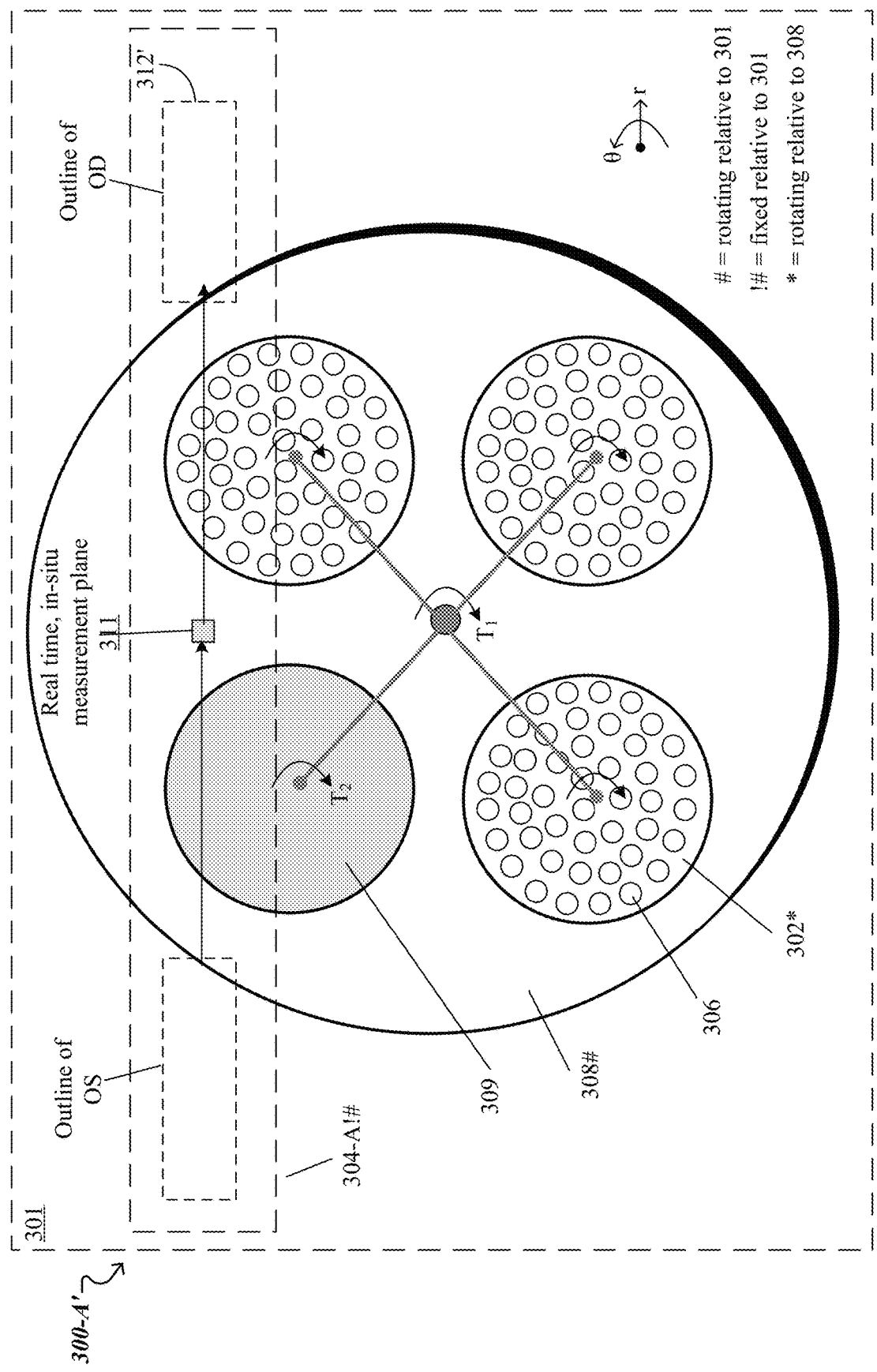
FIGS. 5A-5F show aspects of the system described in FIGS. 3A-3D when measurements are performed using a single witness sample placed among the ICEs being fabricated.
Figure 5B:
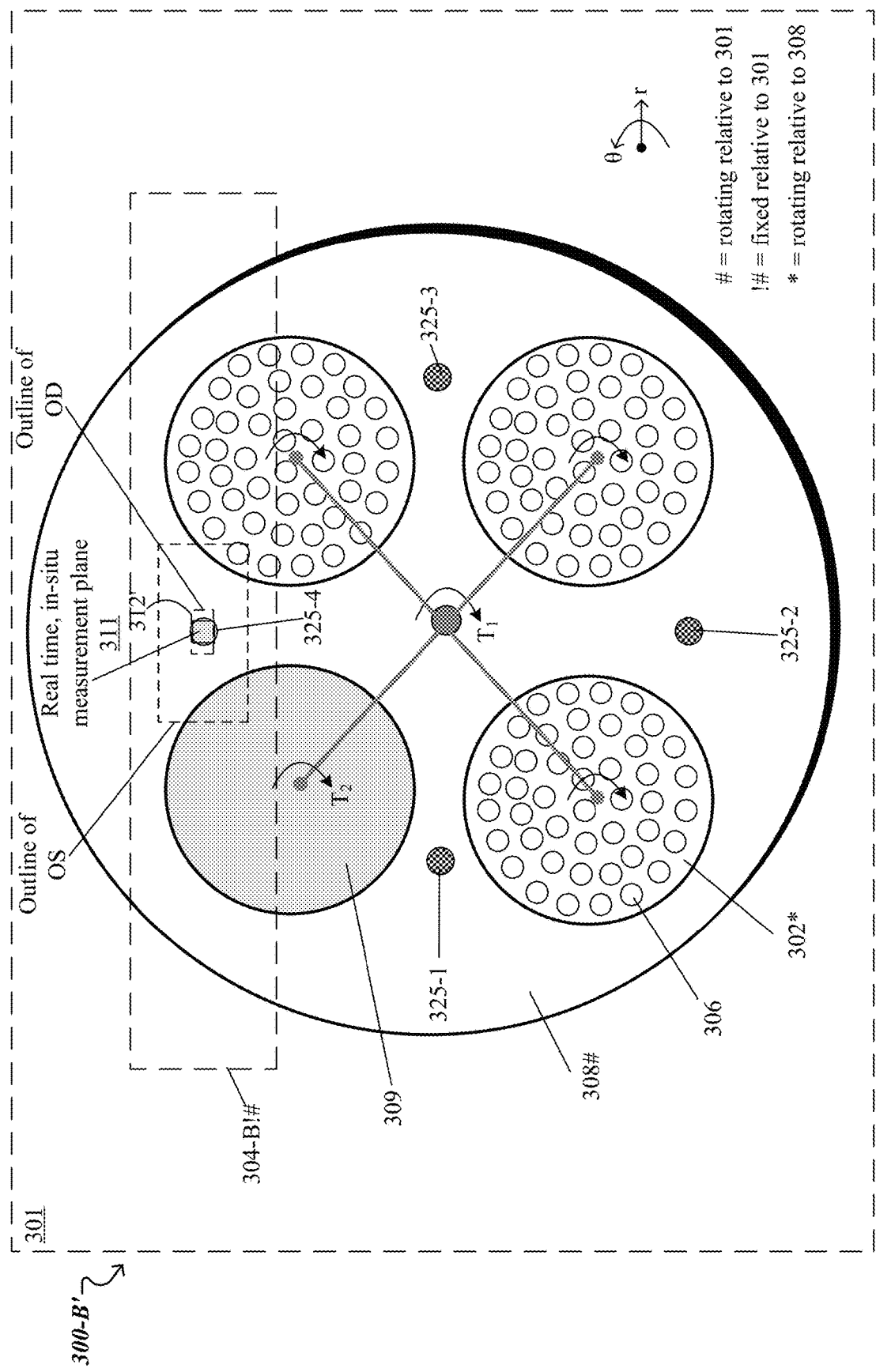

FIGS. 5A and 5B show a top view of the ICE fabrication system 300 described above in connection with FIGS. 4A and 4B. During ICE fabrication, multiple ICEs 306 are supported by three substrate supports 302, which in turn are mounted on a mount 308. The mount 308 rotates relative to the deposition chamber 301 with a period $T_1$ about an azimuthal axis that passes through the center of the mount 308, and the substrate supports 302 rotate relative to the mount 308 with a period $T_2$ about respective axes that pass through each of their centers. Here, a fourth substrate support 302 supports a single witness sample 309 that is centered on the substrate supports 302 and covers most of its area. For example, a diameter of the witness sample 309 is 13" (or about 330 mm). The fourth substrate support can rotate relative to the mount 308 with a period $T_2$ about an axis that passes through its center. In this example, the measurement system 304 is at rest relative to the deposition chamber 301 and the measurement plane 311 is coplanar with a plane of the periodic motion of the single witness sample 309.

Here, the single witness sample 309 is illuminated by the probe-light provided by the source OS in accordance with timing of the periodic motion with the first period $T_1$ of the single witness sample 309 relative to the measurement plane 311. This timing is used by the time-gated detection module 310 to generate a time-gate for limiting (gating) the detector signal 312' to contributions of the probe-light that interacted with the single witness sample 309. In this manner, unwanted contributions to the detector signal 312' can be excluded.

Figure 5C:
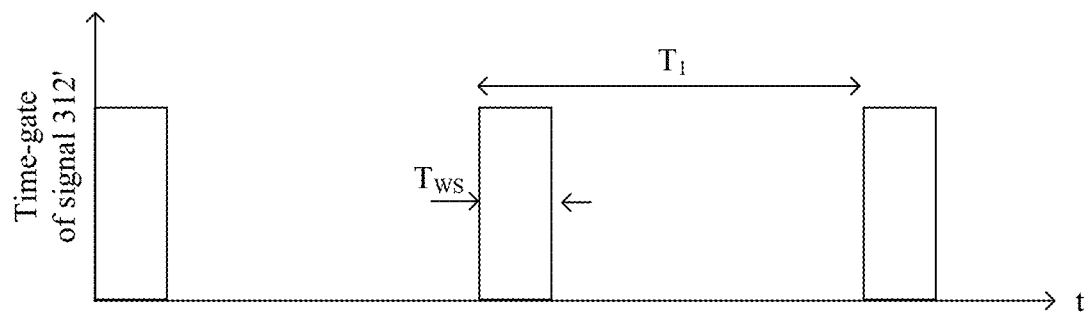

FIG. 5C shows a time-gate generated by the time-gated detection module 310 to limit (or gate) the detector signal 312' to the time when the single witness sample 309 is illuminated by the probe-light provided by the source OS. The generated time-gate includes periodic gates with a gate-to-gate period equal to the first period $T_1$ and a gate width $T_{WS}$. Note that in this case, the gate width $T_{WS}$ is shorter than the time during which the probe-light illuminates the single witness sample, but longer than the measurement time of the measurement system 304.

Figure 5D:
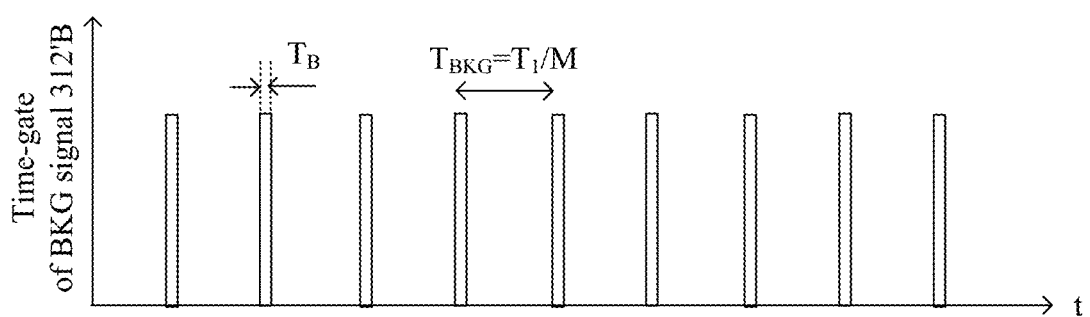

FIG. 5D shows an example of a background time-gate generated by the time-gated detection module 310 to background correct a measurement signal 315'. The background time-gate that isolates (gates) the background signal 312'B from the detector signal 312' includes periodic gates with a gate-to-gate period $T_{BKG}$ equal to the first period $T_1$ divided by M (the total number of substrate supports 302, one of which supporting the single witness sample 309), $T_{BKG}=T_1/M$, and a gate width $T_B$ that is up to (no longer than) a time that the probe-light illuminates the mount 308 between adjacent substrate supports 302.

Figure 5E:
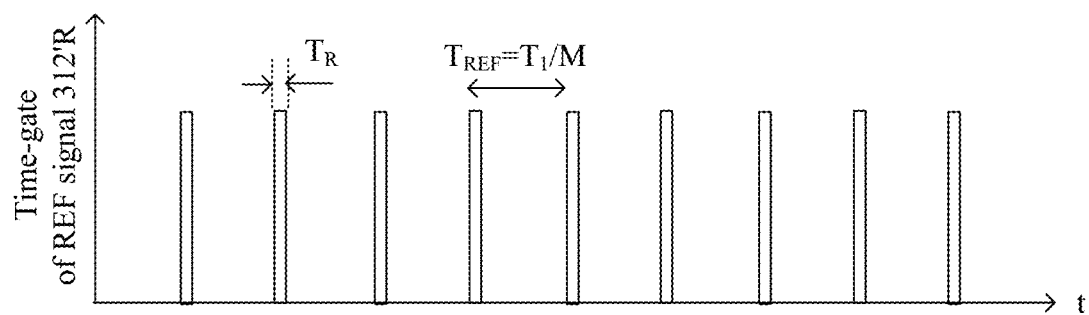

FIG. 5E shows an example of a reference time-gate generated by the time-gated detection module 310 to reference a measurement signal 315'. The reference time-gate that isolates (gates) the reference signal 312'R from the detector signal 312' includes periodic gates with a gate-to-gate period $T_{REF}$ equal to the first period $T_1$ divided by M (the total number of substrate supports 302, one of which supporting the single witness sample 309), $T_{REF}=T_1/M$, and a gate width $T_R$ that is up to (no longer than) a time that the probe-light illuminates each of the apertures 325-1, 325-2, 325-3 and 325-4.

Figure 5F:
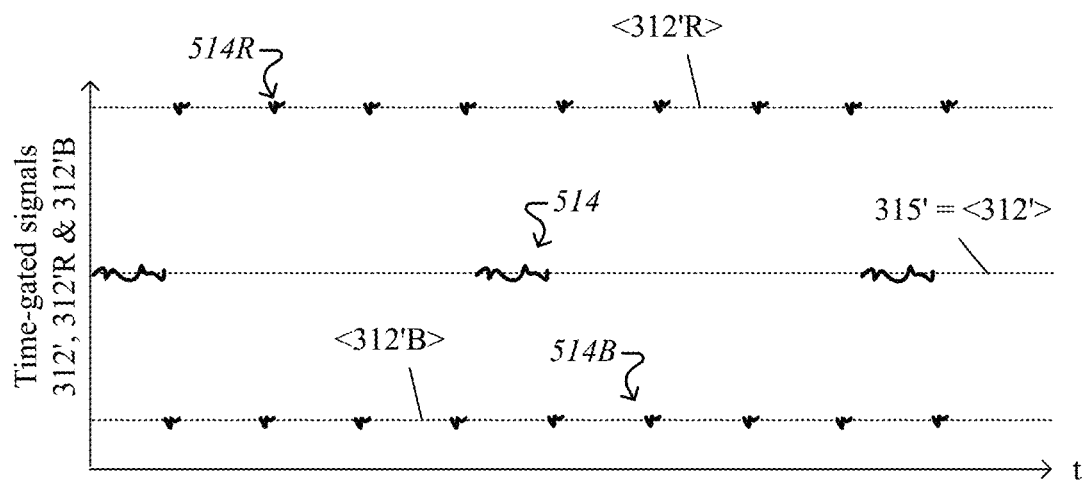

FIG. 5F shows a time-gated detector signal 514. The time-gated detector signal 514 is the detector signal 312' time-gated by the time-gated detection module 310 with the time-gate shown in FIG. 5C and corresponds to contributions of the probe-light that interacted with the single witness sample 309. A measurement signal 315' output by the time-gated detection module 310 can be the time-gated detector signal 514 itself or an average of the time-gated detector signal 514 over multiple periods $T_1$ (represented in dashed-line.) If the measurement system 304-B is a spectrometer, the time-gated detection module 310 time-gates the detector signal 312' with the background time-gate shown in FIG. 5D to obtain a time-gated background detector signal 514B. Further, the time-gated detection module 310 time-gates the detector signal 312' with the reference time-gate shown in FIG. 5E to obtain a time-gated reference detector signal 514R. The time-gated background detector signal 514B and the time-gated reference detector signal 514R also are shown in FIG. 5F. The former corresponds to contributions of stray light detected when the probe-light interacts with the mount 308, and latter corresponds to the probe-light that passes through the apertures 325 without being transmitted through the witness samples 309. The time-gated detection module 310 averages the time-gated background detector signal 514B and uses the background average (represented in dotted-line) to background-correct the time-gated detector signal 514 or its average. In this manner, the time-gated detection module 310 outputs a background-corrected signal 315' as the measurement signal. Additionally, the time-gated detection module 310 averages the time-gated reference detector signal 514R and uses the reference average (represented in dotted-line) to reference the time-gated detector signal 514 or its average. In this manner, the time-gated detection module 310 outputs a referenced signal 315' as the measurement signal.

Figure 6A:
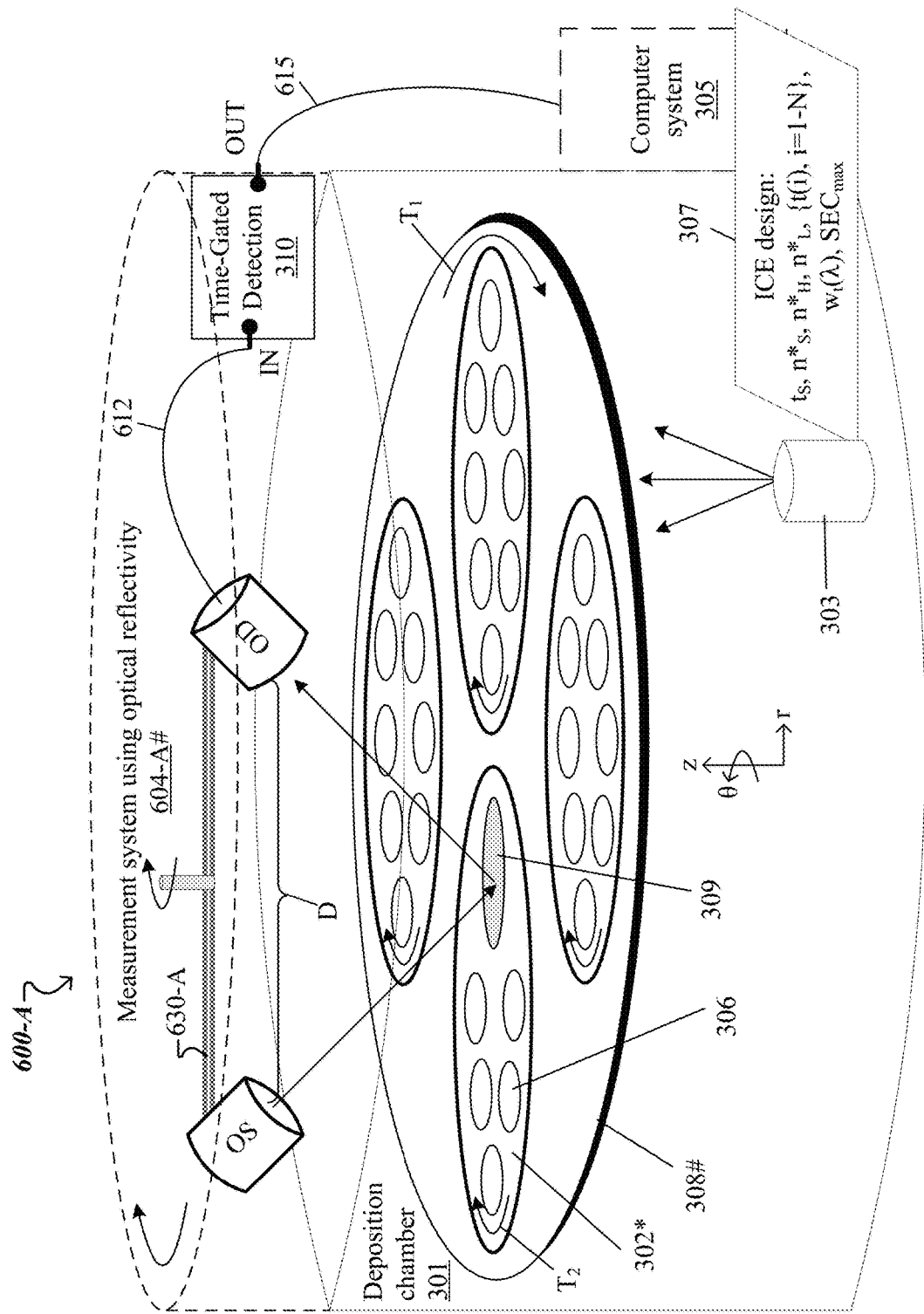
FIGS. 6A-6B show aspects of an example of a system for fabricating ICEs using another measurement system that is movable relative to a deposition source to measure characteristics of ICEs being fabricated without interrupting their periodic motion relative to the deposition source.
Figure 6B:
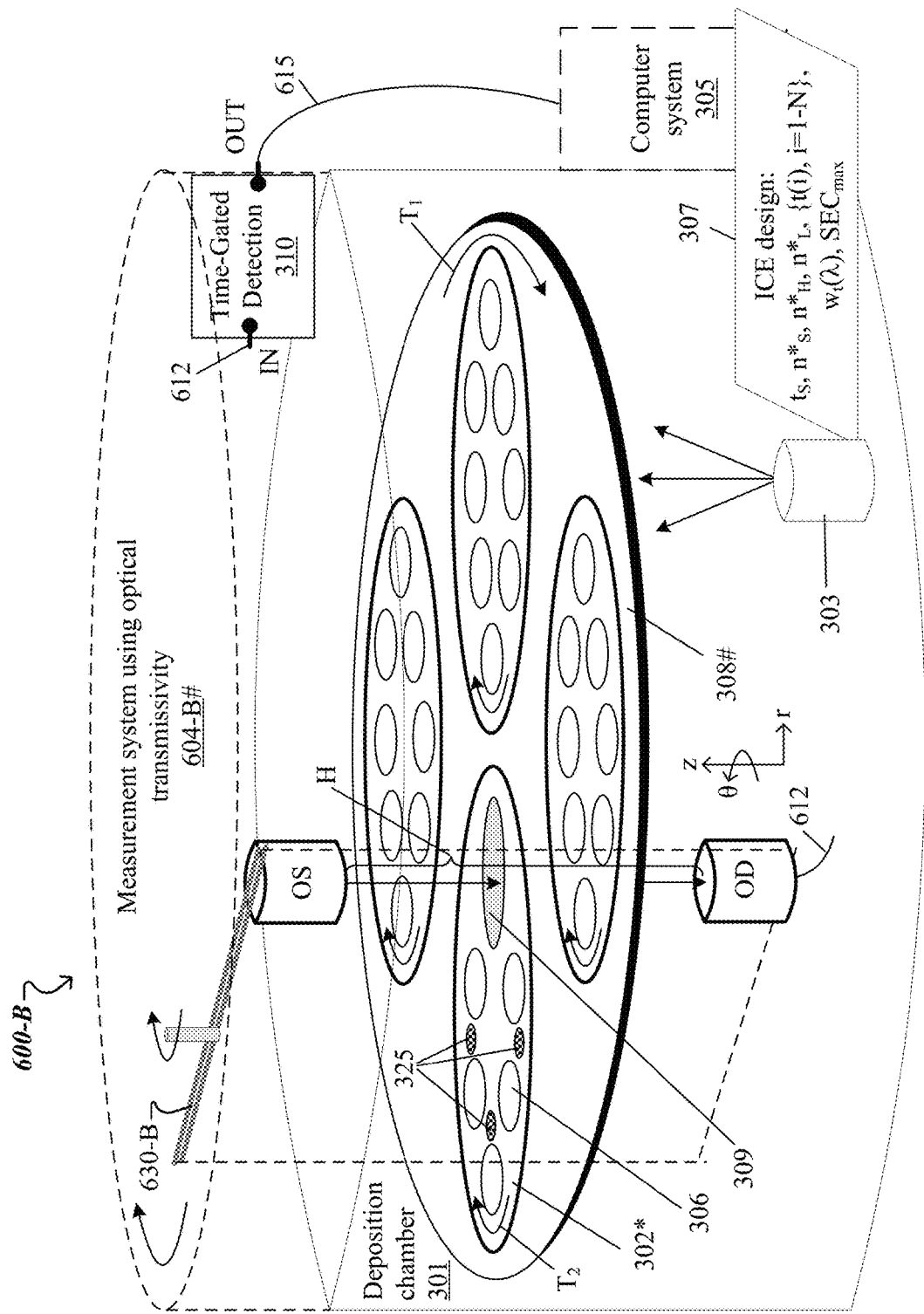

(3.2) In-Situ Measurement Techniques that are Time-Gated Based on Periodic Motion of Ices being Fabricated and Implemented in Measurement System that is Periodically Movable Relative to Deposition Sources FIGS. 6A and 6B shows different configurations of an ICE fabrication system 600. In analogy with the ICE fabrication system 300 described above in connection with FIGS. 3A and 3B, a configuration 600-A of the ICE fabrication system includes a configuration 604-A of the measurement system for taking optical reflection measurements, while another configuration 600-B of the ICE fabrication system includes another configuration 604-B of the measurement system for taking optical transmission measurements. The deposition chamber 301 and the computer system 305 of the ICE fabrication system 600 are similar to their counterpart components of the ICE fabrication system 300. However, the measurement system 604 is periodically movable, during ICE fabrication, relative to the deposition source(s) 303, unlike the measurement system 304 that is static relative to the deposition source(s) 303. As described in separate examples below, a timing of the periodic motion of the measurement system 604 relative to the deposition source(s) 303 can correspond to a periodic motion of a substrate support 302 that supports a witness sample 309 or to another periodic motion of the witness sample 309 itself.

The measurement system 604 can be an ellipsometer implemented based on a reflectance configuration 604-A illustrated in FIG. 6A, an optical monitor implemented based on either the reflectance configuration 604-A illustrated in FIG. 6A or a transmittance configuration 604-B illustrated in FIG. 6B, or a spectrometer implemented based on the transmittance configuration 604-B illustrated in FIG. 6B. In either of these cases, the measurement system 604 includes an optical source (OS) to illuminate the witness sample 309 with probe-light and an optical detector (OD) to detect probe-light that interacted with the witness sample 309 that is periodically moved relative to the deposition source(s) 303 along with ICEs 306 being fabricated in the deposition chamber 301. Here, the source OS and the detector OD are coupled to one or more frames 630, such that these components of the measurement system 604 are kept at rest relative to each other when the measurement system 604 periodically moves relative to the deposition source(s) 303 while the ICEs 306 are being fabricated in the deposition chamber 301. For example, as the measurement system in the reflectance configuration 604-A periodically moves relative to the deposition source(s) 303, the relative distance D between the source OS and the detector OD is maintained constant, D=constant, by the one or more frames 630-A. As another example, as the measurement system in the transmittance configuration 604-B periodically moves relative to the deposition source(s) 303, the relative separation H between the source OS and the detector OD is maintained constant, H=constant, by the one or more frames 630-B. Additionally, the measurement system 604 includes a time-gated detection module 310 to process the detected light based on timing of a relative motion between the measurement system 604 and the witness sample 309.

EXAMPLE 3

Figure 7A:
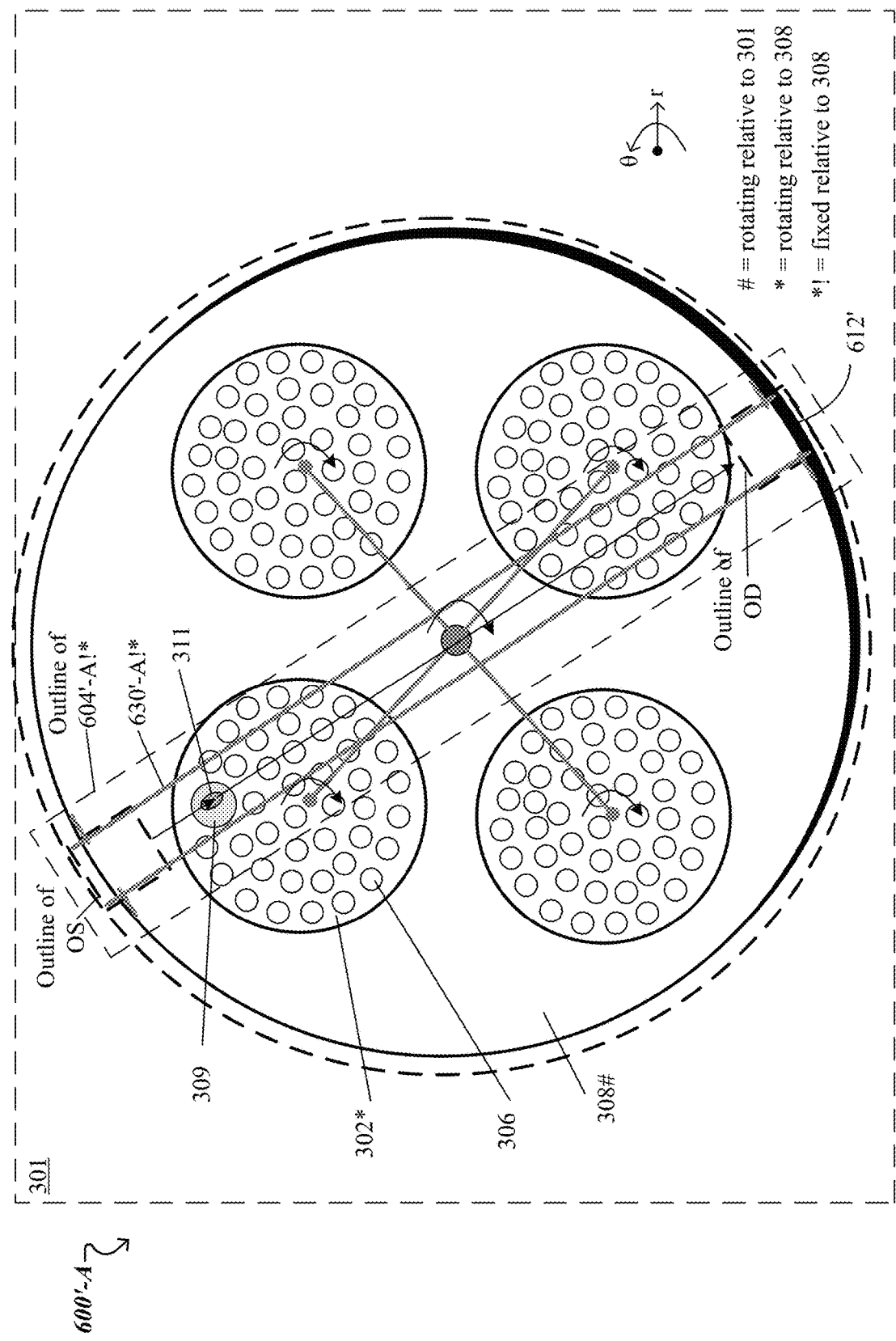
FIGS. 7A-7F show aspects of the system described in FIGS. 6A-6B when a motion of the measurement system is such that a witness sample placed among the ICEs being fabricated moves periodically relative to the moving measurement system.
Figure 7B:
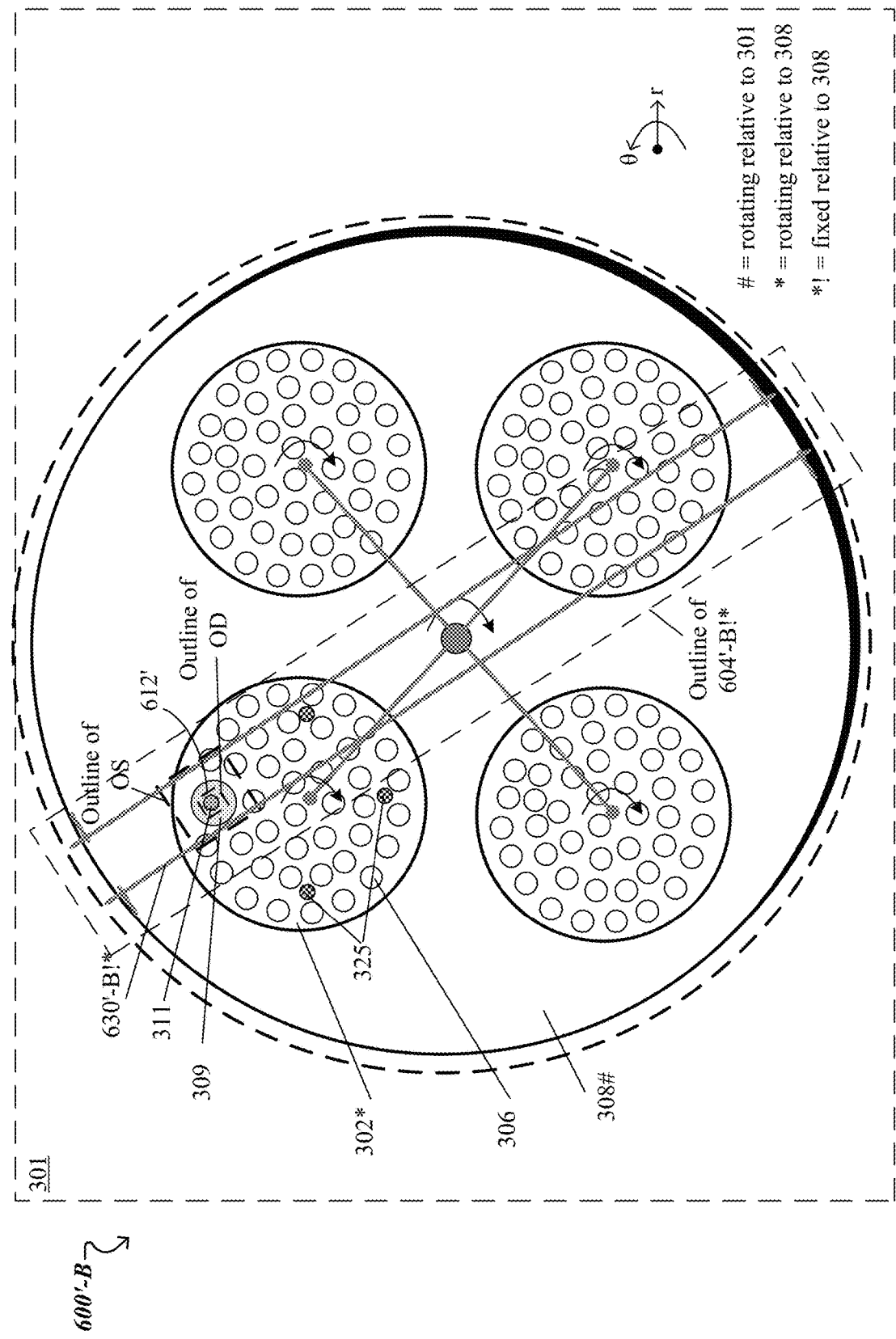

FIGS. 7A and 7B show respective views 600'-A and 600'-B of the ICE fabrication system 600 described above in connection with FIGS. 6A and 6B. During ICE fabrication, multiple ICEs 306 are supported by four substrate supports 302, which in turn are mounted on a mount 308. The mount 308 rotates relative to the deposition chamber 301 with a period $T_1$ about an azimuthal axis that passes through the center of the mount 308, and the substrate supports 302 rotate relative to the mount 308 with a period $T_2$ about respective axes that pass through each of their centers. Here, a single witness sample 309 is placed on one of the four substrate supports 302, such that the single witness sample 309 is placed off-centered on the substrate support 302.

Also shown in FIGS. 7A and 7B is an outline of the measurement system 604' encompassing outlines of the source OS, the detector OD and of the one or more frames 630' to which they are coupled. Here, the frames 630' are coupled to the mount 308 and are arranged such that the outline of the frames 630' overlaps the substrate support 302 that supports the single witness sample 309. In this manner, the measurement system 604' is periodically moved by the frames 630' with the same period $T_1$ as the mount 308, such that the measurement system 604' is at rest relative to the center of the substrate support 302 that supports the single witness sample 309.

Additionally, a plane 311 where the real-time, in-situ measurements are taken is coplanar with a plane of the periodic motion of the single witness sample 309. As such, the single witness sample 309 is illuminated by the probe-light provided by the source OS in accordance with timing of the periodic motion with the second period $T_2$ of the single witness sample 309 relative to the measurement plane 311. This timing is used by the time-gated detection module 310 to generate a time-gate for limiting (gating) a detector signal 612' to contributions of the probe-light that interacted with the single witness sample 309. In this manner, unwanted contributions to the detector signal 612' can be excluded. If the measurement system 604 shown in FIGS. 6B and 7B is a spectrometer, then the mount 308 includes apertures 325-1, 325-2, 325-3 and 325-4 disposed on the substrate support 302 that supports the single witness sample 309 at the same distance from the center axis of the substrate support 302 as the measurement plane 311. When each of the apertures traverses the measurement plane 311, the probe-light beam passes through the substrate support and the mount 308 and reaches the detector OD where a reference spectrum 612'R is being collected.

Figure 7C:
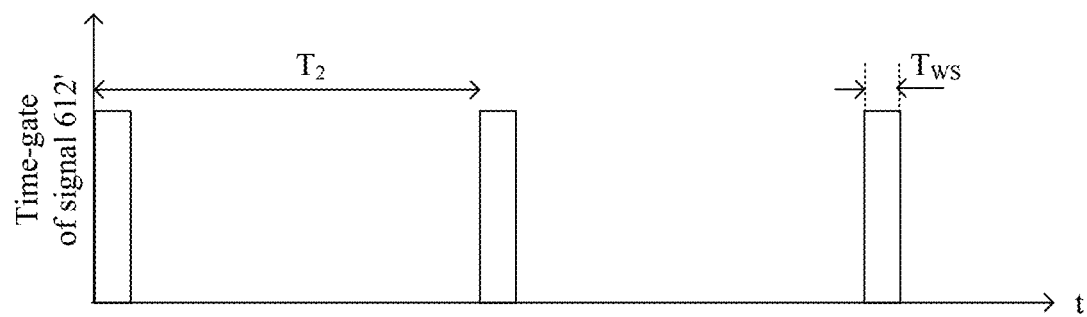

FIG. 7C shows a time-gate generated by the time-gated detection module 310 to limit (or gate) the detector signal 612' to the time when the single witness sample 309 is illuminated by the probe-light provided by the source OS.

The generated time-gate includes periodic gates with a gate-to-gate period equal to the second period $T_2$ and a gate width $T_{WS}$. Note that the gate width $T_{WS}$—which is no longer than the time during which the probe-light illuminates the single witness sample 309—is further constrained by a measurement time of the measurement system 604. To increase the time during which the probe-light illuminates the single witness sample 309, a size of the witness sample and/or a period $T_2$ of its periodic motion relative the mount 308 are increased. The time during which the probe-light illuminates the single witness sample 309 also increases when a radius of the substrate support 302 where the single witness sample 309 is supported is reduced.

Figure 7D:
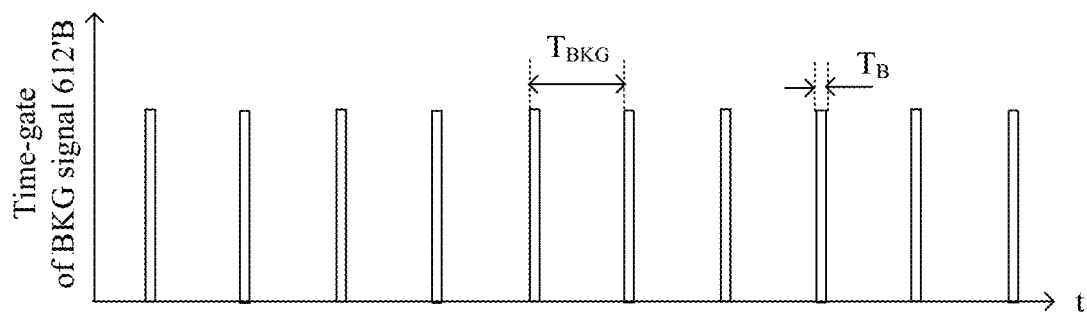

FIG. 7D shows an example of a background time-gate generated by the time-gated detection module 310 to background correct a measurement signal 615'. The background time-gate that isolates (gates) the background signal 612'B from the detector signal 612' includes periodic gates with a gate-to-gate period $T_{BKG}$ equal to the second period $T_2$ divided by $N_r$ (the total number of ICEs 306 supported by the substrate support 302 at the same radius r where the single witness sample 309 is supported), $T_{BKG}=T_2/N_r$, and a gate width $T_B$ that is up to (no longer than) a time that the probe-light illuminates the substrate support 302 between adjacent ICEs 306.

Figure 7E:
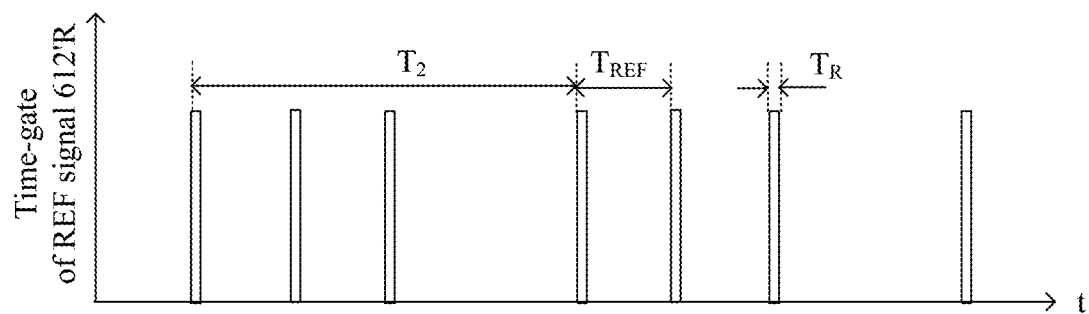

FIG. 7E shows an example of a reference time-gate generated by the time-gated detection module 310 to reference a measurement signal 615'. The reference time-gate that isolates (gates) the reference signal 612'R from the detector signal 612' includes periodic gates with a gate-to-gate period $T_{REF}$ equal to the second period $T_2$ divided by K+1, $T_{BKG}=(T_2/K+1)$, where K is the total number of apertures 325 the substrate support 302 (K=3 in FIGS. 6B and 7B), and a gate width $T_R$ that is up to (no longer than) a time that the probe-light illuminates each of the apertures 325-1, 325-2, 325-3 and 325-4. Every $(K+1)^{th}$ gate of the reference time-gate shown in FIG. 7E is missing. The missing gate from the reference time-gate shown in FIG. 7E can be found in the time-gate shown in FIG. 7C as the gate corresponding to the single witness sample 309.

Figure 7F:
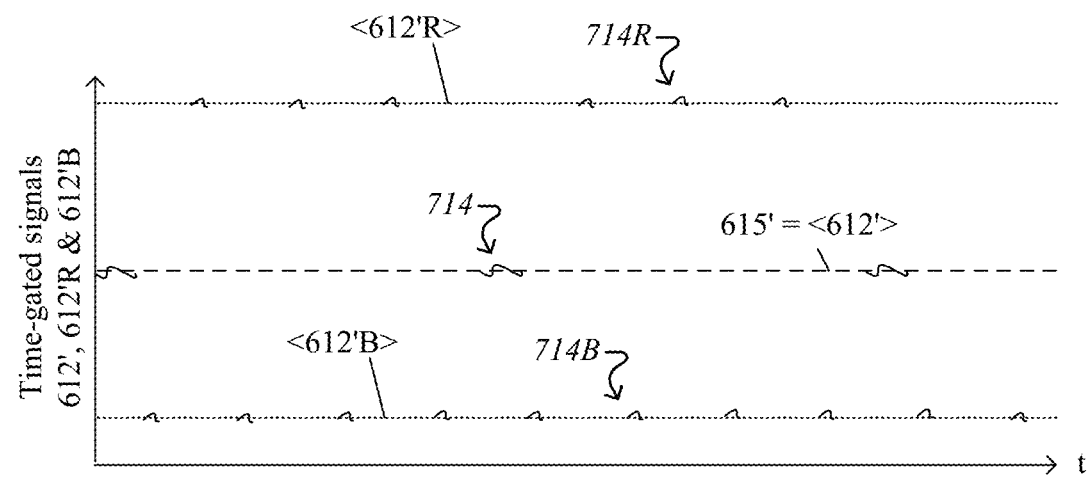

FIG. 7F shows a time-gated detector signal 714. The time-gated detector signal 714 is the detector signal 612' time-gated by the time-gated detection module 310 with the time-gate shown in FIG. 7C and corresponds to contributions of the probe-light that interacted with the single witness sample 309. A measurement signal 615' output by the time-gated detection module 310 can be the time-gated detector signal 714 itself or an average of the time-gated detector signal 714 over multiple periods $T_2$ (represented in dashed-line.) If the measurement system 604'-B is a spectrometer, the time-gated detection module 310 time-gates the detector signal 612' with the background time-gate shown in FIG. 7D to obtain a time-gated background detector signal 714B. Further, the time-gated detection module 310 time-gates the detector signal 612' with the reference time-gate shown in FIG. 7E to obtain a time-gated reference detector signal 714R. The time-gated background detector signal 714B and the time-gated reference detector signal 714R also are shown in FIG. 7F. The former corresponds to contributions of stray light detected when the probe-light interacts with the substrate support 302 supporting the single witness sample 309, and latter corresponds to the probe-light that passes through the apertures 325 without being transmitted through the single witness sample 309. The time-gated detection module 310 averages the time-gated background detector signal 714B and uses the background average (represented in dotted-line) to background-correct the time-gated detector signal 714 or its average. In this manner, the time-gated detection module 310 outputs a background-corrected signal 615' as the measurement signal. Additionally, the time-gated detection module 310 averages the time-gated reference detector signal 714R and uses the reference average (represented in dotted-line) to reference the time-gated detector signal 714 or its average. In this manner, the time-gated detection module 310 outputs a referenced signal 615' as the measurement signal.

Precession of a probe-light beam across each of the witness samples 309 within the acquisition time of the time-gated ellipsometry, optical monitoring or spectrometry described above may be a primary contribution to noise in the measurement signal 315, 315' or 615' compared with measurement signals obtained conventionally with static monitoring techniques. An implementation of the measurement system 600 described below eliminates the precession of the probe-light beam across each of the witness samples 309 from among noise sources of the real-time monitoring techniques disclosed in this specification.

EXAMPLE 4

Figure 8A:
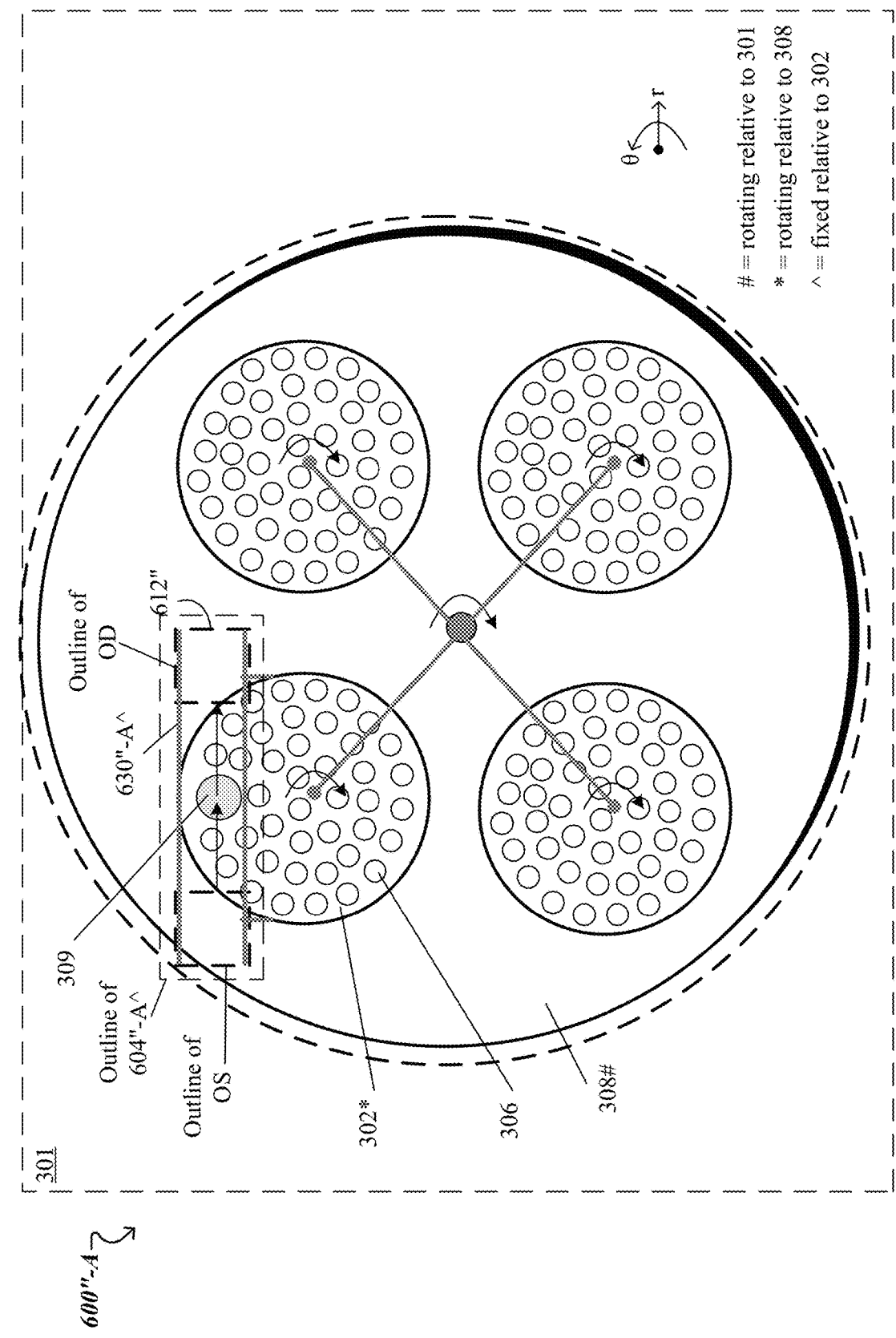
FIGS. 8A-8C show aspects of the system described in FIGS. 6A-6B when a motion of the measurement system is such that a witness sample placed among the ICEs being fabricated is at rest relative to the moving measurement system.
Figure 8B:
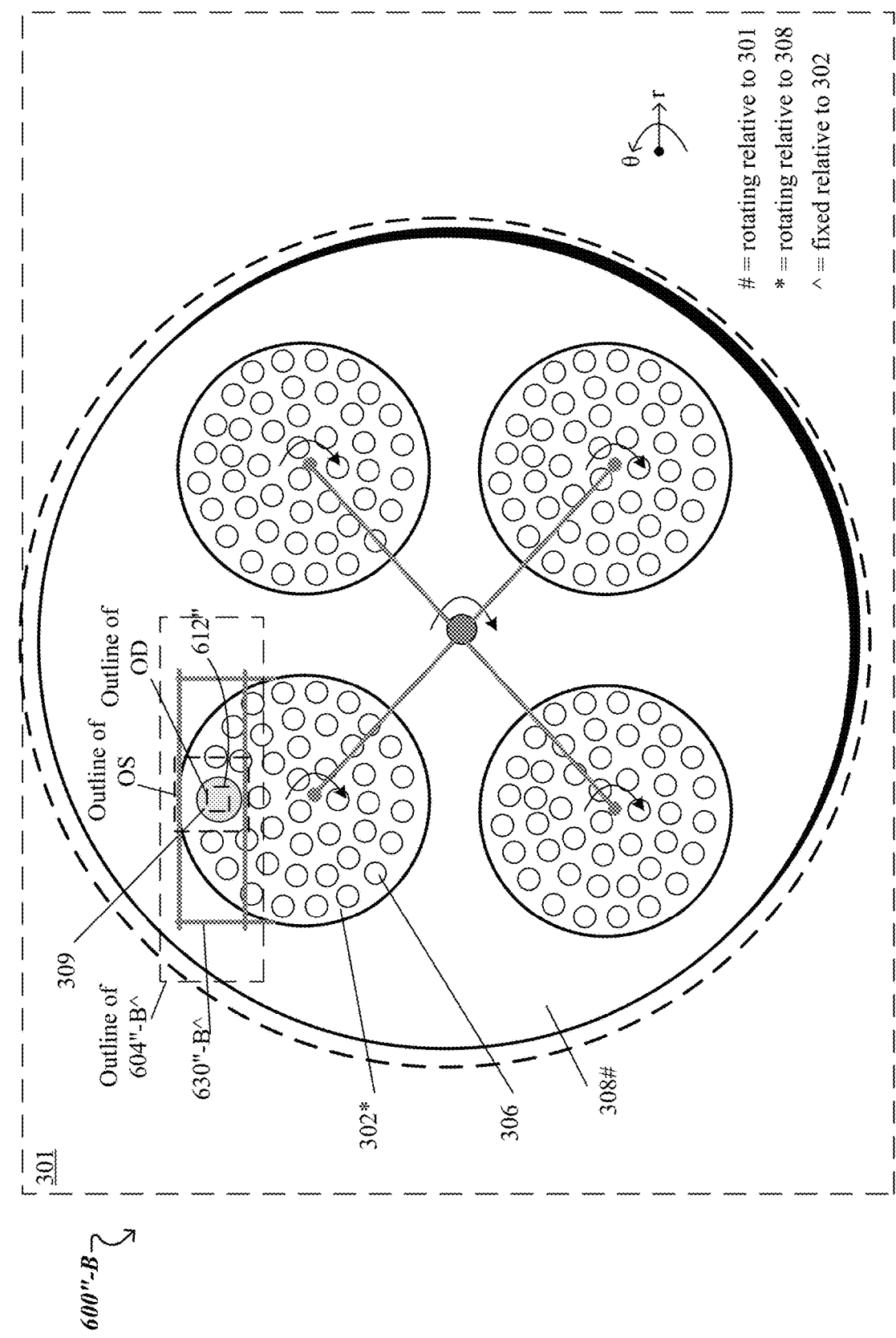

FIGS. 8A and 8B show respective views 600"-A and 600"-B of the ICE fabrication system 600 described above in connection with FIGS. 6A and 6B. During ICE fabrication, multiple ICEs 306 are supported by four substrate supports 302, which in turn are mounted on a mount 308. The mount 308 rotates relative to the deposition chamber 301 with a period $T_1$ about an azimuthal axis that passes through the center of the mount 308, and the substrate supports 302 rotate relative to the mount 308 with a period $T_2$ about respective axes that pass through each of their centers. Once again, a single witness sample 309 is placed on one of the four substrate supports 302, such that the single witness sample 309 is placed off-centered on the substrate support 302.

Also shown in FIGS. 8A and 8B is an outline of the measurement system 604" encompassing outlines of the source OS, the detector OD and of the one or more frames 630" to which they are coupled. Here, the frames 630" are coupled to the substrate support 302 that supports the single witness sample 309 and are arranged such that the outline of the frames 630" overlaps the single witness sample 309. The frames 630" can be attached to actuators (not shown in FIGS. 8A and 8B) that are controlled by the computer system 305 and can have the freedom to rotate on all 3 axes. In this manner, the measurement system 604" is periodically moved by the frames 630" with the same period $T_2$ as the substrate support 302 that supports the single witness sample 309, such that the measurement system 630 is at rest relative to the single witness sample 309. In addition, portion(s) of the deposition chamber 301's wall(s) can be made of transparent material (e.g., glass) through which probe-light emitted by the source OS is provided to the single witness sample 309, and probe-light interacted with the single witness sample 309 is extracted to the detector OD.

Figure 8C:
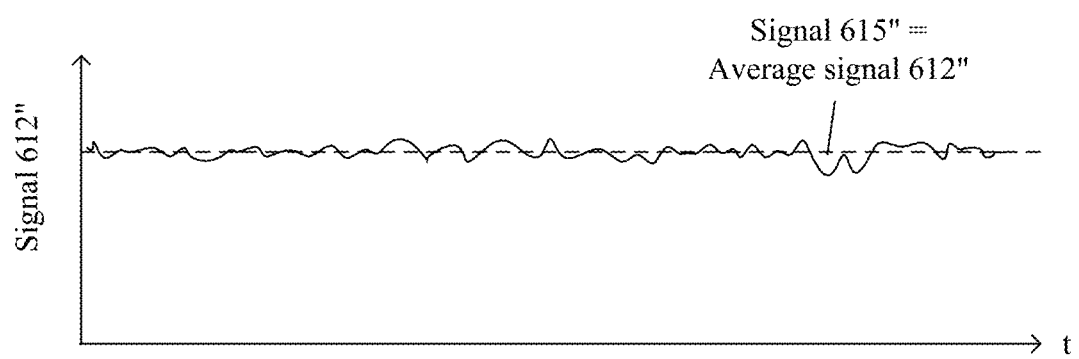

In addition, a plane 311 where the real-time, in-situ measurements are taken is coplanar with a plane of the periodic motion of the single witness sample 309. As such, the single witness sample 309 is continuously illuminated by the probe-light provided by the source OS. FIG. 8C shows the continuously acquired detector signal 612" which corresponds to contributions of the probe-light that interacted continuously with the single witness sample 309. A measurement signal 615" output by the time-gated detection module 310 can be the detector signal 612" itself or a running average of the detector signal 612" (represented in dashed-line.)

Figure 9A:
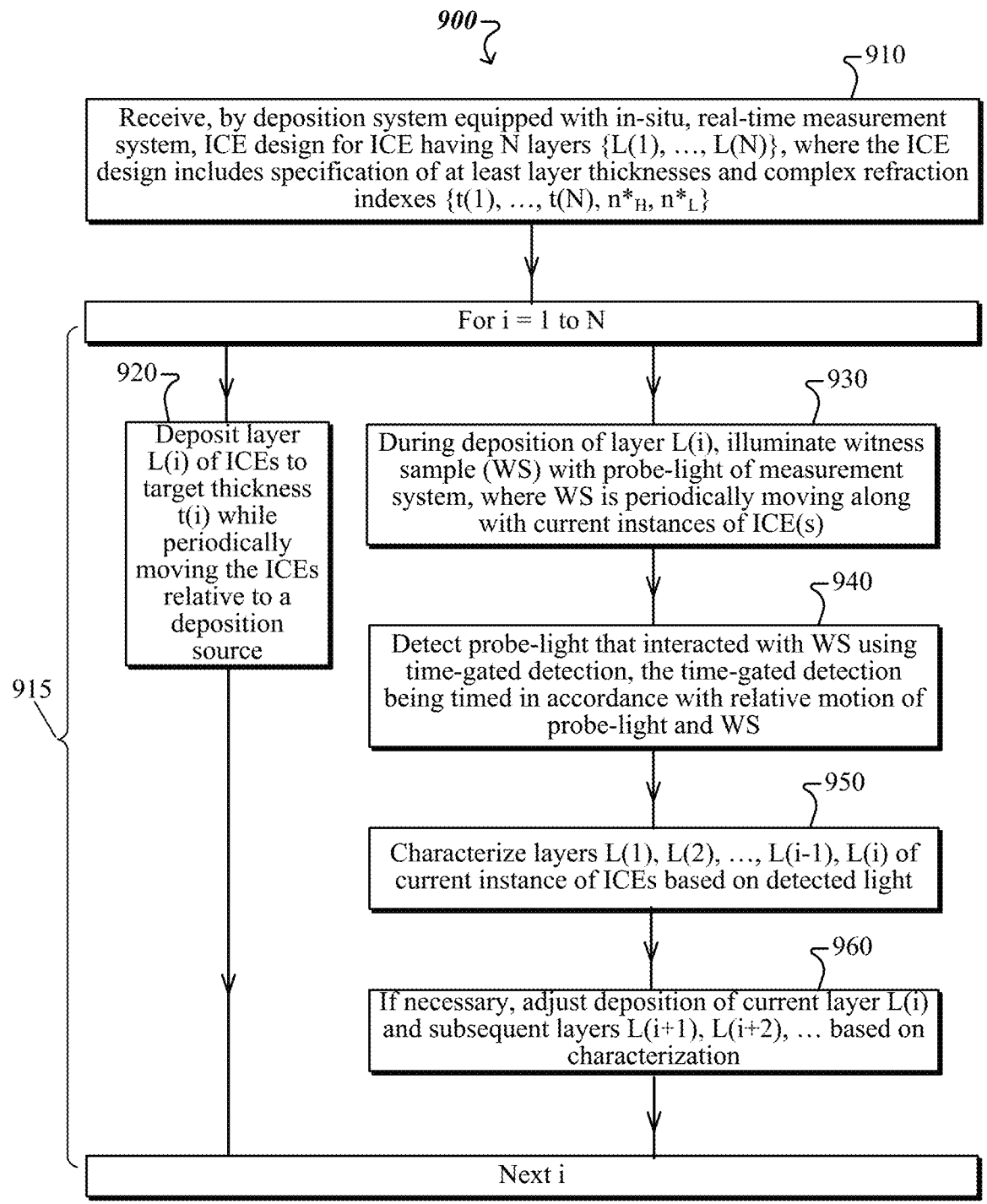
FIGS. 9A-9B are flowcharts of an ICE fabrication process that uses time-gated measurements to measure characteristics of ICEs being fabricated without interrupting their periodic motion relative to a deposition source.

(3.3) Real-Time Adjustments if ICE Fabrication Based on Time-Gated Monitoring FIG. 9A is a flow chart of an example of an ICE fabrication process 900 that uses time-gated measurements to measure characteristics of ICEs being fabricated without interrupting their periodic motion relative to a deposition source. The process 900 can be implemented in conjunction with either of ICE fabrication systems 300 or 600. In such a context, the process 900 can be implemented as instructions encoded in the memory of the computer system 305, such that execution of the instructions, by the one or more hardware processors of the computer system 305, causes the ICE fabrication system 300 or 600 to perform the following operations.

At 910, an ICE design is received. The received ICE design includes specification of a substrate and N layers L(1), L(2), . . . , L(N), each having a different complex refractive index from its adjacent layers, and specification of target complex refractive indices and thicknesses $t_S$, t(1), t(2), . . . , t(N). In this manner, an ICE fabricated in accordance with the received ICE design selectively weights, when operated, light in at least a portion of a wavelength range by differing amounts. The differing amounts weighted over the wavelength range correspond to a target optical spectrum $w_t(\lambda)$ of the ICE and are related to a characteristic of a sample. For example, a design process for determining the specified (1) substrate and number N of layers of the ICE, each having a different complex refractive index from its adjacent layers, and (2) complex refractive indices and thicknesses of the substrate and the N layers that correspond to the target optical spectrum $w_t(\lambda)$ of the ICE is described above in connection with FIG. 2. In some implementations, the received ICE design also can include $SEC_t$ as an indication of a target performance of the ICE. The target performance represents an accuracy with which the ICE predicts, when operated, known values of the characteristic corresponding to validation spectra of the sample. Here, predicted values of the characteristic are obtained when the validation spectra weighted by the ICE are respectively integrated. In some implementations, the received ICE design also can include indication of maximum allowed $SEC_{max}$ caused by fabrication errors.

Loop 915 is used to fabricate one or more ICEs based on the received ICE design. Each iteration "i" of the loop 915 is used to form a layer L(i) of a total number N of layers. Here, the total number N of layers can be either specified in the received ICE design or updated during the ICE fabrication. Updates to the received ICE design are performed when necessary for preventing performance of the fabricated ICE to degrade under a threshold value.

At 920, the layer L(i) is formed to a target thickness t(i) while periodically moving the ICEs being fabricated relative to a deposition source. The target thickness t(i) of the layer L(i) can be specified by the received ICE design or updated based on optimization(s) carried out after forming previous one or more of the layers of the ICE. One or more of the ICEs being fabricated can be used as a witness sample.

At 930, while the layer L(i) is being formed, a witness sample is illuminated with probe-light without interrupting the forming of the current layer L(i). Whether or not the witness sample is one or more of the ICEs being fabricated, the witness samples periodically move relative to the deposition source along with the ICEs being fabricated.

At 940, the probe-light that interacted with the witness sample is detected using time-gated detection. The time-gated detection is timed in accordance with a relative motion of the probe-light and the witness sample. In some implementations, the probe-light is static relative to the deposition source. Here, a first relative motion of the probe-light and the witness sample corresponds to the periodic motion of the witness sample relative to the deposition source. Examples of time-gates used to detect in such cases the probe-light that interacted with the witness sample are described above in connection with FIGS. 4D and 5C. In other implementations, the probe-light is periodically moving relative to the deposition source, such that its periodic motion is different from the periodic motion of the witness sample relative to the deposition source. Here, a second relative motion of the probe-light and the witness sample is periodic. An example of a time-gate used to detect in such cases the probe-light that interacted with the witness sample is described above in connection with FIG. 7C. In some other implementations, the probe-light is periodically moving relative to the deposition source with the same periodic motion as the witness sample. In this third case, the probe-light and the witness sample are relatively at rest. An example of continuous detection used in such cases is described above in connection with FIG. 8C.

Various characteristics of the probe-light that interacted with a current instance of the witness sample can be measured depending on the in-situ measurement technique used to detect the interacted probe-light at 940. For example, polarization components $\{\Psi(i), \Delta(i)\}$ of a probe-light that interacted with the current instance of the witness sample is measured in real-time using in-situ ellipsometry time-gated in accordance with any one of the three examples of relative motion of the probe-light and the witness sample described above. As another example, change in intensity $I(i;\lambda_1)$ of a quasi-monochromatic probe-light that interacted with a current instance of the witness sample is measured in real-time using in-situ optical monitoring time-gated in accordance with any one of the three examples of relative motion of the probe-light and the witness sample described above. As yet another example, a spectrum $S(i;\lambda)$ of a probe-light that interacted with a current instance of the witness sample is measured in real-time using in-situ spectroscopy time-gated in accordance with any one of the first and second examples of relative motion of the probe-light and the witness sample described above. In the latter example, the measured spectrum $S(i;\lambda)$ of the probe-light that interacted with a current instance of the witness sample can be background-corrected using a spectrum of background light (e.g., stray light of probe-light that interacted with fabrication environment adjacent the witness sample.) Moreover, the measured spectrum $S(i;\lambda)$ of the probe-light that interacted with a current instance of the witness sample can be referenced using a reference spectrum corresponding to probe-light that is not transmitted through the witness sample.

Figure 9B:
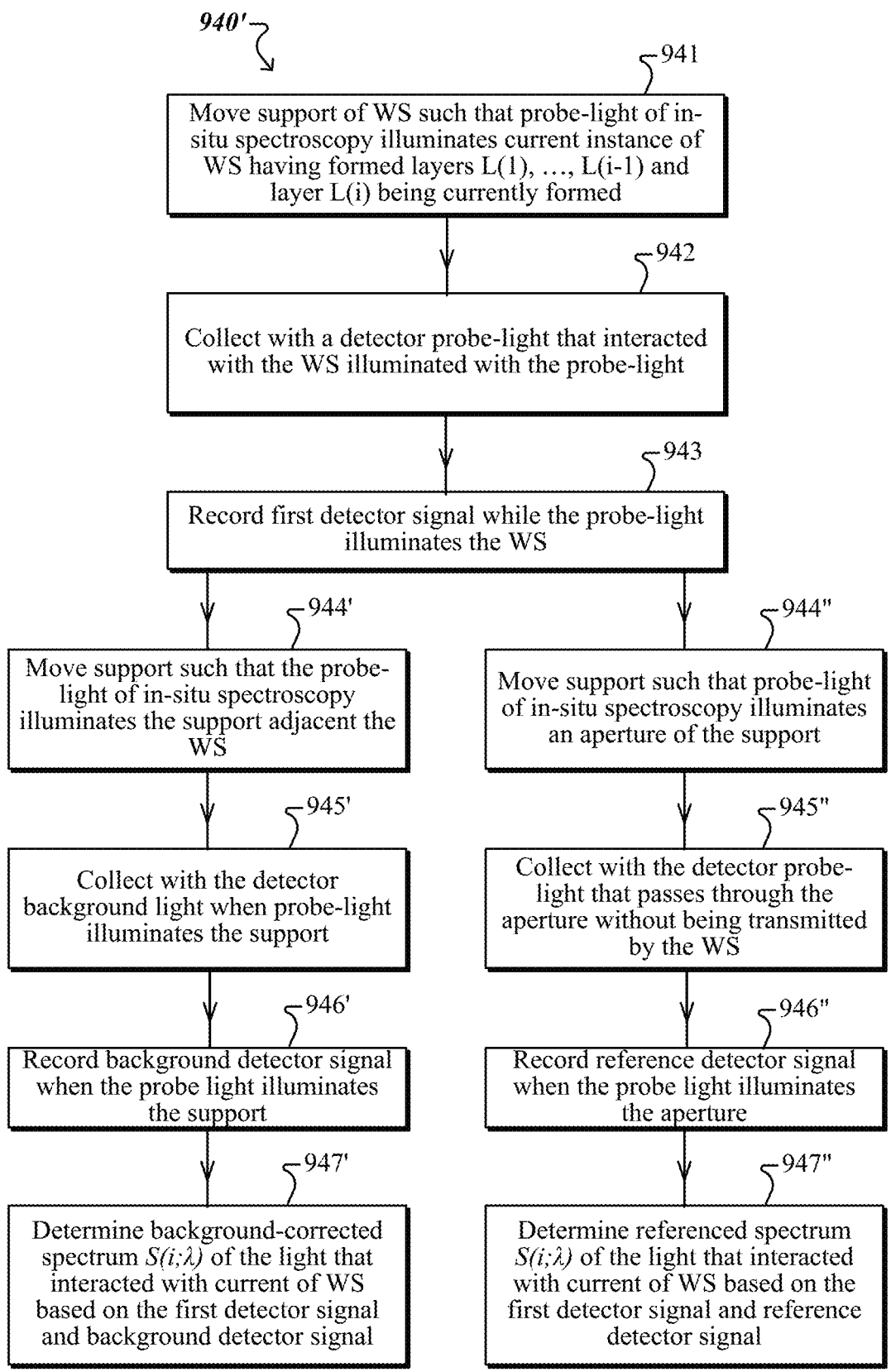

FIG. 9B is a flowchart of an example of a process 940' for measuring a background-corrected spectrum and a referenced spectrum for a current instance of a witness sample. The process 940' can be implemented in conjunction with either of ICE fabrication systems 300 or 600 as the operation 940 of the ICE fabrication process 900, for instance.

At 941, a support that supports a witness sample is moved such that probe-light of in-situ spectroscopy illuminates current instance of the witness sample. When the process 940' is used as part of operation 940 of the ICE fabrication process 900, the current instance of the witness sample has layers L(1), L(2), . . . , L(i−1) formed during previous iterations of the loop 915 and the layer L(i) currently being formed.

At 942, probe-light that interacted with the witness sample illuminated with the probe-light is collected with a detector. In a reflectance configuration of the in-situ spectrometer, the interacted probe-light is the probe-light that illuminates the witness sample and then reflects off the witness sample to the detector. In a transmittance configuration of the in-situ spectrometer, the interacted probe-light is the probe-light that illuminates the witness sample and then transmits through the witness sample to the detector.

At 943, a first detector signal is recorded while the probe-light illuminates the witness sample. The first detector signal, collected for example with the detector shown in FIG. 3D, corresponds to raw (un-corrected) spectrum $S_{raw}$(i;$\lambda$) of the probe-light that interacted with the current instance of the witness sample. Here, the raw spectrum extends over an operational wavelength range [$\lambda_{min}$,$\lambda_{max}$] of ICEs being fabricated along with the witness sample.

At 944', the support that supports the witness sample is moved such that the probe-light of in-situ spectroscopy illuminates the support adjacent the witness sample. Here, the probe-light that illuminates the support adjacent the witness sample is blocked by the support.

At 945', background light is collected by the detector while the probe-light illuminates the support adjacent the witness sample. The background light includes electromagnetic radiation emitted and/or scattered by fabrication environment of the witness sample, such as, e.g., heat emitted and then scattered by various components of a deposition chamber, diffusely scattered probe-light, etc.

At 946', a background detector signal is recorded while the probe-light illuminates the support adjacent the witness sample. The background detector signal, collected for example with the detector shown in FIG. 3D, corresponds to a spectrum $S_{BKG}(\lambda)$ of the background light over the operational wavelength range [$\lambda_{min}$,$\lambda_{max}$] of the ICEs being fabricated along with the witness sample.

At 947', a background-corrected spectrum S(i;$\lambda$) of the probe-light that interacted with the current instance of the witness sample is determined based on the first detector signal (recorded at 943) and the background detector signal (recorded at 946'.) Here, the background-corrected spectrum extends over an operational wavelength range [$\lambda_{min}$,$\lambda_{max}$] of ICEs being fabricated along with the witness sample. FIGS. 4G and 5E show signals corresponding to the background-corrected spectrum S(i;$\lambda$) determined based on timing of the first example of relative motion. FIG. 7E shows a signal corresponding to the background-corrected spectrum S(i;$\lambda$) determined based on timing of the second example of relative motion.

At 944", the support that supports the witness sample is moved such that the probe-light of in-situ spectroscopy illuminates an aperture (e.g., an opening or a window) of the support. Here, the probe-light that illuminates the aperture passes through the support without being transmitted through a witness sample.

At 945", probe-light is collected by the detector while the probe-light illuminates the aperture.

At 946", a reference detector signal is recorded while the probe-light illuminates the aperture. The reference detector signal, collected for example with the detector shown in FIG. 3D, corresponds to a spectrum S($\lambda$) of the un-interacted probe-light over the operational wavelength range [$\lambda_{min}$,$\lambda_{max}$] of the ICEs being fabricated along with the witness sample.

At 947", a referenced spectrum S(i;$\lambda$) of the probe-light that interacted with the current instance of the witness sample is determined based on the first detector signal (recorded at 943) and the reference detector signal (recorded at 946".) Here, the referenced spectrum extends over an operational wavelength range [$\lambda_{min}$,$\lambda_{max}$] of ICEs being fabricated along with the witness sample. FIGS. 4G and 5E show signals corresponding to the referenced spectrum S(i;$\lambda$) determined based on timing of the first example of relative motion. FIG. 7E shows a signal corresponding to the referenced spectrum S(i;$\lambda$) determined based on timing of the second example of relative motion.

The process 940' is performed repeatedly based on timing associated with any one of the first and second examples of relative motion of the probe-light and the witness sample described above.

Referring again to FIG. 9A, at 950, the layers L(1), L(2), . . . , L(i−1) formed during previous iterations of the loop 915 and the layer L(i) currently being formed are characterized based on characteristics of the interacted probe-light detected in real-time at 940. Such characterization of the witness sample's layers is performed in real-time, without interrupting a periodic motion of the witness sample (and of the ICEs being fabricated along with the witness sample) relative to the deposition source. For instance, the characteristics of the interacted probe-light (measured at 940) are used to determine complex refractive indices $n^{*}_{H}$ and $n^{*}_{L}$ and thicknesses t'(1), t'(2), . . . , t'(i−1), t'(i) of the layers L(1), L(2), . . . , L(i−1) formed in previous iterations of the loop 915 and the layer L(i) that is currently being formed.

In this manner, by determining in real-time the thickness t'(i) of the layer L(i) currently being formed, the forming (at 920) of the layer L(i) can be completed substantially on target, when it is determined that the thickness t'(i) of the layer L(i) being formed matches the target thickness t(i) specified in the ICE design. For example, if a precision of the determining (performed at 950) of a layer thickness is $\sigma$, then a direct measurement of the layer thickness produces a value that is within ±3$\sigma$ from a value of the determined layer thickness, for a 99% confidence interval. In this manner, thickness t'(i) of a layer L(i) for which deposition is stopped upon determining (at 950) that its thickness "matches" a target thickness t(i) should be within ±3$\sigma$ from the target thickness t(i), 99 times out of 100. For instance, a precision $\sigma$ for determining in real-time the thickness of a layer L(i) currently being deposited can be 5 A. In this manner, the deposition of the current layer is stopped when its determined thickness reaches its target t(i), such that the actual thickness of the deposited layer L(i) is within ±15 A from its target thickness t(i).

At 960, deposition of current and subsequent layers L(i), L(i+1), . . . of the ICE(s) being fabricated along with the witness sample is adjusted, if necessary, based on determined complex refractive indices $n^{*}_{H}$, $n^{*}_{L}$ and thicknesses t'(1), t'(2), . . . , t'(i−1), t'(i) of deposited layers L(1), L(2), . . . , L(i−1) and the layer L(i) currently being deposited. For example, a deposition rate used to form the layer L(i) currently being formed and other layers L(i+1), L(i+2), . . . remaining to be formed can be adjusted in real-time based on a comparison between values of the complex refractive indices and thicknesses of the layers of the current instance of the ICEs and their respective target values. Alternatively or additionally, complex refractive indices corresponding to the layer L(i) being current formed and other layers L(i+1), L(i+2), . . . remaining to be formed can be adjusted in real-time based on a comparison between values of the complex refractive indices and thicknesses of the layers of the current instance of the ICEs and their respective target values.

Further, in order to determine whether target thicknesses of the layers $L(i+1)$, $L(i+2)$, . . . , $L(N)$ remaining to be formed should be updated, the following verification is performed when deposition of the current layer $L(i)$ is completed. An $SEC(i)$ of the ICE is predicted to represent the ICE's performance if the ICE were completed to have the formed layers $L(1)$, $L(2)$, . . . , $L(i)$ with the determined thicknesses $t'(1)$, $t'(2)$, . . . , $t'(i)$, and layers $L(i+1)$, $L(i+2)$, . . . , $L(N)$ remaining to be formed with target thicknesses $t(i)$, $t(i)$, . . . , $t(N)$. Here, the predicted $SEC(i)$ of the ICE is caused by deviations of the determined complex refractive indices and thicknesses of the formed layers from their respective target complex refractive indices and thicknesses specified by the current ICE design. If the predicted $SEC(i)$ does not exceed a maximum allowed $SEC_{max}$, $SEC(i) \leq SEC$, then a next iteration of the loop 915 will be triggered to form the next layer $L(i+1)$ to its target thickness $t(i+1)$.

If, however, the predicted $SEC(i;N)$ exceeds the maximum allowed $SEC_{max}$, $SEC(i;N) > SEC_{max}$, then target thicknesses of the layers $L(i+1)$, $L(i+2)$, . . . , $L(N)$ remaining to be formed are modified based on the determined complex refractive indices and thicknesses of the formed layers $L(1)$, $L(2)$, . . . , $L(i)$. This optimization may change the total number of layers of the ICE from the specified total number N of layers to a new total number N' of layers, but constrains the thicknesses of the layers $L(1)$, $L(2)$, . . . , $L(i)$ (of the current instance of the ICE) to the determined thicknesses $t'(1)$, $t'(2)$, . . . , $t'(i)$. In this manner, the optimization obtains, in analogy with the process 200 described above in connection with FIG. 2, new target thicknesses $t''(i+1)$, . . . , $t''(N')$ of the layers $L(i+1)$, . . . , $L(N')$ remaining to be formed, such that a new target $SEC'_t(i;N')$ of the ICE—for the ICE having the first layers $L(1)$, $L(2)$, . . . , $L(i)$ formed with the determined thicknesses $t'(1)$, $t'(2)$, . . . , $t'(i)$, and the layers $L(i+1)$, . . . , $L(N')$ remaining to be formed with the new target thicknesses $t''(i+1)$, . . . , $t''(N')$—is minimum and does not exceed the maximum allowed $SEC_{max}$, $SEC'_t(i;N') \leq SEC_{max}$.

Once the previous instance of the ICE design is updated with specification of the new total number of layers N' and the new target thicknesses $t''(i+1)$, . . . , $t''(N')$—which are used to form the remaining layers $L(i+1)$, . . . , $L(N')$ and correspond to the new target $SEC'_t(i;N')$—a next iteration of the loop 915 will be triggered to form the next layer $L(i+1)$ from the new total number of layers N' to its new target thickness $t''(i+1)$. In this manner, the remaining layers of the ICE will be formed based on the updated ICE design, at least until another update is performed.

Technologies for ICE fabrication were described that use in-situ measurement techniques performed on a witness sample while it is undergoing the same periodic motion as ICEs being fabricated, such that the measurements are time-gated based on the periodic motion of the witness sample. Results of the time-gated measurements are used for instructing, in-real time, completion of layer deposition upon determining that a layer currently being deposited matches its target layer, and/or for adjusting, in real-time, deposition of the current layer and of the layers remaining to be deposited. Other ways for timing the measurement techniques based on the periodic motion of the witness sample can be used as described below.

(3.4) In-Situ Measurement Techniques that are Synchronous with Periodic Motion of Ices being Fabricated A target ICE design can be provided to an ICE fabrication system in which multiple ICEs are fabricated based on the target ICE design. Technologies for in-situ monitoring of ICE fabrication using real-time measurements of characteristics of current instances of ICEs being fabricated are described below, such that the measurements are performed synchronously with the periodic motion of the ICEs being fabricated.

FIGS. 10A-10B and 11A-11B show different configurations of an example of an ICE fabrication system 1000. The ICE fabrication system 1000 includes a deposition chamber 301 to fabricate one or more ICEs 306, a measurement system 1004 to measure characteristics of probe-light that interacted with formed layers of the ICEs while the ICEs are being fabricated, and a computer system 305 to control the fabrication of the one or more ICEs based at least in part on results of the measurements. Configurations 1000-A and 1000-A' of the ICE fabrication system include respective configurations 1004-A and 1004-A' of the measurement system for taking optical reflection measurements, while other configurations 1000-B and 1000-B' of the ICE fabrication system includes other configurations 1004-B and 1004-B' of the measurement system for taking optical transmission measurements, as described in detail below.

As described above in connection with FIGS. 3A-3B, the deposition chamber includes one or more PVD source(s) 303 to provide materials with a low complex index of refraction $n^*_L$ and a high complex index of refraction $n^*_H$ used to form layers of the ICEs 306. Various PVD techniques can be used to form a stack of layers of each of the ICEs 306 in accordance with a target ICE design 307. Moreover, the one or more deposition sources 303 are at rest relative to the deposition chamber 301. Substrates on which layers of the ICEs 306 will be deposited are placed on M substrate supports 302, where $M \geq 1$, within the field of view of the deposition source(s) 303. A relative orientation, separation and motion between the deposition source(s) 303 and each of the M substrate supports 302 are configured to provide spatially uniform deposition rate(s) across the ICEs 306 disposed on the M substrate supports 302. As a spatial distribution of a deposition plume provided by the deposition source(s) 303 is non-uniform across a plane that contains the M substrate supports, each of the M substrate supports 302 is periodically moved (i) relative to the deposition source(s) 303 along a first direction of motion—in the plane that contains the M substrate supports—with a first period $T_1$, and (ii) relative to the first direction of motion along a second direction of motion—in the plane that contains the M substrate supports and orthogonal to the first direction of motion—with a second period $T_2$ to obtain reproducibly uniform layer deposition of the ICEs 306 within a batch.

In accordance with the disclosed technologies, actual complex refractive indices and thicknesses of previously deposited layers $L(1)$, . . . , $L(j-1)$ and real-time complex refractive index and thickness of a layer $L(j)$ being currently deposited for the ICEs 306 are being determined during deposition of the layer $L(j)$. In this manner, deposition of the layer $L(j)$ can be stopped precisely when its deposited thickness matches its target thickness, regardless of whether a deposition rate used for depositing the layer $L(j)$ remains under control or drifts uncontrollably during deposition of the layer $L(j)$. The complex refractive indices and thicknesses of the formed layers and the real-time complex refractive index and thickness of the layer $L(j)$ currently being formed are determined from measurements of characteristics of probe-light that interacted with the formed layers taken by the measurement system 1004.

Figure 10A:
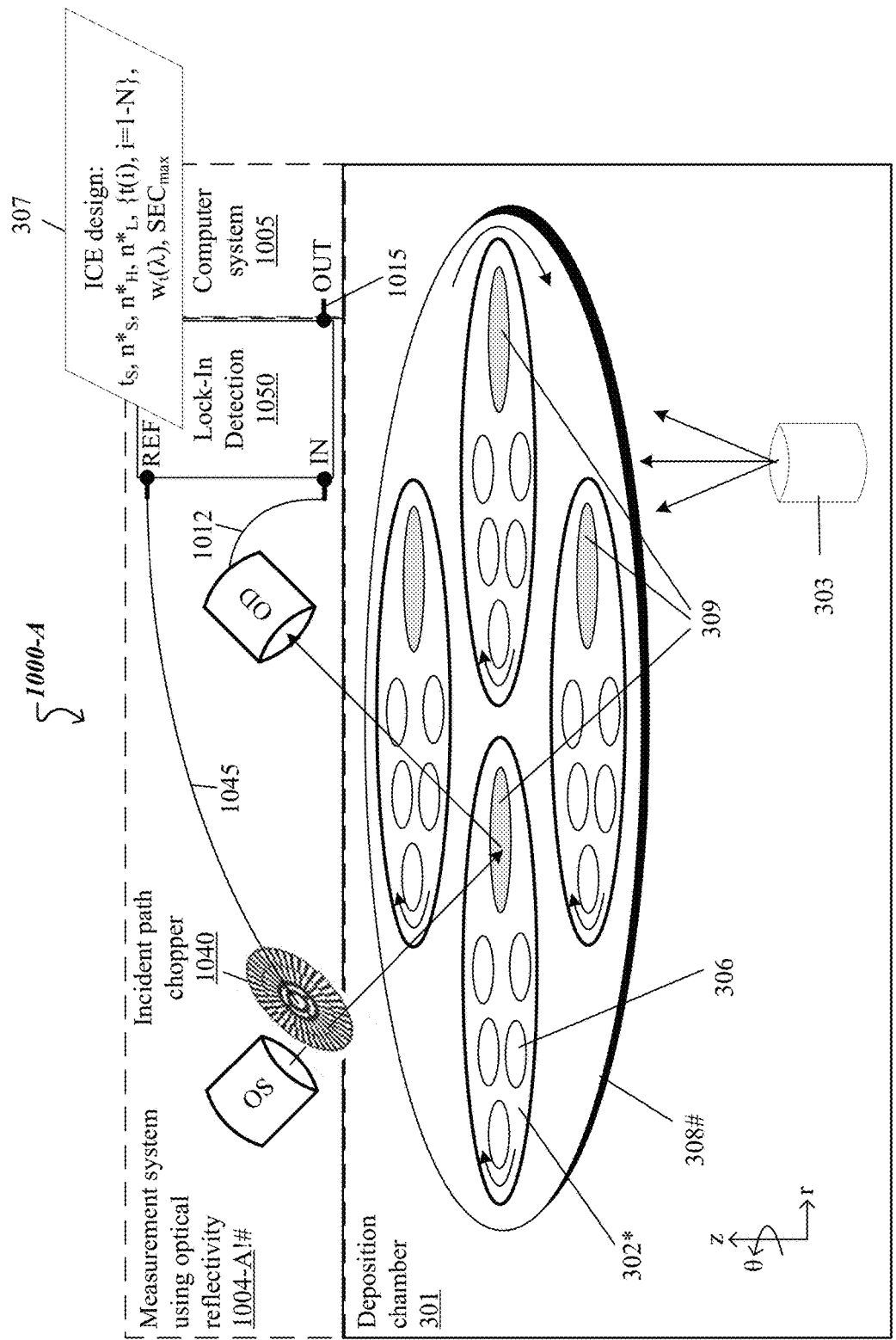
FIGS. 10A-10B show aspects of an example of a system for fabricating ICEs using a measurement system that includes a probe-beam chopper synchronized with periodic motion relative to a deposition source of ICEs being fabricated.
Figure 10B:
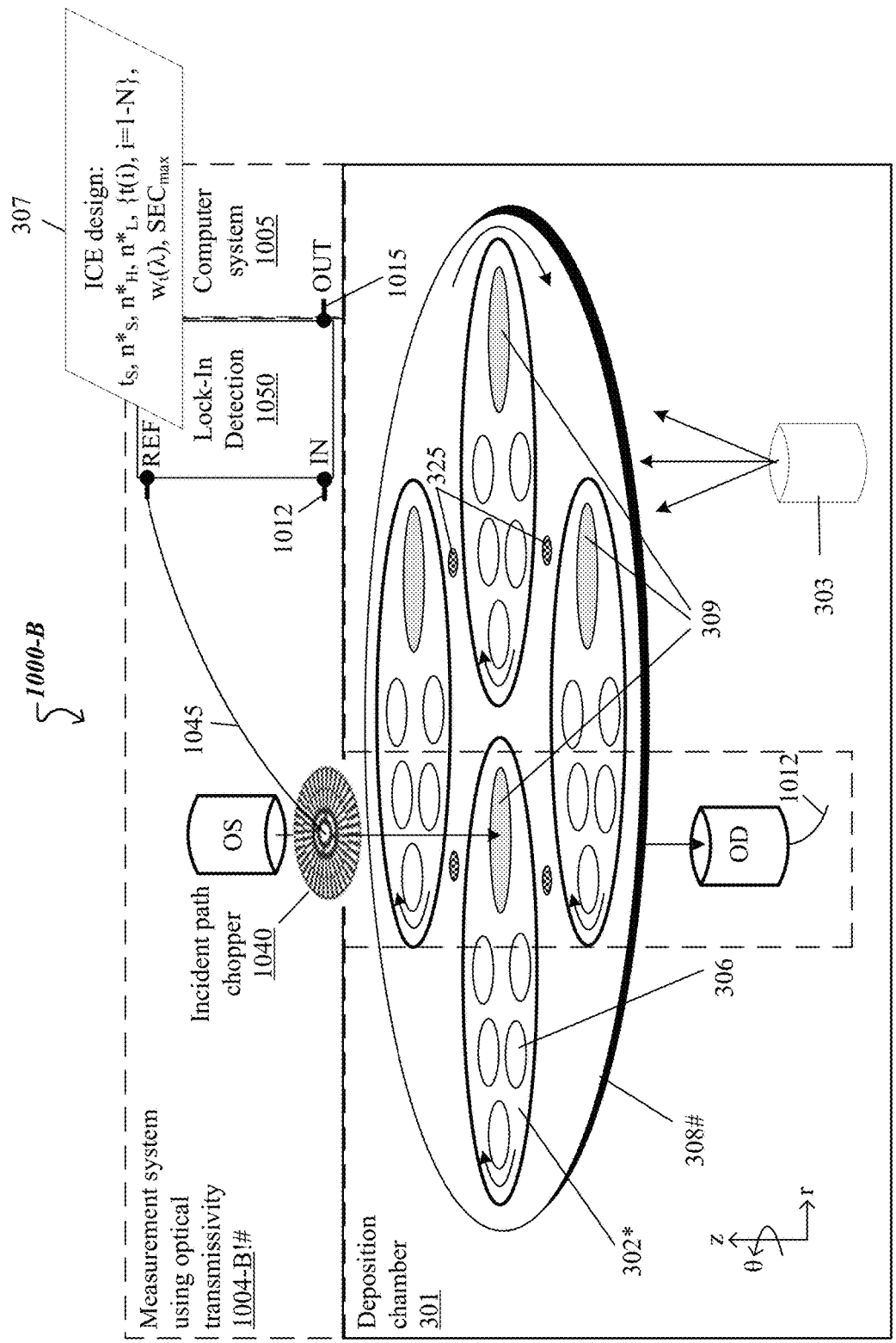
Figure 11A:
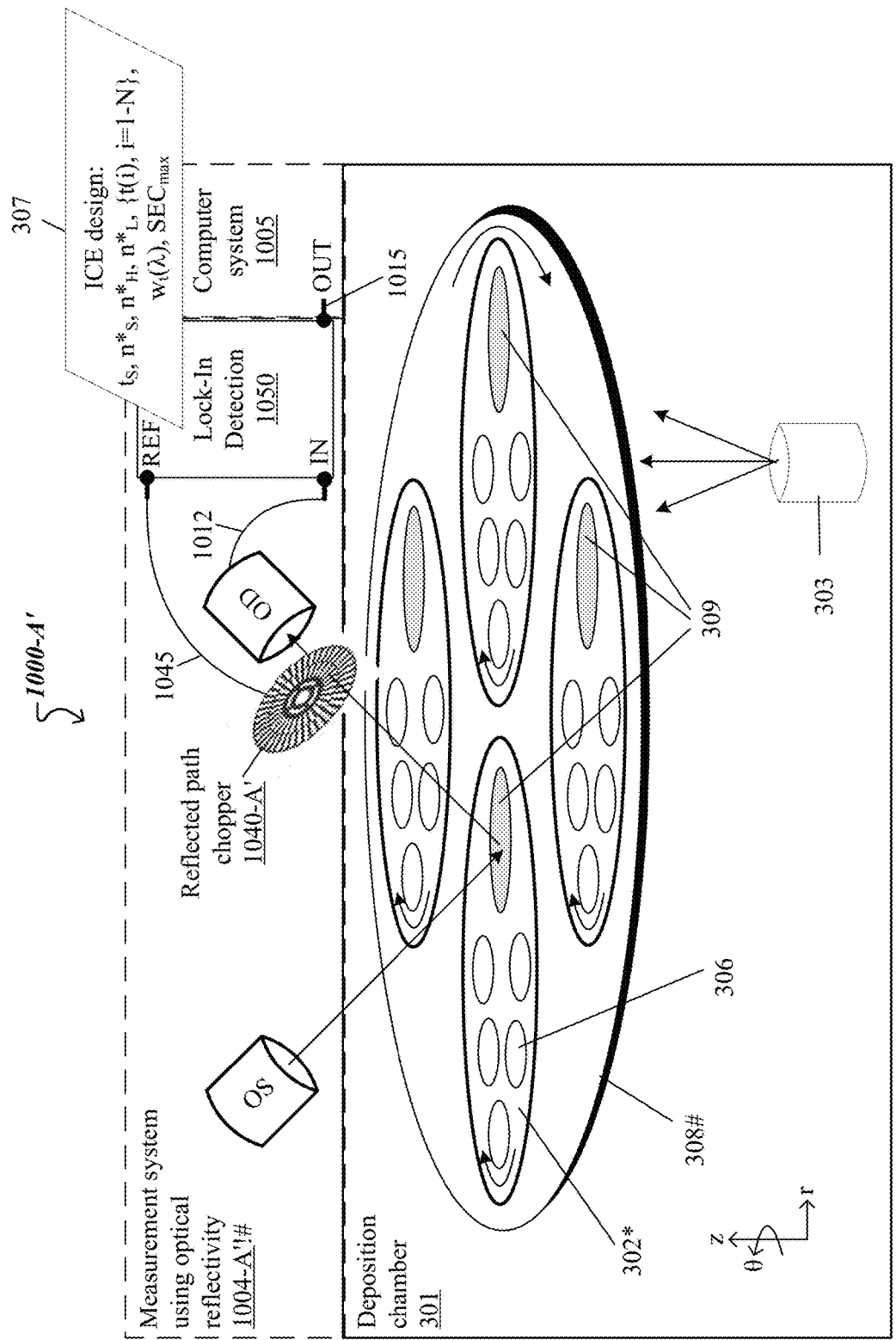
FIGS. 11A-11B show aspects of an example of a system for fabricating ICEs using a measurement system that includes a detector-beam chopper synchronized with periodic motion relative to the deposition source of ICEs being fabricated.
Figure 11B:
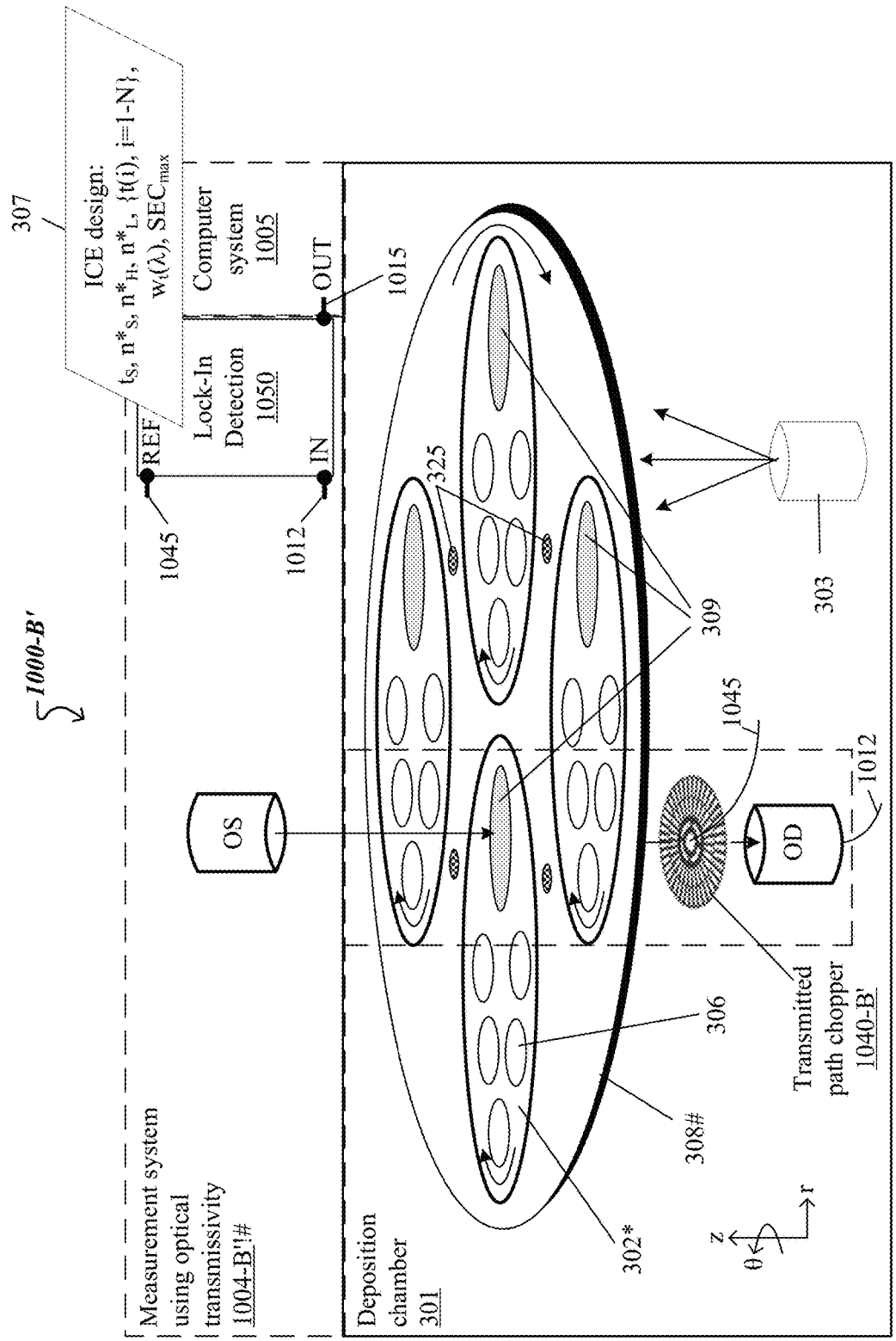

The measurement system 1004 can be an ellipsometer implemented based on any one of reflectance configurations 1004-A and 1004-A' respectively illustrated in FIGS. 10A and 11A; an optical monitor implemented based on either any one of the reflectance configurations 1004-A and 1004-A' respectively illustrated in FIGS. 10A and 11A or any one of transmittance configurations 1004-B and 1004-B' respectively illustrated in FIGS. 10B and 11B; or a spectrometer implemented based on the transmittance configurations 1004-B and 1004-B' respectively illustrated in FIGS. 10B and 11B.

In either of these configurations, the measurement system 1004 includes an optical source (OS) to illuminate with probe-light one or more witness samples 309 that are periodically moved relative to the deposition source(s) 303 along with the ICEs 306 being fabricated in the deposition chamber 301, and an optical detector (OD) to detect probe-light that interacted with the periodically illuminated witness sample 309. An example of a detector OD for quasi-monochromatic ellipsometry or optical monitoring is described above in connection with FIG. 3C. An example of another detector for spectral ellipsometry or spectroscopy is described above in connection with FIG. 3D.

The one or more witness samples 309 are placed at predetermined locations on at least one of the substrate supports 302 among the ICEs 306 being fabricated in the deposition chamber 301, so the witness samples 309 experience the same periodic motion with respect to the deposition source(s) 303 as the ICEs 306. A measurement plane of the measurement system 1004 is located in a plane of the periodic motion of the witness samples 309. An area of the measurement plane corresponds to a cross-section of a probe-light beam—provided by the source OS—projected on the plane of the periodic motion of the witness samples 309. Here, the measurement system 1004 is at rest relative to the deposition source(s) 303, and, hence, a periodic motion of the witness samples 309 relative to the measurement plane (also referred to as periodic illumination) has the same timing as the periodic motion of the witness samples 309 relative to the deposition source(s) 303. The probe-light beam illuminates one witness sample at-a-time, when each of the witness samples 309 passes through the measurement plane. The timing of the periodic illumination depends on at least the following parameters: a number K of witness samples 309 per substrate support 302, a number M of substrate supports 302, a second period $T_2$ with which each substrate support 302 moves relative to the mount 308, a first period $T_1$ with which the mount 308 moves relative to the deposition source(s) 303, a size of the witness samples 309, a radius of the substrate supports 302 where the witness samples 309 are supported, and a radius of the mount 308 where the substrate supports 302 are mounted.

Figure 12A:
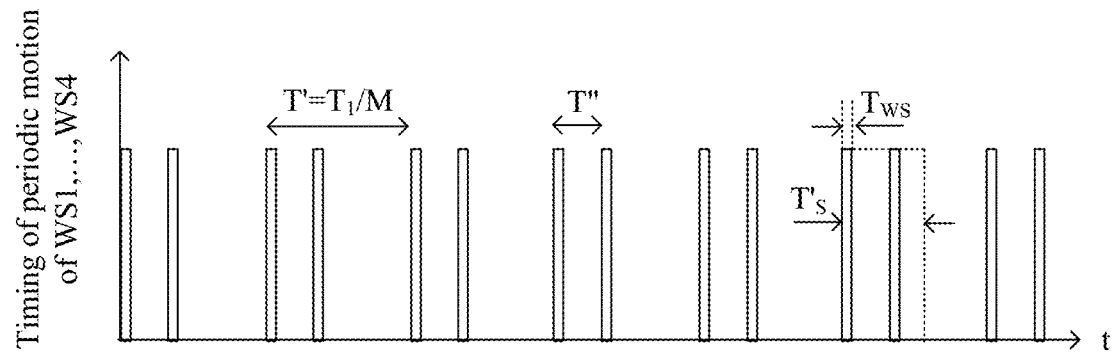
FIGS. 12A-12K show aspects of the systems described in FIGS. 10A-10B and 11A-11B corresponding to multiple examples of reference signals.

FIG. 12A shows the timing of the periodic motion of the witness samples 309 relative to the measurement plane when the witness samples 309 are distributed across the M substrate supports 302, such that a single witness sample 309 is placed off-centered on each substrate support 302 (K=1.) The timing of the periodic motion of the witness samples 309 relative to the measurement plane includes periodic bursts with a burst-to-burst period T' equal to the first period $T_1$ divided by M (the number of substrate supports 302, each of which supporting a single witness sample 309), $T'=T_1/M$, and a burst width $T_S$ that is up to (no longer than) a time that the probe-light beam illuminates each of the substrate supports 302. Moreover, each of the bursts includes rectangular pulses, where a pulse-to-pulse period represents an illumination period T" and a pulse width $T_{WS}$ represents an illumination time that the probe-light beam illuminates each of the witness samples 309. Here, the illumination period T" is a function of the first and second periods $T_1$ and $T_2$, in accordance with Equation (1), and represents a period with which the witness samples 309 are illuminated by the probe-light beam provided by the source OS.

Referring again to FIGS. 10A-10B and 11A-11B, a detector signal 1012 generated by the detector OD corresponds to characteristics of the detected probe-light that interacted with the witness sample 309 depending on the type of measurement made by the measurement system 1004. As such, the detector signal corresponds to, e.g., probe-light polarization modified by reflection off the witness samples 309 for ellipsometry; change of intensity of probe-light interacted with the witness samples 309 for optical monitoring; or probe-light spectrum modified by interaction with the witness samples 309 for spectroscopy.

Additionally, the measurement system 1004 includes a chopper 1040 to provide a modulation to the probe-light beam either prior to or after incidence onto the measurement plane, such that the modulation is synchronous to a periodic motion of the witness samples 309 relative to the measurement plane. The modulation provided by the chopper 1040 is said to be synchronous to the periodic motion of the witness samples 309 relative to the measurement plane because respective phases of the modulation and the periodic motion of the witness samples 309 relative to the measurement plane are locked together. In implementations illustrated in FIGS. 10A-10B and 11A-11B, the chopper 1040 provides an ON/OFF modulation of the probe-light beam (prior to or after incidence onto the measurement plane), such that the beam either passes through or it is blocked by the chopper 1040 in accordance with a modulation timing A chopper 1040 that provides this type of modulation can be implemented as an opto-mechanical chopper (e.g., a chopper wheel, a shutter, etc.), an acousto-optic modulator, and the like. In other implementations, other kinds of choppers can be used to provide amplitude, frequency or phase modulation, as appropriate, to the probe-light beam either prior to or after incidence onto the measurement plane. In some other implementations, a chopper function can be integrated into data acquisition software to screen data either during a certain time sequence, or below/above a threshold signal.

In both reflectance configuration 1004-A and transmittance configuration 1004-B of the measurement system respectively illustrated in FIGS. 10A and 10B, the chopper 1040 modulates the probe-light beam prior to incidence onto to the measurement plane. Alternatively, in reflectance configuration 1004-A' of the measurement system illustrated in FIG. 11A, the chopper 1040-A' modulates the probe-light after reflection off each of the measurement plane, while in transmittance configuration 1004-B' of the measurement system illustrated in FIG. 11B, the chopper 1040-B' modulates the probe-light after transmission through the measurement plane. In this manner, the detector signal 1012 corresponds to characteristics of the detected probe-light that (i) interacted with the witness samples 309 based on the timing of the periodic motion of the witness samples 309 relative to the measurement plane and (ii) is modulated with the synchronous modulation provided by the chopper 1040.

Another component of the measurement system 1004 is a lock-in detection module 1050 that processes the detector signal 1012. A reference signal 1045 used to reference the processing, by the lock-in detection module 1050, of the detector signal 1012 is based on the modulation provided by the chopper 1040. An output signal 1015 of the lock-in detection module 1050 is proportional with a spectral amplitude of the detector signal 1012 at a frequency of the reference signal 1045. In this manner, the output signal 1015 represents an average of the characteristics of the probe-light that interacted with a single witness sample over multiple illumination periods T" within a burst of a timing of the periodic illumination shown in FIG. 12A, or with multiple witness samples over consecutive bursts of the same timing.

Figure 12B:
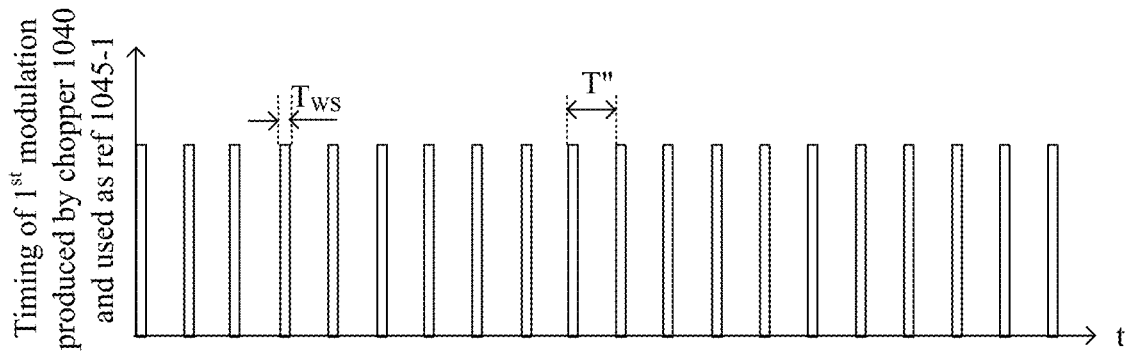

FIG. 12B shows timing of a first modulation provided by the chopper 1040 to the probe-light either prior to or after incidence onto the measurement plane. This first modulation can be used to perform a non-referenced measurement with an ellipsometer or an optical monitor in the reflectance configurations 1004-A and 1104-A of the measurement system. The first modulation is rectangular with a period T" and a width at most equal to (not exceeding) the illumination time $T_{WS}$. The first modulation provided by the chopper 1040 is synchronized with the periodic motion of the witness samples 309 relative to the measurement plane. The witness samples 309 periodically move relative to the measurement plane in accordance with the timing shown in FIG. 12A. As such, probe-light that reaches the detector OD through the chopper 1040—during the bursts of the timing shown in FIG. 12A—interacted, in the measurement plane, with all of the witness samples 309. However, the probe-light that reaches the detector OD through the chopper 1040—between the bursts of the timing shown in FIG. 12A—illuminated, in the measurement plane, the mount 308. The probe-light that illuminates the mount 308 is absorbed or otherwise scatters off the mount 308 and contributes to background light in the deposition chamber 301.

Figure 12C:
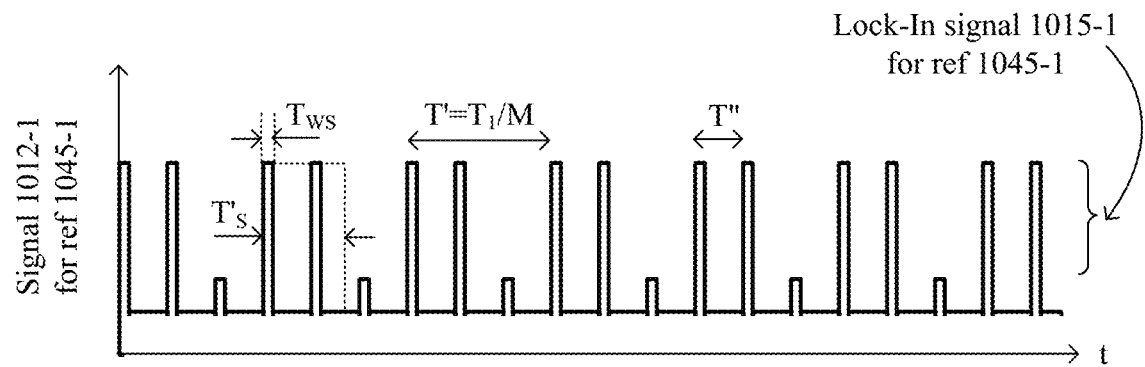

FIG. 12C shows a first detector signal 1012-1 when the detected light is modulated with the first modulation shown in FIG. 12B. Here, the first detector signal 1012-1 includes contributions from the probe-light that interacted with the witness samples 309 during bursts of the timing shown in FIG. 12A and contributions from the probe-light that illuminated the mount 308 between the bursts of the timing shown in FIG. 12A. A first reference 1045-1 used by the lock-in detection module 1050 to processes the first detector signal 1012-1 uses the timing of the first modulation shown in FIG. 12B. A first measurement signal 1015-1 output by the lock-in detection module 1050 is proportional to a spectral amplitude of the first detector signal 1012-1 at the illumination frequency 1/T" corresponding to the first reference signal 1045-1. The contributions to the first detector signal 1012-1 from the probe-light that illuminated the mount 308 cause noise in the measurement signal 1015-1 output by the lock-in detection module 1050.

To minimize the noise in the measurement signal 1015-1, a surface of the mount 308 can be treated to absorb the illuminating probe-light without scattering it. Alternatively or additionally, the measurement signal 1015-1—output based on this first modulation and reference—may not include excessive noise when the burst width $T_S$ is a large fraction of the burst-to-burst period T' or, equivalently, when a time T'-$T_S$ between consecutive bursts of the timing shown in FIG. 12A is short. Such situations occur when the second period $T_2$ of the periodic motion relative to the mount 308 of a single witness sample 309 (per substrate support 302) is much shorter than the first period $T_1$ of the mount 308, or when there are multiple witness samples 309 per substrate support 302.

Measurement signals 1015 that are less noisy than the first measurement signal 1015-1 can be obtained using modulations with timings other than the one shown in FIG. 12B, as described below.

Figure 12D:
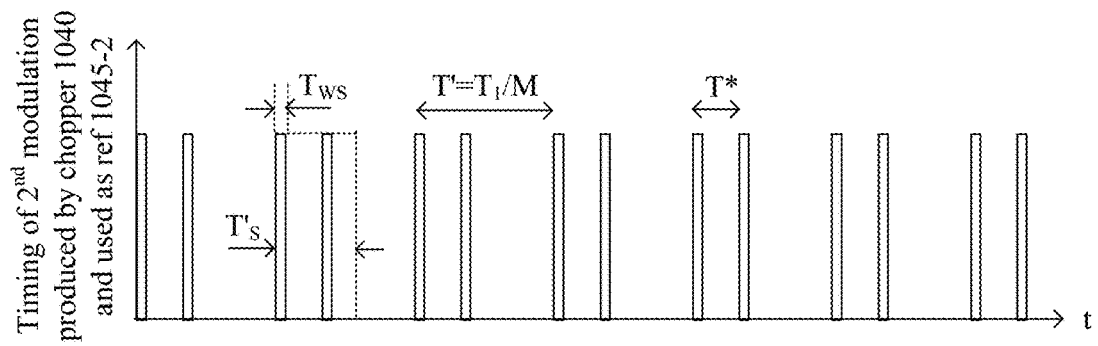

FIG. 12D shows timing of a second modulation provided by the chopper 1040 to the probe-light either prior to or after incidence onto the measurement plane. This second modulation can be used to perform a non-referenced measurement with an ellipsometer or an optical monitor in the reflectance configurations 1004-A and 1104-A of the measurement system. The second modulation has the timing of the periodic motion of the witness samples 309 relative to the measurement plane shown in FIG. 12A and is synchronized with the periodic motion of the witness samples 309 relative to the measurement plane. In this example, the probe-light that reaches the detector OD through the chopper 1040—during time intervals $T_{WS}$ with the illumination period T"—illuminated only the witness samples 309.

Figure 12E:
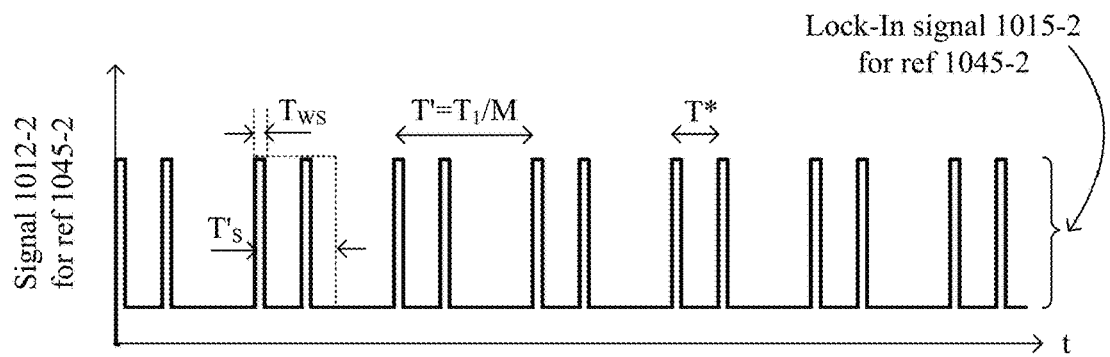

FIG. 12E shows a second detector signal 1012-2 when the detected light is modulated with the second modulation shown in FIG. 12D. Here, the second detector signal 1012-2 includes only contributions from the probe-light that interacted with the witness samples 309. A second reference 1045-2 used by the lock-in detection module 1050 to processes the second detector signal 1012-2 uses the timing of the second modulation shown in FIG. 12D. A second measurement signal 1015-2 output by the lock-in detection module 1050 is proportional to a spectral amplitude of the second detector signal 1012-2 at the illumination frequency 1/T" corresponding to the second reference signal 1045-2. The second measurement signal 1015-2 obtained by processing the second detector signal 1012-2 modulated with the second modulation is less noisy than the first measurement signal 1015-1 obtained by processing the first detector signal 1012-1 modulated with the first modulation.

Figure 12F:
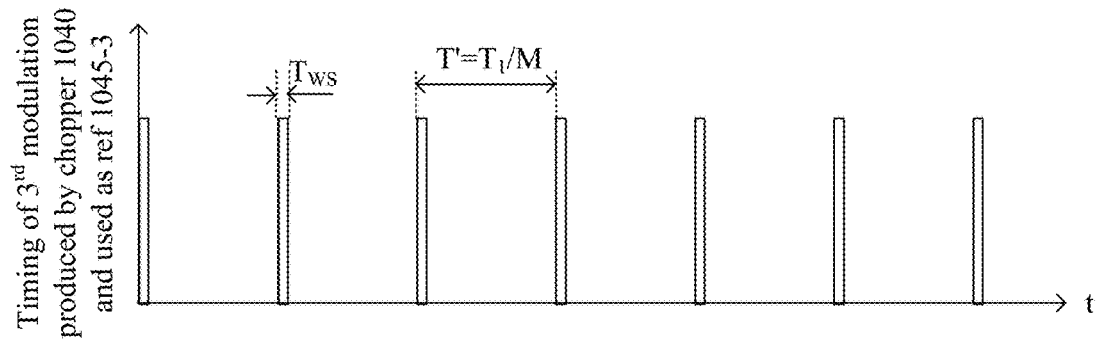

FIG. 12F shows timing of a third modulation provided by the chopper 1040 to the probe-light either prior to or after incidence onto the measurement plane. This third modulation can be used to perform a non-referenced measurement with an ellipsometer or an optical monitor in the reflectance configurations 1004-A and 1104-A of the measurement system. The third modulation is rectangular with a period T'=$T_1$/M and a width at most equal to (not exceeding) the illumination time $T_{WS}$. The third modulation provided by the chopper 1040 is synchronized with the periodic motion of the witness samples 309 relative to the measurement plane. The witness samples 309 periodically move relative to the measurement plane in accordance with the timing shown in FIG. 12A. As such, probe-light that reaches the detector OD through the chopper 1040—during time intervals $T_{WS}$ with the period T'—illuminated each witness sample 309 only a single time during the burst width $T_S$. For the remainder of the burst width $T_S$, either the chopper 1040 blocks the probe-light from illuminating each witness sample 309 more than the single time per burst width $T_S$, or the chopper 1040 blocks the probe-light that interacted with the witness samples 309 more than the single time per burst width $T_S$ from reaching the detector OD.

Figure 12G:
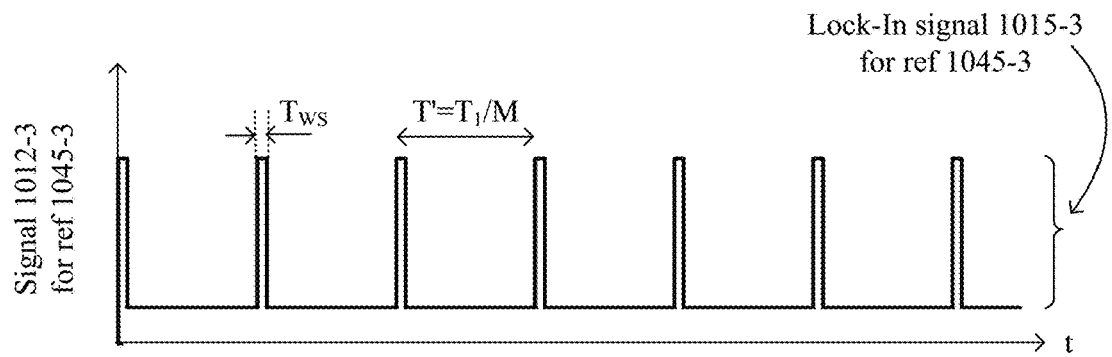

FIG. 12G shows a third detector signal 1012-3 when the detected light is modulated with the third modulation shown in FIG. 12F. Here, the third detector signal 1012-3 includes contributions from the probe-light that interacted with the witness samples 309 only once during each burst of the timing shown in FIG. 12A. A third reference 1045-3 used by the lock-in detection module 1050 to processes the third detector signal 1012-3 uses the timing of the third modulation shown in FIG. 12F. A third measurement signal 1015-3 output by the lock-in detection module 1050 is proportional to a spectral amplitude of the third detector signal 1012-3 at the frequency 1/T' corresponding to the third reference signal 1045-3. The third measurement signal 1015-3 obtained by processing the third detector signal 1012-3 modulated with the third modulation is less noisy than the first measurement signal 1015-1 obtained by processing the first detector signal 1012-1 modulated with the first modulation. While the third modulation is less complex than the second modulation, the third measurement signal 1015-3 obtained by processing the third detector signal 1012-3 modulated with the third modulation requires a longer averaging time than the second measurement signal 1015-2 obtained by processing the second detector signal 1012-2 modulated with the second modulation because the third detector signal 1012-3 includes only a single contribution per period T' from each witness sample, while the second detector signal 1012-2 includes multiple contributions per burst-to-burst period T' from each witness sample.

The measurement signals 1015-1, 1015-2 and 1015-3 correspond to characteristics of the detected probe-light that reflected off the witness samples 309 while fabricating ICEs 306. Note that, in the case of lock-in detection, characteristics of the detected probe-light that reflected off the witness samples 309 corresponding to the measurement signal 1015 are background-corrected because the measurement signal 1015 is obtained by averaging amplitude of the ON/OFF modulation of the interacted probe-light, as shown in FIGS. 12B, 12D and 12F.

In the case of a spectrometer using the transmittance configurations 1004-B or 1104-B of the measurement system, the mount 308 can include apertures 325 disposed between the substrate supports 302 at the same distance from the center axis of the mount 308 as the measurement plane. When each of the apertures traverses the measurement plane, the probe-light beam passes through the mount 308 (without being transmitted through the witness samples 309) and reaches the detector OD where a reference detector signal is being collected. As the measurement system 1004-B or 1104-B is at rest relative to the deposition source(s) 303, a periodic motion of the apertures 325 relative to the measurement plane (also referred to as periodic illumination) has the same timing as the periodic motion of the apertures 325 relative to the deposition source(s) 303. The probe-light beam illuminates one aperture at-a-time, when each of the apertures 325 passes through the measurement plane.

Figure 12H:
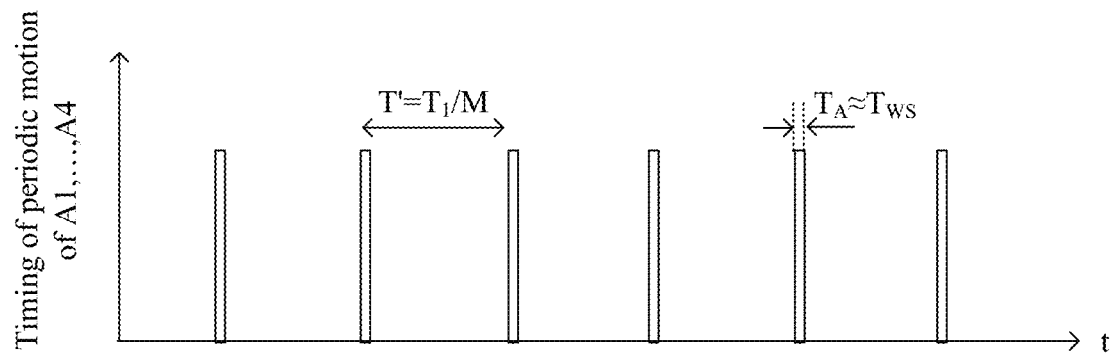

FIG. 12H shows the timing of the periodic motion of the apertures 325 relative to the measurement plane when the apertures 325 are distributed across the mount 308 between the M substrate supports 302, such that a single aperture is placed between adjacent substrate supports. The timing of the periodic motion of the apertures 325 relative to the measurement plane is rectangular with period equal to the first period $T_1$ divided by M (the number of substrate supports 302, each of which separated by a single aperture), $T'=T_1/M$, and a width $T_A$ that is up to (no longer than) a time that the probe-light beam illuminates each of the apertures 325. Here, the illumination period T' represents a period with which the apertures 325 are illuminated by the probe-light beam provided by the source OS. Further, a size of the apertures 325 can be chosen to be about the size of the witness samples 309 such that the time $T_A$ that the probe-light beam illuminates the apertures 325 is about equal to the time $T_{WS}$ that the probe-light beam illuminates the witness samples 309.

Figure 12I:
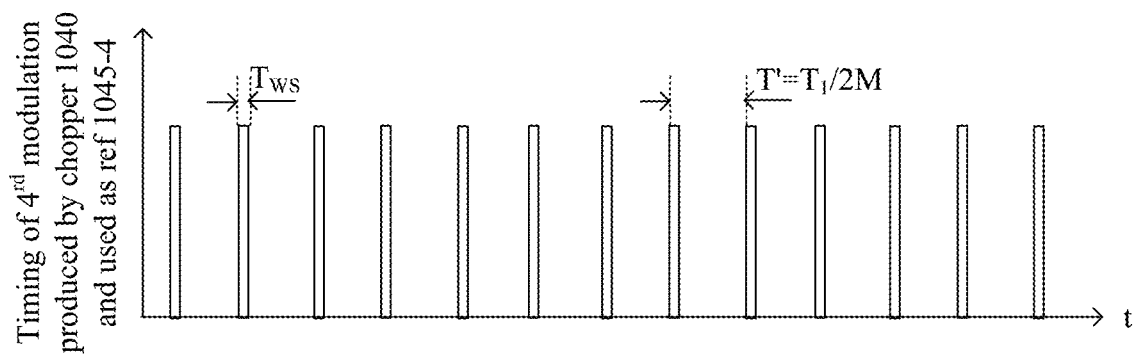

FIG. 12I shows timing of a fourth modulation provided by the chopper 1040 to the probe-light either prior to or after incidence onto the measurement plane. This fourth modulation can be used to collect a referenced spectrum with a spectrometer in the transmittance configurations 1004-B or 1104-B of the measurement system. The fourth modulation is rectangular with a period $T'=T_1/2M$ and a width at most equal to (not exceeding) the illumination time $T_{WS}$. Moreover, the fourth modulation is used when the substrate supports 302 are not rotating with respect to the mount ($T2\rightarrow\infty$), and each of the supports 302 supports a single witness samples. As such, the M witness samples 309 periodically move relative to the measurement plane in accordance with the timing shown in FIG. 12A, with K=1, and $T''\rightarrow T_1/M$. Further, the single witness sample is located on each of the supports 302 such that the periodic motion of the M witness samples 309 relative to the measurement plane and the periodic motion of the M apertures 325 relative to the measurement plane are out-of-phase by $\pi$. In this manner, the fourth modulation provided by the chopper 1040 is synchronized with the periodic motion of the M witness samples 309 and with the periodic motion of the M apertures 325 relative to the measurement plane. As such, probe-light that reaches the detector OD through the chopper 1040—during time intervals $T_{WS}$ with the period T'—alternately illuminated a witness sample 309 and an aperture 325 during consecutive periods.

Figure 12J:
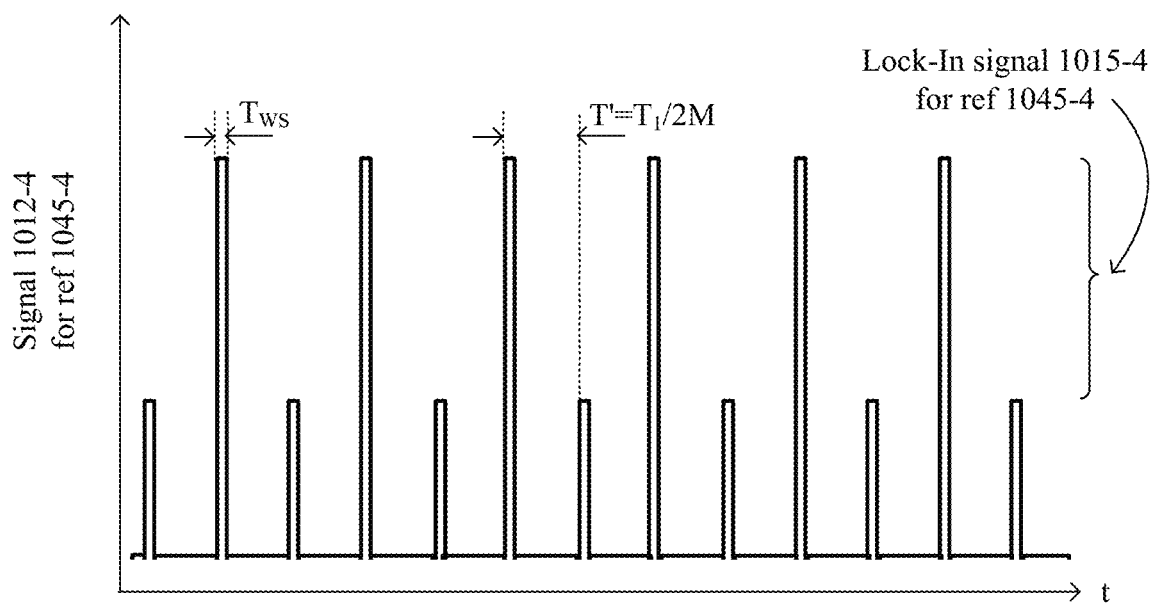

FIG. 12J shows a fourth detector signal 1012-4 when the detected light is modulated with the fourth modulation shown in FIG. 12I. Here, the fourth detector signal 1012-4 includes contributions from the probe-light that was alternately transmitted through the witness samples 309 and passed through the apertures 325. A fourth reference 1045-4 used by the lock-in detection module 1050 to processes the fourth detector signal 1012-4 uses the timing of the fourth modulation shown in FIG. 12I. A fourth measurement signal 1015-4 output by the lock-in detection module 1050 is proportional to a spectral amplitude of the fourth detector signal 1012-4 at the frequency 1/T' corresponding to the fourth reference signal 1045-4. Here, the fourth measurement signal 1015-4 represents a referenced spectrum corresponding to the witness samples 309.

Note that in the foregoing case, in order to synchronize the periodic motions of the M witness samples 309 and of the M apertures 325 relative to the measurement plane, the M supports 302 supporting the witness samples 309 had to be at rest relative to the mount 308, when the apertures 325 are disposed on the mount 308. Another arrangement of the apertures 325 that allows for the M supports to rotate with period $T_2$ relative to the mount 308 is described next.

Although not shown in FIGS. 10B and 11B, alternating substrate supports 302 can either support a witness sample 309 at a given location on the substrate support 302 or have an aperture 325 at the given location. In such case, no apertures are provided on the mount 308. A size of the M/2 apertures 325 on alternating substrate supports 302 can be chosen to be about the size of the M/2 witness samples 309 on the remaining substrate supports 302 such that the time $T_A$ that the probe-light beam illuminates the apertures 325 is about equal to the time $T_{WS}$ that the probe-light beam illuminates the witness samples 309. Here, the mount 308 rotates relative to the deposition source(s) 303 with a period $T_1$ and each of the M substrate supports 302 rotates with a period $T_2$ relative to the mount 308. A timing of the M/2 witness samples 309 and the M/2 apertures 325 is similar to the timing shown in FIG. 12A, except alternating trains of rectangular pulses correspond to witness samples and apertures, respectively. In this case, the third modulation (with a period T'=T$_1$/M) described above in connection with FIG. 12F can be used to collect a referenced spectrum with a spectrometer in the transmittance configurations 1004-B or 1104-B of the measurement system, in the following manner.

Figure 12K:
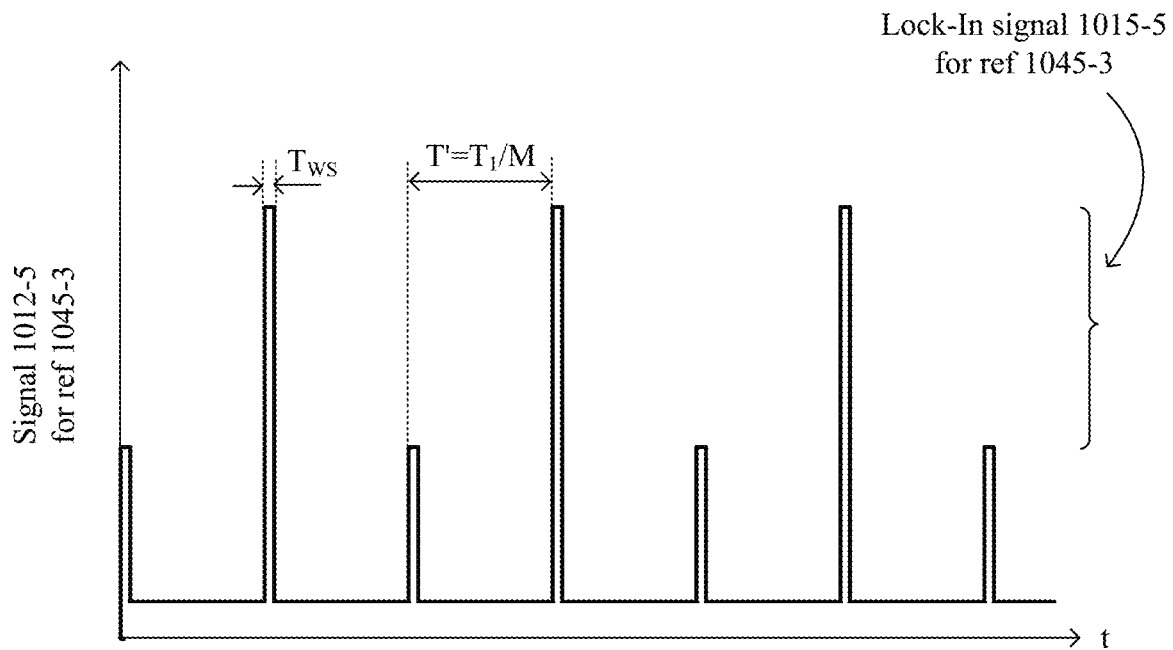

FIG. 12K shows a fifth detector signal 1012-5 when the detected light is modulated with the third modulation shown in FIG. 12F. Here, the fifth detector signal 1012-5 includes contributions from the probe-light that was alternately transmitted through the witness samples 309 and passed through the apertures 325. The third reference 1045-3 used by the lock-in detection module 1050 to processes the fifth detector signal 1012-5 uses the timing of the third modulation shown in FIG. 12F. A fifth measurement signal 1015-5 output by the lock-in detection module 1050 is proportional to a spectral amplitude of the fifth detector signal 1012-5 at the frequency 1/T' corresponding to the third reference signal 1045-3. Here, the fifth measurement signal 1015-5 represents a referenced spectrum corresponding to the witness samples 309. While the third modulation is less complex than the fourth modulation, the fifth measurement signal 1015-5 obtained by processing the fifth detector signal 1012-5 modulated with the third modulation requires a longer averaging time than the fourth measurement signal 1015-4 obtained by processing the fourth detector signal 1012-4 modulated with the fourth modulation because the fifth detector signal 1012-5 includes contributions from only M/2 witness sample/aperture pairs over a time interval $T_1$, while the fourth detector signal 1012-4 includes M contributions from M witness sample/aperture pairs over the time interval $T_1$.

Figure 13:
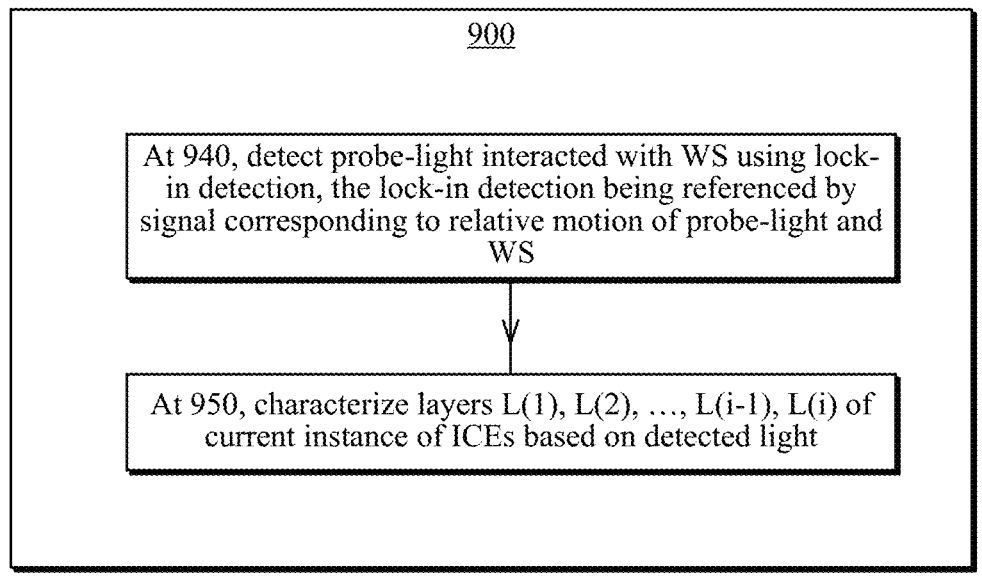
FIG. 13 is a modification of the ICE fabrication process from FIG. 9A that replaces the time-gated measurements with lock-in measurements to measure characteristics of ICEs being fabricated without interrupting their periodic motion relative to a deposition source.

The measured characteristics are used to determine in real-time complex refractive indices and thicknesses of layers of current instances of the ICEs 306. The determined complex refractive indices and thicknesses can be used by the computer system 305 for modifying the ICE fabrication process 900 (described above in connection with FIG. 9A) to terminate deposition of each layer precisely when its determined thickness matches its target thickness or to optimize the forming of other layers remaining to be formed. FIG. 13 shows an example of such a modification of the ICE fabrication process 900 which uses lock-in measurements to monitor characteristics of ICEs being fabricated without interrupting their periodic motion relative to a deposition source.

For example, FIG. 13 illustrates modifications of the interacted probe-light detection performed at 940 and of the characterizations of layers of current instance of the ICEs performed at 950. While depositing the i$^{th}$ layer L(i) specified by the received ICE design, the ICEs being fabricated and at least one witness sample (which can be one of the ICEs) are periodically moved relative to a deposition source, at 920. Moreover, the witness sample is illuminated with a probe-light beam without interrupting the forming of the current layer L(i).

At 940, probe-light interacted with the witness sample is detected using lock-in detection. The lock-in detection is referenced by a reference signal corresponding to a relative motion of the probe-light beam and the witness sample. When the probe-light beam is at rest relative to the deposition source, the reference signal corresponds to a periodic motion of the witness sample relative to the deposition source. The reference signal can be chosen based on periods of the relative motion of the probe-light beam and the witness sample. For example, the reference signal can have a period equal to the pulse-to-pulse period T" of a relative motion including periodic bursts of pulses as described above in connection with FIGS. 12A-12B. As another example, the reference signal can have a period equal to the burst-to-burst period T' of a relative motion including periodic bursts of pulses as described above in connection with FIGS. 12A and 12F. As yet another example, the reference signal can have a timing of a relative motion including periodic bursts of pulses as described above in connection with FIGS. 12A and 12D. Moreover, the reference signal can be chosen based on periods of the relative motion of the probe-light beam and a pair of a witness sample and an aperture. For example, the reference signal can have a timing of a relative motion including rectangular pulses as described above in connection with FIGS. 12A, 12H and 12I.

At 950, previously formed layers L(1), . . . , L(i−1) and the layer L(i) currently being formed are characterized based on characteristics of the interacted probe-light detected in real-time at 940. Such characterization of the witness sample's layers is performed in real-time, without interrupting a periodic motion of the witness sample (and of the ICEs being fabricated along with the witness sample) relative to the deposition source. For instance, complex refractive indices n*$_H$(r), n*$_L$(r) and thicknesses t'(1;r), t'(2;r), . . . , t'(i−1;r), t'(i;r) of deposited layers L(1), L(2), . . . , L(i−1) and layer L(i) currently being deposited are determined in real-time from a measurement signal 1015 output by the lock-in detection module 1050. The determined complex refractive indices and thicknesses can be used to stop deposition of the current layer L(i) when its determined thickness reaches its target thickness and/or to modify, if necessary, deposition of the current layer L(i) and of the subsequent layers L(i+1), L(i+2), . . .

Some embodiments have been described in detail above, and various modifications are possible. While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:
1. A method comprising:
receiving, by a fabrication system, a design of an integrated computational element (ICE), the ICE design comprising specification of a substrate and a plurality of layers, their respective target thicknesses and complex refractive indices, wherein complex refractive indices of adjacent layers are different from each other, and wherein an ICE fabricated in accordance with the ICE design is related to a characteristic of a sample;

forming, by deposition of material and by the fabrication system, at least some of the layers of a plurality of ICEs in accordance with the ICE design using a deposition source associated with the fabrication system, wherein the layers of the ICEs being formed are supported on a support that is moved in accordance with a periodic motion relative to the deposition source during the forming, wherein:
the support is included in a set of M supports, M≥2, such that the supports are mounted on a mount;
the mount is periodically moved relative to the deposition source with a first period T1 during the forming; and
each of the supports is periodically moved relative to the mount with a second period T2 during the forming;

monitoring, during the deposition of material and by a measurement system associated with the fabrication system only by an ellipsometer, characteristics of the layers of the ICEs, wherein:
the characteristics of the layers of the ICEs comprise a thickness and a complex refractive index both measured by the ellipsometer at a same time during the deposition using a timing of the periodic motion of the support relative to the deposition source;
a witness sample supported on the support is illuminated with a probe-light; and
light interacted with the witness sample is detected using time-gated detection, the time-gated detection being timed in accordance with at least (i) the timing of the periodic motions of the support relative to the deposition source and (ii) a size of the witness sample, the timing of the time-gated detection comprising periodic time gates with a gate-to-gate period T" and a gate width TWS; and adjusting said forming based on results of said monitoring.

2. The method of claim 1, wherein
the witness sample comprises a set of distributed witness samples, such that each of the distributed witness samples is supported on a respective support to be periodically illuminated by the probe-light, during said forming, with an illumination period equal to the gate-to-gate period T" that is a function of the first and second periods,
the measurement system is at rest relative to the deposition source, and
the timing of the time-gated detection comprises periodic bursts with a burst-to-burst period T' equal to the first period divided by M, T'=T1/M, and a burst width TS that is up to a time that the probe-light illuminates each of the supports, each of the bursts comprising the periodic time gates with the gate-to-gate period equal to the illumination period T" and the gate width TWS that is up to a time that the probe-light illuminates each of the distributed witness samples.

3. The method of claim 2, wherein the illumination period is T"=T1T2/(T1+T2).

4. The method of claim 2, wherein
the mount is a circular mount that rotates relative to the deposition source with the first period around a center of the circular mount,
each of the supports is a platen that rotates relative to the circular mount with the second period around a center of the platen, and
each of the distributed witness samples is off-centered relative to the platen.

5. The method of claim 1, wherein
the witness sample is supported on one of the supports to be periodically illuminated by the probe-light with the first period T1 during said forming,
the measurement system is at rest relative to the deposition source, and
the timing of the time-gated detection comprises the periodic time gates with the gate-to-gate period T" equal to the first period, T"=T1, and the gate width TWS that is up to a time that the probe-light illuminates the witness sample.

6. The method of claim 5, wherein
the mount is a circular mount that rotates relative to the deposition source with the first period around a center of the circular mount,
each of the supports is a platen that rotates relative to the circular mount with the second period around a center of the platen, and
the witness sample is centered on the platen on which it is supported.

7. The method of claim 1, wherein
the measurement system is periodically moved relative to the deposition source and it is at rest relative to the mount, such that the witness sample supported on one of the supports is periodically illuminated by the probe-light with the second period T2 during said forming, and
the timing of the time-gated detection comprises the periodic time gates with the gate-to-gate period T" equal to the second period, T"=T2, and the gate width TWS that is up to a time that the probe-light illuminates the witness sample.

8. The method of claim 7, wherein
the mount is a circular mount that rotates relative to the deposition source with the first period around a center of the circular mount,
each of the supports is a platen that rotates relative to the circular mount with the second period around a center of the platen, and
the witness sample is off-centered relative to the platen on which it is supported.

9. The method of claim 1, wherein
the measurement system is periodically moved relative to the deposition source and is at rest relative to one of the supports which supports the witness sample, such that at least a portion of the witness sample is continuously illuminated by the probe-light during said forming, and
the gated detection comprises continuous detection.

10. The method of claim 9, wherein
the mount is a circular mount that rotates relative to the deposition source with the first period around a center of the circular mount, and
each of the supports is a platen that rotates relative to the circular mount with the second period around a center of the platen.

11. The method of claim 1, wherein
said monitoring the characteristics of the layers of the ICEs during said forming comprises
illuminating with a probe-light a witness sample placed on the support, and
detecting light interacted with the witness sample using lock-in detection, the lock-in detection being referenced by a signal corresponding to (i) the timing of the periodic motion of the support relative to the deposition source and (ii) a size of the witness sample.

12. The method of claim 11, wherein
the support is included in a set of M supports, M≥2, such that the supports are mounted on a mount,
the mount is periodically moved relative to the deposition source with a first period T1 during said forming,
each of the supports is periodically moved relative to the mount with a second period T2 during said forming,
the witness sample comprises a set of distributed witness samples, such that each of the distributed witness samples is supported on a respective support to be periodically illuminated by the probe-light, during said forming, with an illumination period T" that is a function of the first and second periods,
the method further comprising
providing a synchronous modulation to the detected light with a chopper placed either in a path of the probe-light that illuminates the distributed witness samples or in a path of the light interacted with the distributed witness samples, wherein the provided synchronous modulation is synchronized to the periodic illumination of the witness samples by the probe-light, and
using the modulation provided with the chopper as the reference signal for the lock-in detection.

13. The method of claim 12, wherein the illumination period is T"=T1T2/(T1+T2).

14. The method of claim 12, wherein the synchronous modulation comprises a rectangular signal with a period equal to the illumination period T" and a width TWS that is up to a time that the probe-light illuminates each of the distributed witness samples.

15. The method of claim 12, wherein
the synchronous modulation comprises a burst signal comprising bursts of a rectangular signal,
the burst signal has a rectangular envelope with an envelope period equal to the first period divided by M, T'=T1/M, and an envelope width TS that is up to a time that the probe-light illuminates each of the supports,
the rectangular signal has a period equal to the illumination period T" and a width TWS that is up to a time that the probe-light illuminates each of the distributed witness samples.

16. The method of claim 12, wherein the synchronous modulation comprises a rectangular signal with a period equal to the first period divided by M, T'=T1/M, and a width TWS that is up to a time that the probe-light illuminates each of the distributed witness samples.

17. The method of claim 11, further comprising
generating a detector signal from the detected light; and
processing the detector signal to characterize the formed layers,
wherein said adjusting said forming is performed based on the characterization.

18. The method of claim 17, wherein said processing the detector signal comprises averaging the detector signal over a specified number of periods of the periodic motion of the support relative to the deposition source.

19. The method of claim 11, wherein the light interacted with the witness sample comprises one or more of reflected light, transmitted light, scattered light, or emitted light.

20. The method of claim 1, wherein a probe-light illuminates a same side of each of the multiple ICEs as the deposition material is formed on.

* * * * *